(12) United States Patent  
Ohba et al.

(10) Patent No.: US 6,680,505 B2  
(45) Date of Patent: Jan. 20, 2004

(54) SEMICONDUCTOR STORAGE ELEMENT

(75) Inventors: Ryuji Ohba, Kanagawa-ken (JP); Junji Koga, Kanagawa-ken (JP); Ken Uchida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/107,440

(22) Filed: Mar. 28, 2002

(65) Prior Publication Data

US 2002/0140023 A1 Oct. 3, 2002

(30) Foreign Application Priority Data

Mar. 28, 2001 (JP) ........................................ 2001-093833
Mar. 28, 2001 (JP) ........................................ 2001-093834

(51) Int. Cl.[7] ............................................. H01L 29/72
(52) U.S. Cl. ........................ 257/314; 257/315; 257/321; 257/325
(58) Field of Search .............................. 257/314, 315, 257/321, 325

(56) References Cited

U.S. PATENT DOCUMENTS 5,508,543 A * 4/1996 Hartstein et al. ........... 257/314

FOREIGN PATENT DOCUMENTS

| JP | 06-268234 | 9/1994 |
| JP | 08-046065 | 2/1996 |
| JP | 10-256403 | 9/1998 |
| JP | 10-321740 | 12/1998 |
| JP | 2001-313342 | 11/2001 |

OTHER PUBLICATIONS

Ryuji Ohba, et al., "Non–Volatile Si Quantum Memory with Self–Aligned Doubly–Stacked Dots", Technical Digest of IEDM, 2000, pp. 313–316.

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A nonvolatile semiconductor storage element which has a charge stored layer as a floating gate, and whose storage time is made sufficiently long. The storage element comprises a channel region formed between a source region and a drain region; first and second tunnel insulator layers formed over the channel region and through which electrons can directly tunnel quantum-mechanically; and a conductive particle layer which is sandwiched in between the first and second tunnel insulator layers; the charge stored layer being formed on the second tunnel insulator layer. An energy level at which the information electron in the charge stored layer is injected is lower than the energy level of a conduction band edge in the channel region.

22 Claims, 37 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a) INJECTION (b) EMISSION (a)

(b)

(c)

(a)  WRITING BAND (b)  STORING BAND (a) INJECTION (b) EMISSION (a) BAND FOR SHALLOW INFORMATION-CHARGE STORED PORTION (b) BAND FOR DEEP INFORMATION-CHARGE STORED PORTION

SEMICONDUCTOR STORAGE ELEMENT

CROSS-REFERENCE TO RELATED APPLICATIONS

This application is based upon and claims the benefit of priority from the prior Japanese Patent Applications No. P2001-093833 and No. P2001-093834, filed on Mar. 28, 2001, the entire contents of which are incorporated herein by reference.

BACKGROUND OF THE INVENTION

1. Field of the Invention

The present invention relates to a semiconductor storage element.

2. Discussion of the Background

In recent years, an electrically erasable and programmable memory (hereinbelow, expressed as "nonvolatile memory") has been developed as the storage media of portable information equipment etc. so as to become lower in its drive voltage and larger in its storage capacity, owing to the features that it can store information even after the cutoff of a supply voltage by storing charges, and that it is small in size and light in weight without requiring a driving component as in a magnetic disk.

FIG. 1 shows a sectional view of such a nonvolatile memory cell in the related art.

The nonvolatile memory cell includes a p-type silicon substrate 1, a first tunnel insulator layer (tunneling film) 2 (2 nm thick) made of a silicon oxide film and formed on the silicon substrate 1, an intrinsic polycrystal silicon layer 3 (5 nm thick) formed on the first tunnel insulator layer 2, a second tunnel insulator layer (tunneling film) 4 (2 nm thick) made of a silicon oxide film and formed on the polycrystal silicon layer 3, a floating electrode (floating gate) 5 (100 nm thick) made of $n^+$-type polycrystal silicon and formed on the second tunnel insulator layer 4, a control insulator layer 6 (10 nm thick) made of silicon oxide and formed on the floating electrode 5, a control electrode (control gate) 7 (500 nm thick) made of $n^+$-type polycrystal silicon and formed on the control insulator layer 6, a channel region 10 which is located directly under the first tunnel insulator layer 2 within the silicon substrate 1, and a source region 8 and a drain region 9 which are made of $n^+$-type silicon and which are arranged in opposition within the silicon substrate 1 so as to hold the channel region 10 therebetween.

In the structure, the source region 8, the drain region 9, and the channel region 10 held between them as are located on the side of the silicon substrate 1 function as an n-channel field effect transistor.

Besides, the polycrystal silicon layer 3 which is sandwiched in between the first tunnel insulator layer 2 and the second tunnel insulator layer 4 is formed of microcrystals satisfying a Coulomb blockade condition, and charges such as electrons or holes can be transferred between the front surface of the silicon substrate 1 and the floating electrode 5 by tunneling. The "Coulomb blockade condition" signifies that the charge energy of one electron or hole is greater than a thermal fluctuation.

The floating electrode 5 is an electrical floating region which is electrically insulated by the second tunnel insulator layer 4 and the control insulator layer 6, and which can store charges.

The writing method of the nonvolatile memory is so implemented that, when a voltage of about 10V is applied across the silicon substrate 1 and the control electrode 7, electrons (carrier electrons in an inversion layer), for example, are drawn as the charges from the channel region 10 into the floating electrode 5 through a stacked structure comprising the first tunnel insulator layer 2, polycrystal silicon layer 3 and second tunnel insulator layer 4, by a quantum-mechanical tunneling phenomenon.

Besides, the reading method decides "1" or "0" by detecting a current which flows from the source region 8 into the drain region 9 when voltages are applied across the source region 8 and the drain region 9 and across the source region 8 and the control electrode 7, and the value of which differs between in a state where the electrons have been injected into the floating electrode 5 to negatively charge this electrode and in a state where the electrons have not been injected.

Further, the erasing method is so implemented that the electrons in the floating electrode 5 are drawn out therefrom into the channel region 10 in accordance with the quantum-mechanical tunneling phenomenon by applying a voltage of about 10V across the silicon substrate 1 and the floating electrode 5.

In such a nonvolatile memory, it is important that the charges stored in the floating electrode 5 are prevented from tunneling out even after the supply voltage has been cut off.

Meanwhile, semiconductor integrated circuits have hitherto been highly packaged owing to the progress of semiconductor microfabrication technology, and the nonvolatile memory as stated above is not exceptional. Also in the field effect transistor portion, the length of the channel region 10, the thickness of the first tunnel insulator layer 2, and the junction depth of the source region 8 as well as the drain region 9 have been reduced owing to the microfabrication of semiconductor elements.

According to the nonvolatile memory shown in FIG. 1, even when the tunnel insulator layers 2 and 4 are thinned to the extent of several nm, the electrons can be somewhat prevented from tunneling out after the cutoff of the supply voltage owing to utilizing a Coulomb blockade effect in silicon particle in layer 3, and the microfabrication of the element can be incarnated.

Even with such a nonvolatile memory, however, the charges tunnel out when the memory is let stand for a long time, and a long storage time sufficient for practical use has not been realized yet.

BRIEF SUMMARY OF THE INVENTION

The present invention has been made in view of the above problem, and has for its object to provide a semiconductor storage element which realizes a sufficiently long storage time fit for practical use.

In the first aspect of performance of the present invention, there is provided a semiconductor storage element comprising:

a semiconductor layer;

a source region and a drain region formed in said semiconductor layer;

a channel region formed between said source region and said drain region;

a control electrode formed over said channel region; and a stacked structure disposed between said channel region and said control electrode, the stacked structure including a conductive particle layer containing conductive particles, and a layer having an energy level allowing a charge to stay thereat;

wherein, when the charge is an electron, an energy level at which the electron is injected into the conductive particle or the layer having the energy level allowing the charge to stay thereat, as a charge stored layer, is lower than an energy level of a conduction band edge of said channel region or a Fermi level of said control electrode; and when the charge is a hole, an energy level at which the hole is injected into the conductive particle or the layer having the energy level allowing the charge to stay thereat, as a charge stored layer, is higher than an energy level of a valence band edge of said channel region or the Fermi level of said control electrode.

Besides, in the second aspect of performance, there is provided a semiconductor storage element:

a semiconductor layer;

a source region and a drain region formed in said semiconductor layer;

a channel region formed between said source region and said drain region;

a first tunnel insulator layer formed on said channel region;

a conductive particle layer formed on said first tunnel insulator layer, the conductive particle layer containing conductive particles satisfying a condition that electrostatic energy in the case of charging one elementary charge is greater than a thermal fluctuation;

a second tunnel insulator layer formed on said conductive particle layer;

a charge stored layer formed on said second tunnel insulator layer; and a control electrode formed on said charge stored layer;

wherein, when the charge is an electron, an energy level at which the electron is injected into said charge stored layer is lower than an energy level of a conduction band edge of said channel region; and when the charge is a hole, an energy level at which the hole is injected into said charge stored layer is higher than an energy level of a valence band edge of said channel region.

Besides, in the third aspect of performance, there is provided a semiconductor storage element:

a semiconductor layer;

a source region and a drain region formed in said semiconductor layer;

a channel region formed between said source region and said drain region;

a first tunnel insulator layer formed on said channel region;

a layer formed on said first tunnel insulator layer, the layer containing trap levels due to atomic dangling bonds;

a second tunnel insulator layer formed on said layer containing the trap levels;

a charge stored layer formed on said second tunnel insulator layer, the charge stored layer containing charge stored particles satisfying a condition that electrostatic energy in the case of charging one elementary charge is greater than a thermal fluctuation; and a control electrode formed on said charge stored layer;

wherein, when the charge is an electron, an energy level of the dangling bond is lower than an energy level of a conduction band edge of said channel region; and when the charge is a hole, an energy level of the dangling bond is higher than an energy level of a valence band edge of said channel region.

Besides, in the fourth aspect of performance, there is provided a semiconductor storage element comprising:

a semiconductor layer;

a source region and a drain region formed in the semiconductor layer;

a channel region formed between the source region and the drain region;

a charge stored layer formed on the channel region;

a first tunnel insulator layer formed on the charge stored layer;

a conductive particle layer formed on the first tunnel insulator layer, the conductive particle containing conductive particles satisfying a condition that electrostatic energy in the case of charging one elementary charge is greater than a thermal fluctuation;

a second tunnel insulator layer formed on the conductive particle layer; and a control electrode formed on the second tunnel insulator layer;

wherein, when the information charge is an electron, an energy level at which the electron is injected into the charge stored layer is lower than a Fermi level in the control electrode; and when the information charge is a hole, an energy level at which the hole is injected into the charge stored layer is higher than the Fermi level in the control electrode.

Besides, in the fifth aspect of performance, there is provided a semiconductor storage element comprising:

a semiconductor layer;

a source region and a drain region formed in the semiconductor layer;

a channel region formed between the source region and the drain region;

a charge stored layer formed on the channel region, the charge stored layer containing charge stored particles satisfying a condition that electrostatic energy in the case of charging one elementary charge is greater than a thermal fluctuation;

a first tunnel insulator layer formed on the charge stored layer;

a layer formed on the first tunnel insulator layer, the layer containing atomic dangling bonds forming trap levels of charges;

a second tunnel insulator layer formed on the layer containing the atomic dangling bonds; and a control electrode formed on the second tunnel insulator layer;

wherein, when the charge is an electron, an energy level of the dangling bond is lower than an energy level of a conduction band edge in the control electrode; and when the charge is a hole, an energy level of the dangling bond is higher than an energy level of a valence band edge in the control electrode.

BRIEF DESCRIPTION OF THE DRAWINGS

FIGS. 21A–21B are diagrams each showing the energy level structure of the "silicon substrate/tunnel insulator layer/conductive particle/charge stored layer" of a nonvolatile semiconductor storage element according to the present invention, wherein FIG. 21A shows the state of flat bands, and FIG. 21B shows the state in voltage balance;

FIGS. 22A–22B are diagrams for comparing energy level structures in the cases where two tunneling films are symmetric and asymmetric in thickness, wherein FIG. 22A shows an injection mode, and FIG. 22B shows an emission mode;

FIGS. 34A–34B are band diagrams each corresponding to the "channel region/defect (dangling bond)/charge stored layer (floating gate) of the nonvolatile semiconductor storage element according to the present invention, wherein FIG. 34A shows a writing band, and FIG. 34B shows a storing band;

FIGS. 35A–35B are diagrams for comparing energy level structures in the cases where two tunneling films are symmetric and a symmetric in thickness, wherein FIG. 35A shows an injection mode, and FIG. 35B shows an emission mode;

FIGS. 36A–36B are band diagrams each corresponding to the "channel region/defect (dangling bond)/charge stored layer (floating gate) of the nonvolatile semiconductor storage element according to the present invention, wherein FIG. 36A shows a band for a shallow charge stored portion, and FIG. 36B shows a band for a deep charge stored portion.

DETAILED DESCRIPTION OF THE INVENTION

Now, the preferred embodiments of the present invention will be described with reference to the drawings.

(Embodiment 1)

Figure 1:
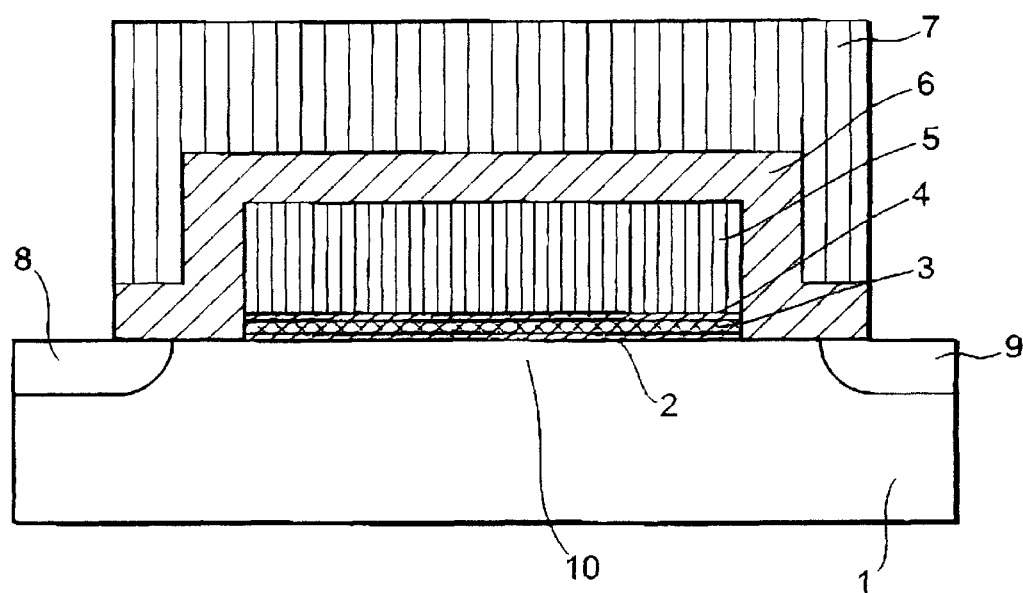
FIG. 1 is a sectional view of a nonvolatile semiconductor storage element in the prior art.
Figure 2:
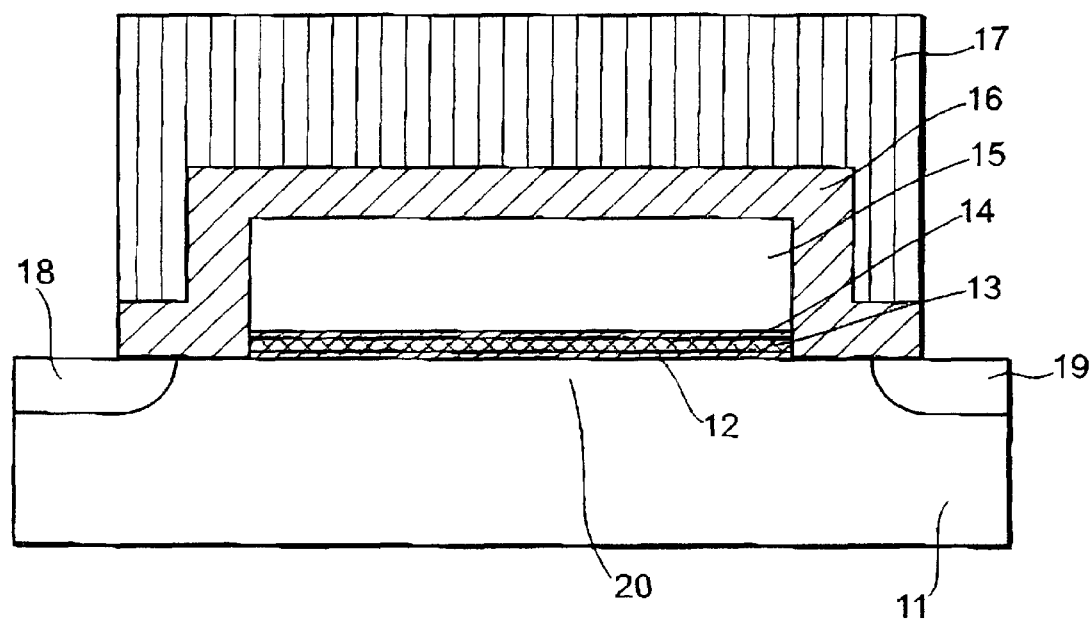
FIG. 2 is a sectional view of a nonvolatile semiconductor storage element according to the first embodiment of the present invention.

FIG. 2 is a sectional view of a nonvolatile semiconductor storage element according to Embodiment 1 of the present invention.

The nonvolatile semiconductor storage element has a structure including a semiconductor layer 11 made of p-type silicon, a source region 18 and a drain region 19 made of n$^+$-type silicon and formed in the semiconductor layer 11, a channel region 20 formed between the source region 18 and the drain region 19, a first tunnel insulator layer (tunneling film) 12 (2 nm thick) formed on the channel region 20, a conductive particle layer 13 (5 nm thick) formed on the first tunnel insulator layer 12, a second tunnel insulator layer (tunneling film) 14 (2 nm thick) formed on the conductive particle layer 13, a charge stored layer (floating gate) 15 (20 nm thick) formed on the second tunnel insulator layer 14, a control insulator layer 16 (10 nm thick) formed on the charge stored layer 15, and a control electrode (control gate) 17 (500 nm thick) formed on the control insulator layer 16.

Silicon oxide, silicon nitride, or the like is mentioned as the material of the first tunnel insulator layer 12. Further, this layer 12 is formed at a thickness at which electrons can be tunneled quantum-mechanically. Besides, the conductive particle layer 13 is a layer which contains conductive particles such as silicon particles, and which is, for example, an intrinsic polycrystal silicon layer.

Besides, silicon oxide, silicon nitride, or the like is mentioned as the material of the second tunnel insulator layer 14. Further, this layer 14 is formed at a thickness at which electrons can be tunneled quantum-mechanically.

Besides, p$^+$-type germanium is mentioned as the material of the charge stored layer 15. Also, silicon oxide or silicon nitride is mentioned as the material of the control oxide film 16. Also, n$^+$-type polycrystal silicon is mentioned as the material of the control electrode 17.

In such a storage element, the charge stored layer 15 is formed of p-type germanium, and the channel region 20 is formed of silicon. As viewed from a vacuum level, accordingly, the energy level of the valence band edge of the charge stored layer 15 (p-type germanium) is lower than that of the conduction band edge of the channel region 20 (silicon). Owing to such a construction, according to the storage element, electrons stored in the charge stored layer 15 are difficult to tunnel out into the channel region 20, so that the storage time of the element becomes remarkably long.

Incidentally, although the p$^+$-type germanium is adopted for the charge stored layer 15 in this embodiment, a layer of low p-type dopant concentration may well be employed. Apart from the germanium, any semiconductor such as n-type GaAs may well be employed as long as electrons are injected into its position which is lower in energy than the conduction band edge of the channel region 20 being an electron source, as viewed from the vacuum level.

This embodiment has indicated the example in which the electrons are emitted from the charge stored layer 15 into the channel region 20. The electrons, however, may well be emitted from the charge stored layer 15 into the control electrode 17. In this case, a similar effect is attained if the energy level of the valence band edge of the charge stored layer 15 (p-type germanium) is lower than that of the conduction band edge of the control electrode 17 (silicon) as viewed from the vacuum level.

Meanwhile, in case of utilizing holes as charges, materials may be so selected that the energy level of the charge stored layer 15 at which the holes being the information charges are injected becomes higher than the energy level of a valence band edge of the channel region 20 or the control electrode 17. Thus, the difference of the energy levels acts as an energy barrier on the holes, so that the storage time becomes long. In this case, a semiconductor substrate including the semiconductor layer 11 may form a field effect transistor whose carriers are the holes.

Next, a method of manufacturing the nonvolatile semiconductor storage element shown in FIG. 2 will be described with reference to FIGS. 3A, 3B and 3C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a second tunnel insulator layer (tunneling film) 14 made of silicon oxide is deposited on the amorphous silicon film. Owing to the dry oxidation, the amorphous silicon film becomes 5 nm thick.

Figure 3:
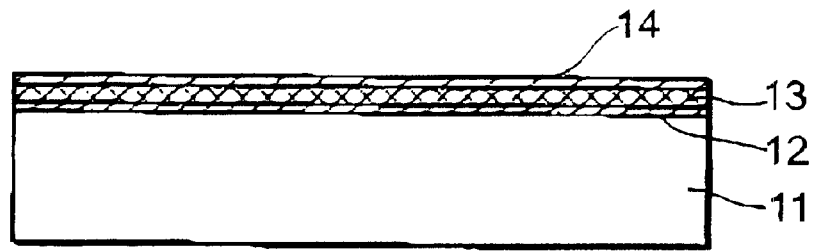
FIGS. 3A–3C are sectional views at individual steps for explaining a manufacturing process for the nonvolatile semiconductor storage element according to Embodiment 1 of the present invention.
Figure 3:
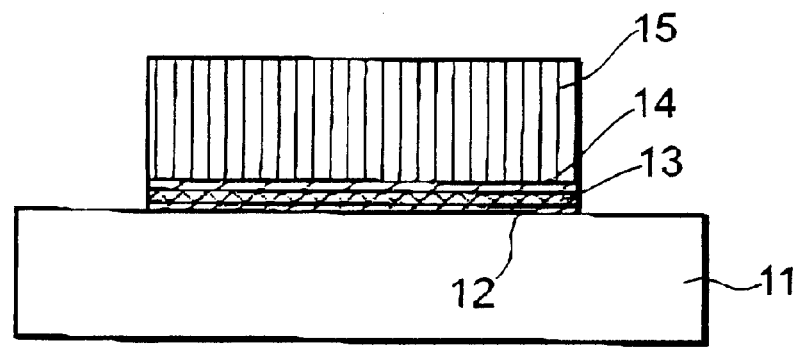
Figure 3:
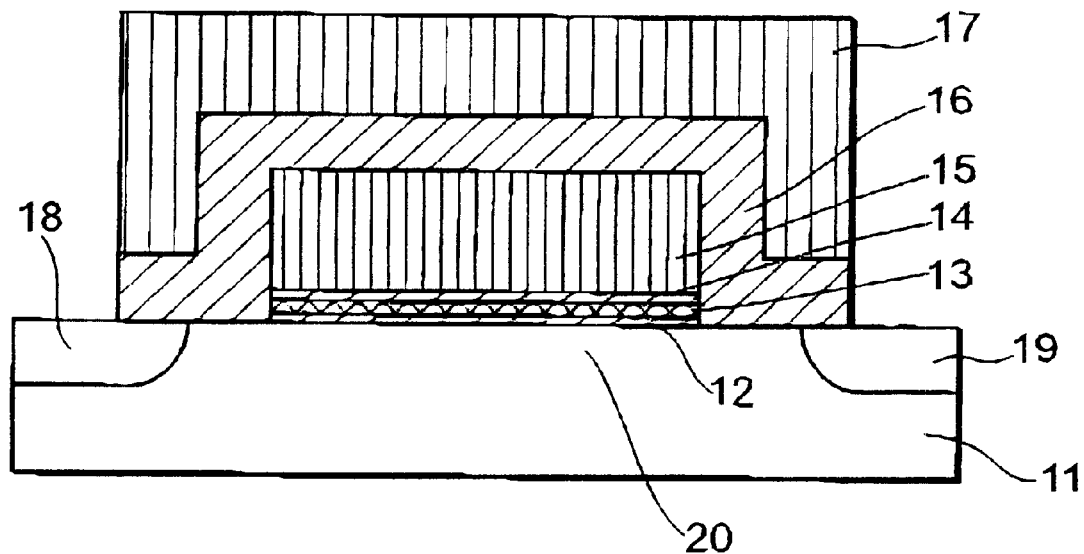

When high-temperature annealing at 900° C. is subsequently performed in an nitrogen atmosphere, the amorphous silicon layer becomes a conductive particle layer 13 containing polycrystal silicon particles of nanometer size satisfying a Coulomb blockade condition (FIG. 3A). The satisfaction of the Coulomb blockade condition signifies that electrostatic energy in the case of charging one elementary charge is greater than a thermal fluctuation.

Subsequently, a charge stored layer (floating gate) 15 made of p-type germanium is formed by CVD while doping it with boron. Thereafter, a stacked structure portion comprising the first tunnel insulator layer 12, conductive particle layer 13, second tunnel insulator layer 14, and charge stored layer 15 is etched using a resist pattern as a mask (FIG. 3B).

Subsequently, a control insulator layer 16 made of silicon oxide is formed on the stacked structure portion by LPCVD (Low Pressure Chemical Vapor Deposition). Further, a control electrode (control gate) 17 made of n$^+$-type polycrystal silicon is formed on the control insulator layer 16 by CVD.

Subsequently, phosphorus ions are implanted into the resultant substrate at a dose of $1 \times 10^{15}$ cm$^{-2}$ under an acceleration voltage of 15 keV, and the resultant structure is subjected to fast annealing at 1000° C. for 10 seconds, thereby to form a source region 18 and a drain region 19 which are made of n$^+$-type silicon. Lastly, the steps of forming an inter-layer insulator layer and metal wiring lines are performed. Then, the nonvolatile semiconductor storage element is finished up (FIG. 3C).

Figure 4:
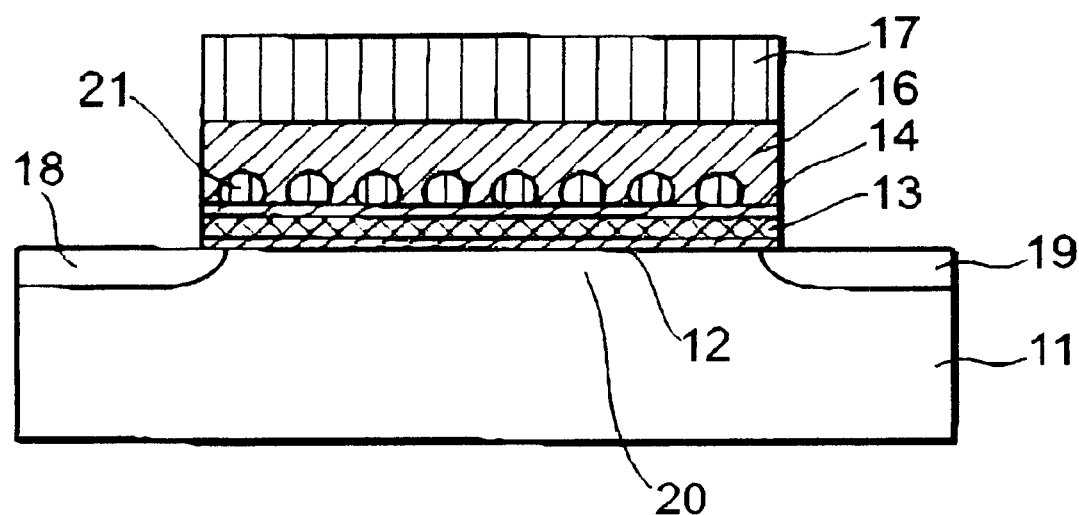
FIG. 4 is a sectional view of a nonvolatile semiconductor storage element according to a modification to Embodiment 1 of the present invention.

In the nonvolatile semiconductor storage element thus formed, charge stored particles 21 made of a microcrystal semiconductor may well be formed as a charge stored layer as shown in FIG. 4. In FIG. 4, parts designated by the same reference numerals as in FIG. 3C are the same constituents.

The charge stored particles 21 must exist over the channel 20 at a certain area or surface density. A memory effect develops in such a way that a channel current is decreased by Coulomb blockade based on the information charges of the charge stored particles 21. Accordingly, when the average interval of the charge stored particles 21 is greater than double a Coulomb screening length (approximately 15 nm), a part which does not undergo the Coulomb blockade appears on the surface of the channel 20, and the memory effect cannot be sufficiently produced. Therefore, the charge stored particles 21 should desirably exist at or above an area density of $1/(30 \text{ nm})^2$ (approximately $1\times10^{11} \text{ cm}^{-2}$). For this purpose, the diameters of the charge stored particles 21 should desirably be set at or below 30 nm. As the diameters of the charge stored particles 21 are smaller, the area density thereof can be increased more. Therefore, the diameters of the charge stored particles 21 should more preferably be on the order of 0.5 nm through 15 nm. They should still more preferably be 0.5 nm through 10 nm. For such reasons, the area density of the charge stored particles 21 should preferably be at least $1\times10^{11} \text{ cm}^{-2}$.

Further, even when the charge stored particles 21 have diameters of or below 30 nm, carriers lie just under them at a low probability, and hence, the memory effect can be sufficiently enhanced. When a low voltage state becomes such a gate drive that at most 0.05v is applied to 10 nm of the oxide film, the carrier density of the channel 20 lowers to at most $1\times10^{11} \text{ cm}^2$ (approximately $1/(30 \text{ nm})^2$). Therefore, the number of electrons lying just under the charge stored particles 21 becomes smaller than one, and the rate of carrier charging/discharging is governed, so that a storage characteristic is enhanced.

Still further, the plurality of charge stored particles 21 may be regularly arrayed, or even a single charge stored particle 21 may well be formed. Owing to the formation of the charge stored layer by the charge stored particles 21, the number of electrons to be stored is quantized by the Coulomb blockade effect of the charge stored particles 21, so that the application of the storage element to a multi-valued memory can also be expected. Besides, it is more favorable for lengthening the storage time that the charge stored particles 21 and the conductive particles are formed so as to be stacked vertically or in the direction of the thicknesses of the films.

(Embodiment 2)

Next, a method of manufacturing a nonvolatile semiconductor storage element according to Embodiment 2 will be described with reference to FIGS. 5A, 5B and 5C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a second tunnel insulator layer (tunneling film) 14 made of silicon oxide is deposited on the amorphous silicon film. Owing to the dry oxidation, the amorphous silicon film becomes 5 nm thick.

Figure 5:
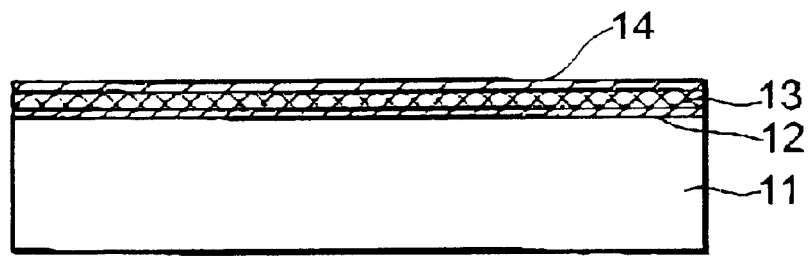
FIGS. 5A–5C are sectional views at individual steps for explaining a manufacturing process for a nonvolatile semiconductor storage element according to Embodiment 2 of the present invention.
Figure 5:
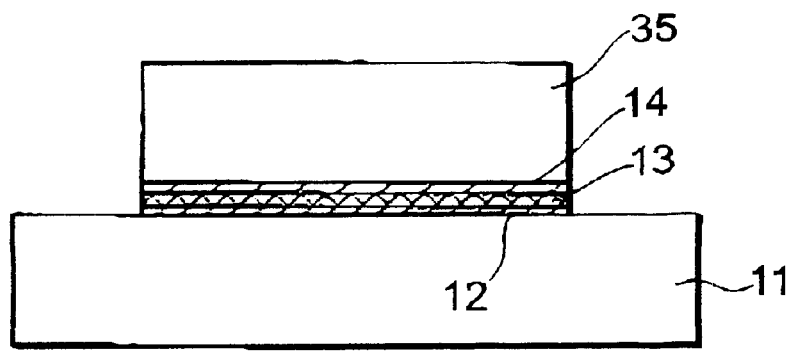
Figure 5:
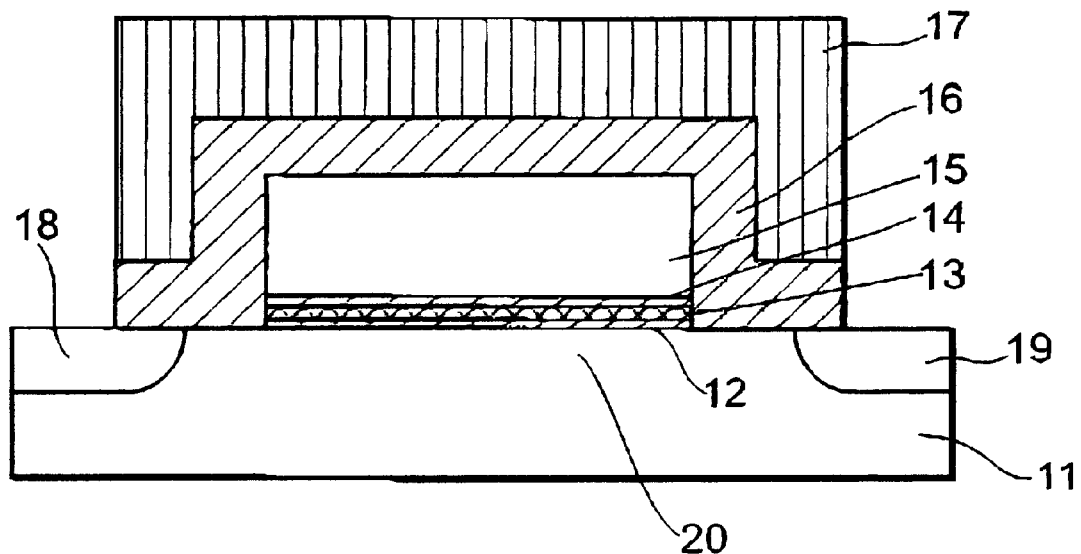

When high-temperature annealing at 900° C. is subsequently performed in an nitrogen atmosphere, the amorphous silicon layer becomes a conductive particle layer 13 made of polycrystal silicon particles of nanometer size satisfying a Coulomb blockade condition (FIG. 5A).

Subsequently, a charge stored layer (floating gate) 35 (50 nm thick) made of tungsten is formed by sputtering. Thereafter, a stacked structure portion comprising the first tunnel insulator layer 12, conductive particle layer 13, second tunnel insulator layer 14, and charge stored layer 35 is etched using a resist pattern as a mask (FIG. 5B).

Subsequently, a control insulator layer 16 made of silicon oxide is formed on the stacked structure portion by LPCVD (Low Pressure Chemical Vapor Deposition). Further, a control electrode (control gate) 17 made of $n^+$-type polycrystal silicon is formed on the control insulator layer 16 by CVD.

Subsequently, phosphorus ions are implanted into the resultant substrate at a dose of $1\times10^{15} \text{ cm}^{-2}$ under an acceleration voltage of 15 keV, and the resultant structure is subjected to fast annealing at 1000° C. for 10 seconds, thereby to form a source region 18 and a drain region 19 which are made of $n^+$-type silicon. Lastly, the steps of forming an inter-layer insulator layer and metal wiring lines are performed. Then, the nonvolatile semiconductor storage element is finished up (FIG. 5C).

Although, in this embodiment, tungsten is employed as the material of the charge stored layer 35, another metal such as aluminum or copper may well be employed. It is also allowed to employ tungsten silicide or the like. In this manner, any metal may well be employed as long as its Fermi level lies at a position which is lower in energy than the conduction band edge of the channel region 20 being an electron source or the Fermi level of the control electrode 17 ($N^+$ silicon), as viewed from a vacuum level. Besides, in case of utilizing holes as charges, any metal may well be employed as long as its Fermi level lies at a position which is higher in energy than the valence band edge of the channel region 20 being a charge source or the Fermi level of the control electrode 17 ($P^+$ silicon), as viewed from the vacuum level.

Figure 6:
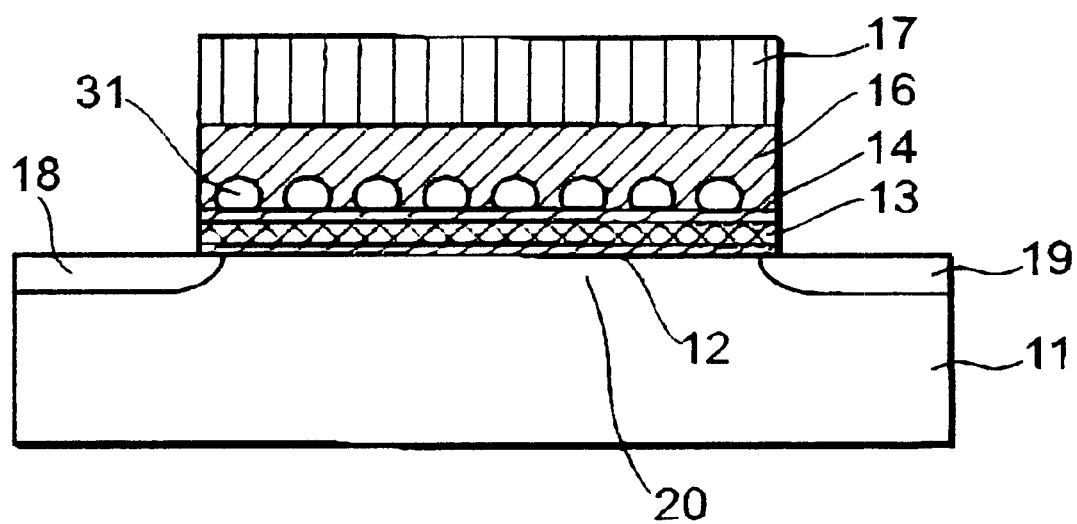
FIG. 6 is a sectional view of a nonvolatile semiconductor storage element according to a modification to Embodiment 2 of the present invention.

In the nonvolatile semiconductor storage element thus formed, charge stored particles 31 made of tungsten particles or the likes may well be formed as a charge stored layer as shown in FIG. 6. In FIG. 6, parts designated by the same reference numerals as in FIG. 5c are the same constituents.

The diameters of the charge stored particles 31 may be 30 nm or below. Also, the diameters of the charge stored particles 31 should more preferably be on the order of 0.5 nm through 15 nm. They should still more preferably be 0.5 nm through 10 nm. Besides, the area or surface density of the charge stored particles 31 should preferably be at least $1\times10^{11} \text{ cm}^2$.

Further, even when the charge stored particles 31 have diameters of or below 30 nm, carriers lie just under them at a low probability, and hence, a memory effect can be sufficiently enhanced. When a low voltage state becomes such a gate drive that at most 0.05V is applied to 10 nm of the oxide film, the carrier density of the channel 20 lowers to at most $1\times10^{11} \text{ cm}^{-2}$ (approximately $1/(30 \text{ nm})^2$). Therefore, the number of electrons lying just under the charge stored particles 31 becomes smaller than one, and the rate of carrier charging/discharging is governed, so that a storage characteristic is enhanced.

Still further, the plurality of charge stored particles 31 may be regularly arrayed, or even a single charge stored particle 31 may well be formed. Owing to the formation of the charge stored layer by the charge stored particles 31, the number of electrons to be stored is quantized by the Coulomb blockade effect of the charge stored particles 31, so that the application of the storage element to a multi-valued memory can also be expected. Besides, it is more favorable for lengthening the storage time of the storage element that the charge stored particles 31 and the conductive particles are formed so as to be stacked vertically or in the direction of the thicknesses of the films.

(Embodiment 3)

Next, a method of manufacturing a nonvolatile semiconductor storage element according to Embodiment 3 will be described with reference to FIGS. 7A, 7B and 7C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a second tunnel insulator layer (tunneling film) 14 made of silicon oxide is deposited on the amorphous silicon film. Owing to the dry oxidation, the amorphous silicon film becomes 5 nm thick.

Figure 7:
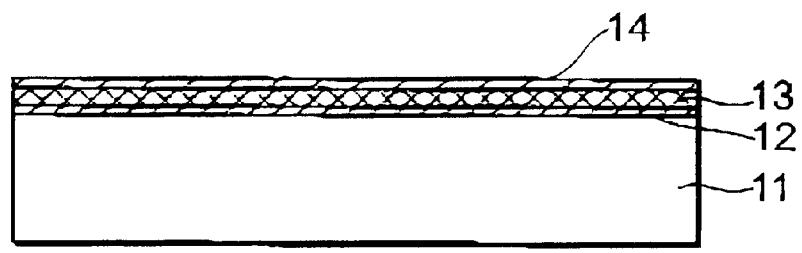
FIGS. 7A–7C are sectional views at individual steps for explaining a manufacturing process for a nonvolatile semiconductor storage element according to Embodiment 3 of the present invention.
Figure 7:
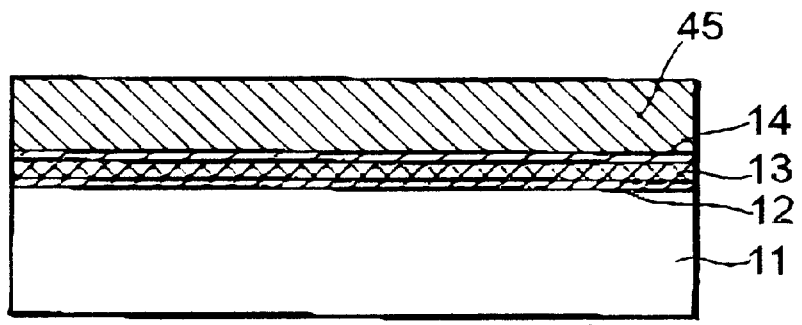
Figure 7:
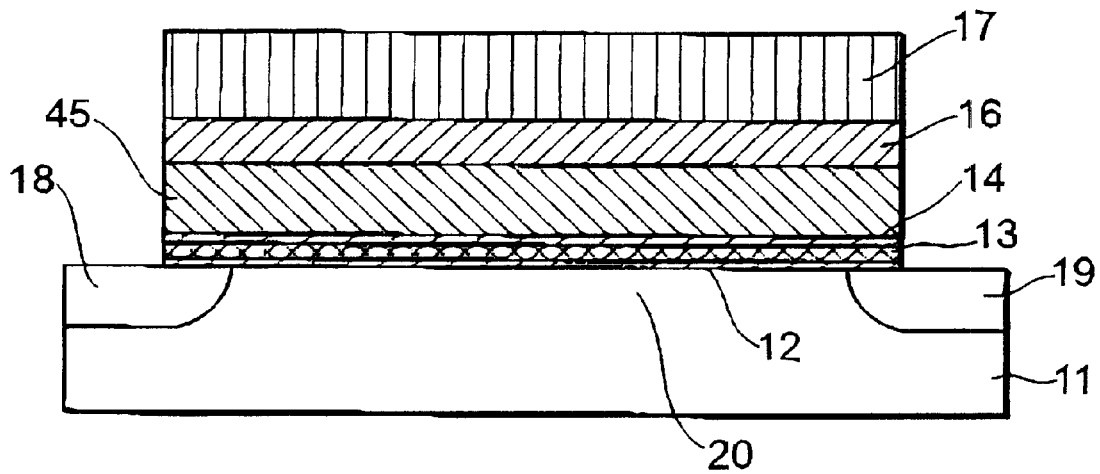

When high-temperature annealing at 900° C. is subsequently performed in an nitrogen atmosphere, the amorphous silicon layer becomes a conductive particle layer 13 made of polycrystal silicon particles of nanometer size satisfying a Coulomb blockade condition (FIG. 7A).

Subsequently, a charge stored layer (floating gate) 45 (20 nm thick) made of silicon nitride is formed by LPCVD (Low Pressure Chemical Vapor Deposition) (FIG. 7B). The silicon nitride film 45 possesses at its interface or in its interior an electron trap level which is lower in energy than the conduction band edge of a channel region (20 in FIG. 7C) as viewed from a vacuum level (in case of utilizing holes as charges, a hole trap level which is higher than the valence band edge of the channel region 20), and it functions as the charge stored layer.

Subsequently, a control insulator layer 16 made of silicon oxide is formed on the resultant stacked structure portion by LPCVD. Further, a control electrode (control gate) 17 made of n+-type polycrystal silicon is formed on the control insulator layer 16 by CVD.

Subsequently, a stacked structure portion comprising the first tunnel insulator layer 12, conductive particle layer 13, second tunnel insulator layer 14, charge stored layer 45, control insulator layer 16, and control electrode 17 is etched using a resist pattern as a mask.

Subsequently, phosphorus ions are implanted into the resultant substrate at a dose of $1 \times 10^{15}$ cm$^{-2}$ under an acceleration voltage of 15 keV, and the resultant structure is subjected to fast annealing at 1000° C. for 10 seconds, thereby to form a source region 18 and a drain region 19 which are made of n+-type silicon. Lastly, the steps of forming an inter-layer insulator layer and metal wiring lines are performed. Then, the nonvolatile semiconductor storage element is finished up (FIG. 7C).

In this embodiment, owing to a dangling bond in the silicon nitride 45 which forms the charge stored layer, the trap level exists which is lower in energy than the conduction band edge of the channel region 20 (silicon) being an electron source or the Fermi level of the control electrode 17 (N+ silicon) as viewed from the vacuum level. The storage time of the storage element can be made long by employing the trap level for the charge stored layer. Besides, in the case of utilizing the holes as the charges, the trap level exists which is higher in energy than the valence band edge of the channel region 20 being a charge source or the Fermi level of the control electrode 17 (P+ silicon) as viewed from the vacuum level. A similar effect can be expected by employing the trap level for a charge stored layer. Incidentally, any material other than the silicon nitride may well be employed as long as it contains a large number of trap levels.

Figure 8:
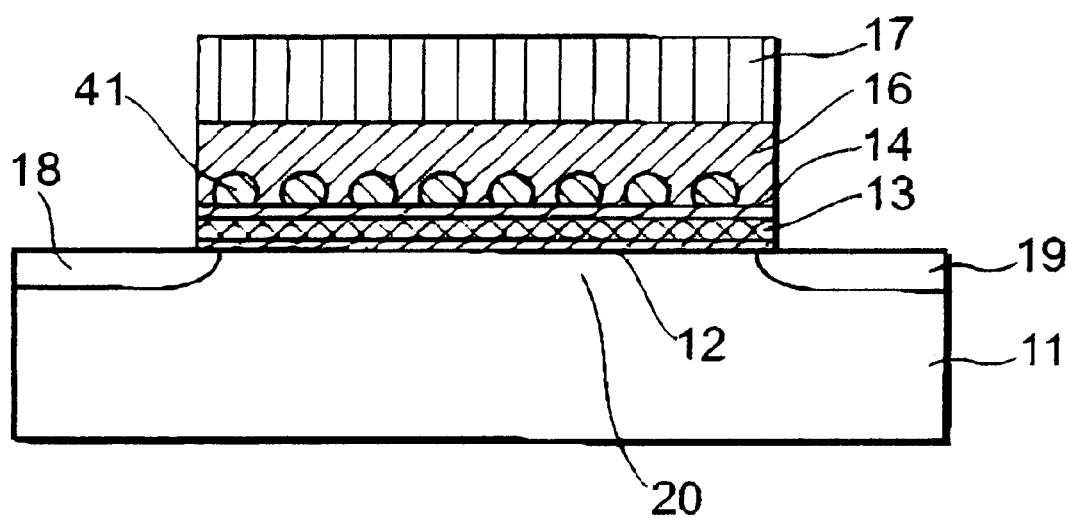
FIG. 8 is a sectional view of a nonvolatile semiconductor storage element according to a modification to Embodiment 3 of the present invention.

In the nonvolatile semiconductor storage element thus formed, charge stored particles 41 made of silicon nitride or the like may well be formed as a charge stored layer as shown in FIG. 8. In FIG. 8, parts designated by the same reference numerals as in FIG. 7C are the same constituents. Besides, the plurality of charge stored particles 41 may be regularly arrayed, or even a single charge stored particle 41 may well be formed.

(Embodiment 4)

Next, a method of manufacturing a nonvolatile semiconductor storage element according to Embodiment 4 will be described with reference to FIGS. 9A, 9B and 9C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (8 nm thick) is deposited on the first tunnel insulator layer 12 by, for example, CVD (Chemical Vapor Deposition). Thereafter, the resultant substrate is subjected to dry oxidation at 700° C. for 4 hours, whereby a silicon oxide layer 59 (6 nm thick) is formed on the amorphous silicon film. Owing to the dry oxidation, the amorphous silicon film becomes 5 nm thick.

Figure 9:
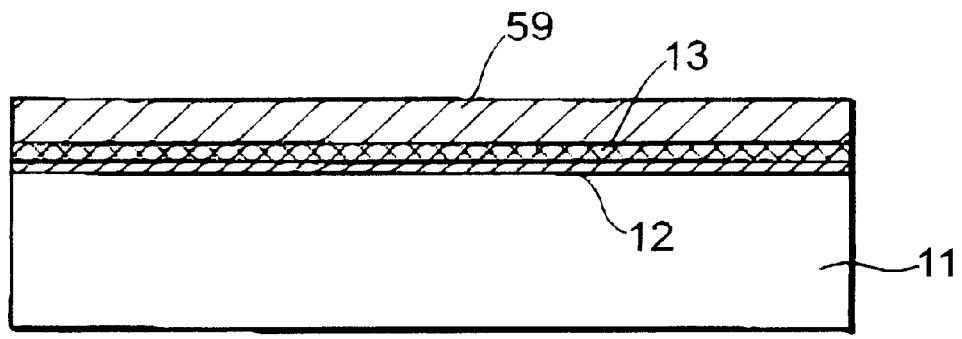
FIGS. 9A–9C are sectional views at individual steps for explaining a manufacturing process for a nonvolatile semiconductor storage element according to Embodiment 4 of the present invention.
Figure 9:
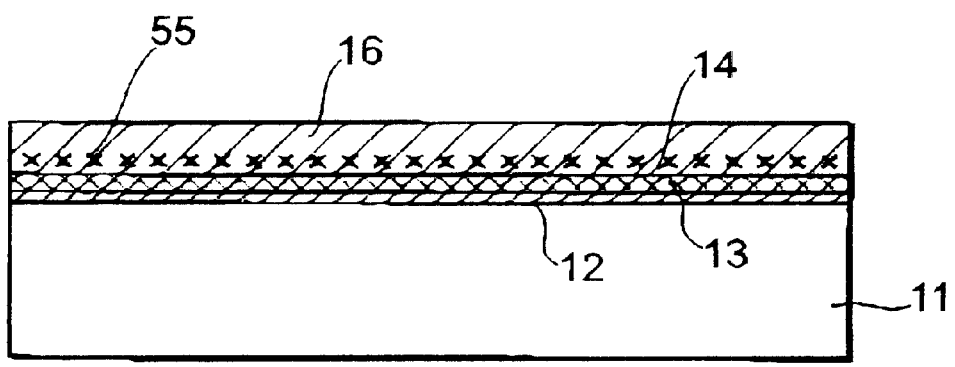
Figure 9:
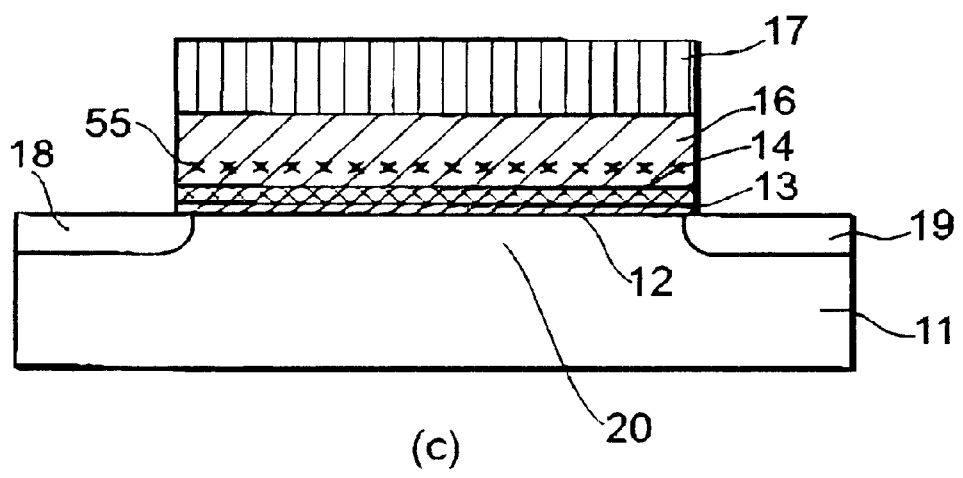

When high-temperature annealing at 900° C. is subsequently performed in an nitrogen atmosphere, the amorphous silicon layer becomes a conductive particle layer 13 made of polycrystal silicon particles of nanometer size satisfying a Coulomb blockade condition (FIG. 9A).

Subsequently, argon ions are implanted into the silicon oxide layer 59 at a dose of $1 \times 10^{15}$ cm$^{-2}$ by low-acceleration ion implantation (an acceleration voltage of about 4 keV). Owing to the low-acceleration ion implantation, a large number of defects due to dangling bonds (forming the trap levels of information charges) 55 to serve as a charge stored layer are formed in the silicon oxide layer 59. The acceleration voltage is adjusted so that the defects 55 may be located at a depth of 4 nm from the front surface of the silicon oxide layer 59. Thus, the silicon oxide between the defects 55 and the conductive particle layer 13 made of polycrystal silicon particles becomes 2 nm thick, and this part having the thickness of 2 nm serves as a second tunnel insulator layer (tunneling film) 14.

On the other hand, the silicon oxide overlying the defects 55 becomes 4 nm thick, and this part having the thickness of 4 nm serves as a control insulator layer 16 (FIG. 9B).

Subsequently, a control electrode (control gate) 17 made of n+-type polycrystal silicon is formed by CVD. Further, a stacked structure portion comprising the first tunnel insulator layer 12, conductive particle layer 13, second tunnel insulator layer 14, charge stored layer including the defects 55, control insulator layer 16, and control electrode 17 is etched using a resist pattern as a mask.

Subsequently, phosphorus ions are implanted into the resultant substrate at a dose of $1\times10^{15}$ cm$^2$ under an acceleration voltage of 15 keV, and the resultant structure is subjected to fast annealing at 1000° C. for 10 seconds, thereby to forma source region 18 and a drain region 19 which are made of n$^+$-type silicon. Lastly, the steps of forming an inter-layer insulator layer and metal wiring lines are performed. Then, the nonvolatile semiconductor storage element is finished up (FIG. 9C).

In the semiconductor storage element thus formed, the energy level of the defects 55 is lower in energy than the conduction band edge of a channel region 20 (silicon) being an electron source or the Fermi level of the control electrode 17 (N$^+$ silicon) as viewed from a vacuum level. The storage time of the storage element can be made long by employing the defects 55 as the charge stored layer. Besides, in case of utilizing holes as charges, the energy level of the defects 55 is higher in energy than the valence band edge of the channel region 20 being a charge source or the Fermi level of the control electrode 17 (P$^+$ silicon) as viewed from the vacuum level. A similar effect can be expected by employing the defects 55 as a charge stored layer.

Although, in this embodiment, the defects 55 are formed by implanting the argon ions, the ions of any other element may well be implanted as long as the defects are formed.

(Embodiment 5)

Figure 10:
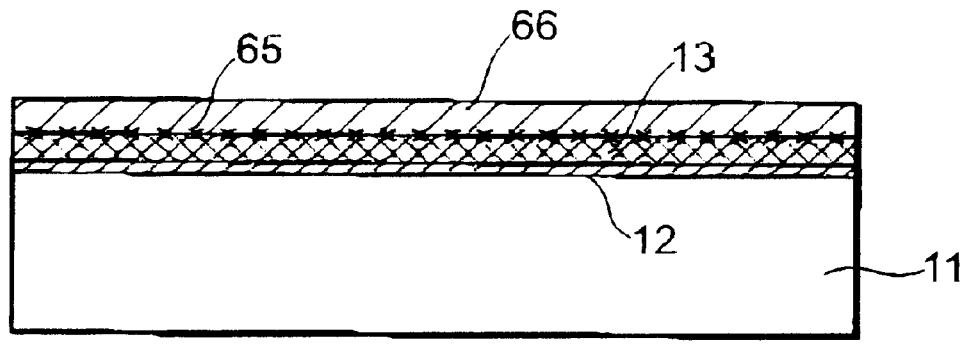
FIGS. 10A–10C are sectional views at individual steps for explaining a manufacturing process for a nonvolatile semiconductor storage element according to Embodiment 5 of the present invention.
Figure 10:
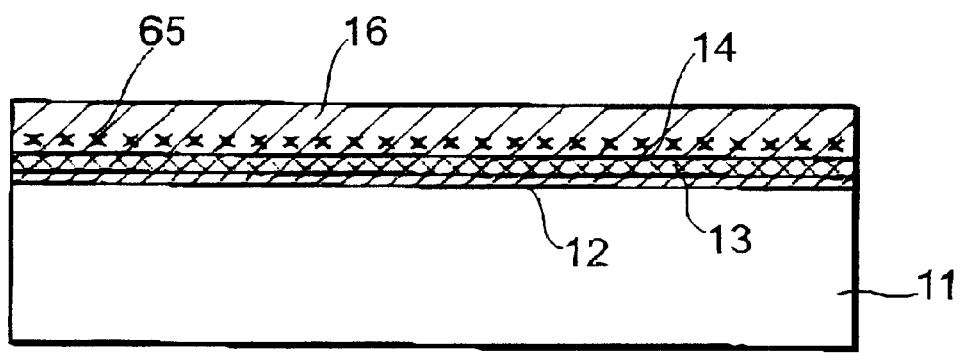
Figure 10:
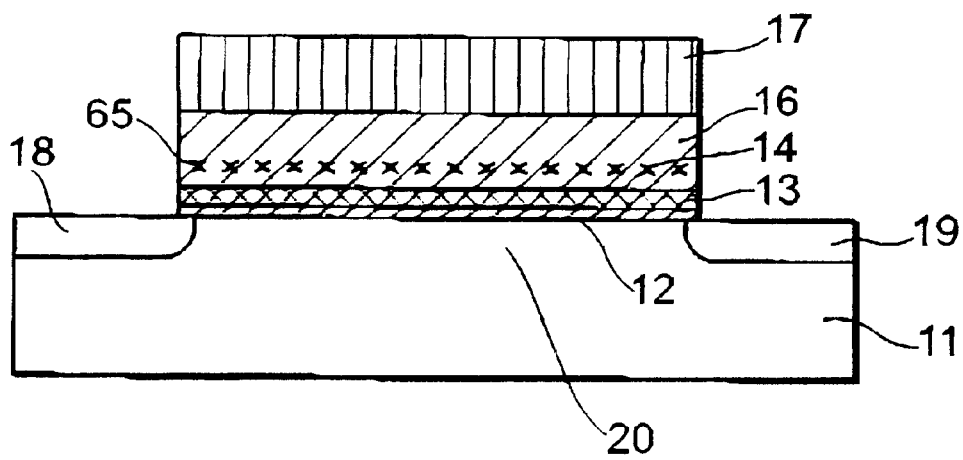

Next, another method of manufacturing a nonvolatile semiconductor storage element according to Embodiment 5 will be described with reference to FIGS. 10A, 10B and 10C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (8 nm thick) is deposited on the first tunnel insulator layer 12 by, for example, CVD (Chemical Vapor Deposition). Thereafter, the resultant substrate is subjected to dry oxidation at 700° C. for 120 minutes, whereby a silicon oxide layer 66 (4 nm thick) is formed on the amorphous silicon film. Owing to the dry oxidation, the amorphous silicon film becomes 6 nm thick.

When a hot ammonia process is subsequently performed at 900° C. under 4 kPa in an NH$_3$ atmosphere for 50 minutes, the amorphous silicon layer becomes a conductive particle layer 13 made of polycrystal silicon particles of nanometer size satisfying a Coulomb blockade condition, and simultaneously, the interface between the silicon oxide layer 66 and the conductive particle layer 13 is doped with nitrogen to the extent of 3% (atomic-%). Thus, defects (forming the trap levels of information charges) 65 on the order of $10^{13}$ cm$^{-2}$ are formed (FIG. 10A).

The resultant structure is further subjected to thermal oxidation so as to make the surface silicon oxide layer 66 thereof about 6 nm thick. Then, the part of the silicon oxide layer underlying the defects 65 becomes 2 nm thick, and it serves as a second tunnel insulator layer (tunneling film) 14. On the other hand, the part of the silicon oxide layer overlying the defects 65 becomes 4 nm thick, and it serves as a control insulator layer 16 (FIG. 10B).

Subsequently, a control electrode (control gate) 17 made of n$^+$-type polycrystal silicon is formed by CVD. Further, a stacked structure portion comprising the first tunnel insulator layer 12, conductive particle layer 13, second tunnel insulator layer 14, charge stored layer including the defects 65, control insulator layer 16, and control electrode 17 is etched using a resist pattern as a mask.

Subsequently, phosphorus ions are implanted into the resultant substrate at a dose of $1\times10^{15}$ cm$^{-2}$ under an acceleration voltage of 15 keV, and the resultant structure is subjected to fast annealing at 1000° C. for 10 seconds, thereby to form a source region 18 and a drain region 19 which are made of n$^+$-type silicon. Lastly, the steps of forming an inter-layer insulator layer and metal wiring lines are performed. Then, the nonvolatile semiconductor storage element is finished up (FIG. 10C).

In the semiconductor storage element thus formed, the defects 65 are lower in energy than the conduction band edge of a channel region 20 (silicon) being an electron source or the Fermi level of the control electrode 17 (N$^+$ silicon) as viewed from a vacuum level. The storage time of the storage element can be made long by employing the defects 65 as the charge stored layer. Besides, in case of utilizing holes as charges, the defects 65 are higher in energy than the valence band edge of the channel region 20 being a charge source or the Fermi level of the control electrode 17 (P$^+$ silicon) as viewed from the vacuum level. A similar effect can be expected by employing the defects 65 as a charge stored layer.

Although, in this embodiment, nitrogen is introduced by the ammonia process, it can be introduced also in a gaseous atmosphere of NO, N$_2$O or the like.

(Embodiment 6)

Next, a method of manufacturing a nonvolatile semiconductor storage element according to Embodiment 6 will be described with reference to FIGS. 11A, 11B and 11C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a silicon oxide layer (2 nm thick) is deposited on the amorphous silicon film so as to form a second tunnel insulator layer (tunneling film) 14. Owing to the dry oxidation, the amorphous silicon film becomes 5 nm thick.

Figure 11:
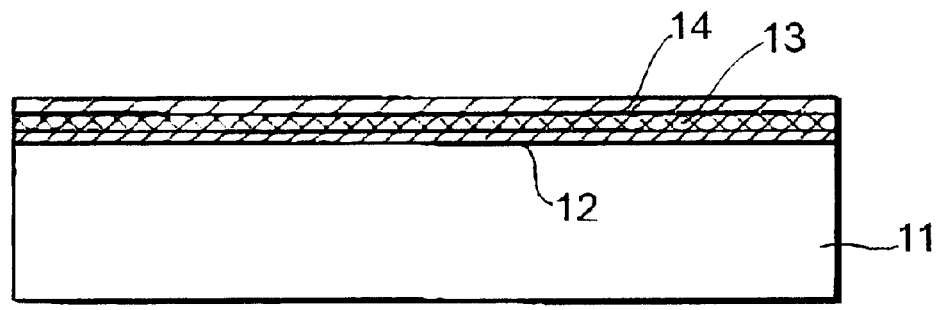
FIGS. 11A–11C are sectional views at individual steps for explaining a manufacturing process for a nonvolatile semiconductor storage element according to Embodiment 6 of the present invention.
Figure 11:
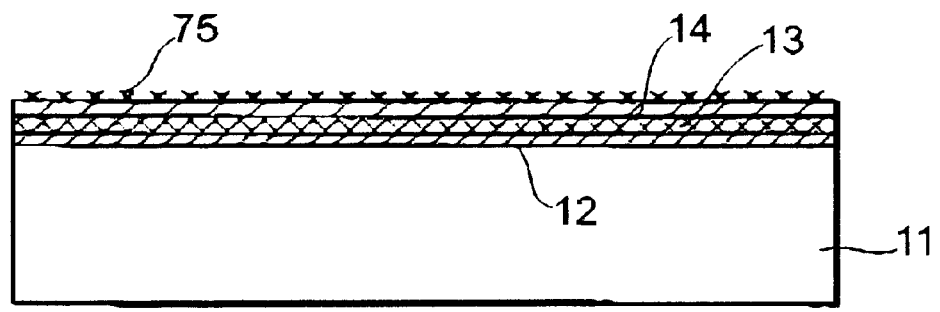
Figure 11:
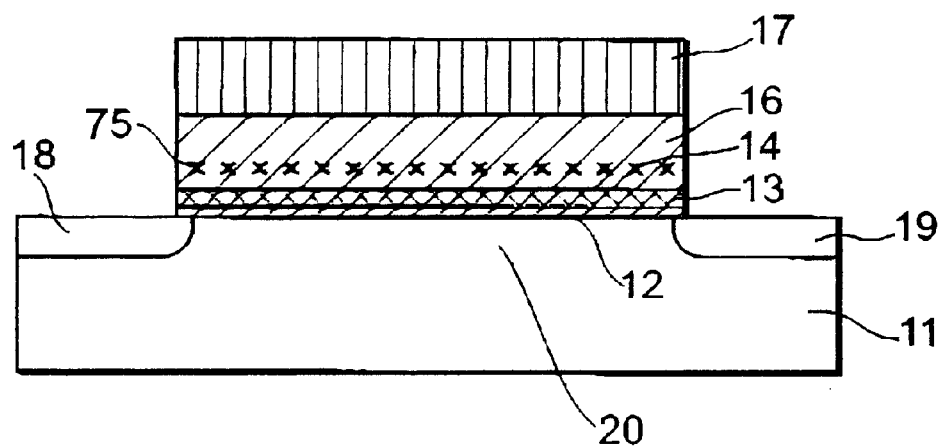

When high-temperature annealing at 900° C. is subsequently performed in an nitrogen atmosphere, the amorphous silicon layer becomes a conductive particle layer 13 made of polycrystal silicon particles of nanometer size satisfying a Coulomb blockade condition (FIG. 11A). The size satisfying the Coulomb blockade condition is such a size that electrostatic energy in the case of charging one elementary charge is greater than a thermal fluctuation.

Subsequently, defects (forming the trap levels of information charges) 75 are formed in the front surface of the second tunnel insulator layer 14 by EB (electron-beam) irradiation (FIG. 11B). The defects 75 serve as a charge stored layer.

Subsequently, a control insulator layer 16 made of silicon oxide and which is 10 nm thick is formed on the second tunnel insulator layer 14 formed with the defects 75, by LPCVD. Further, a control electrode (control gate) 17 made of n⁺-type polycrystal silicon and which is 200 nm thick is formed by CVD. Still further, a stacked structure portion comprising the first tunnel insulator layer 12, conductive particle layer 13, second tunnel insulator layer 14, charge stored layer including the defects 75, control insulator layer 16, and control electrode 17 is etched using a resist pattern as a mask.

Subsequently, phosphorus ions are implanted into the resultant substrate at a dose of $1 \times 10^{15}$ cm$^{-2}$ under an acceleration voltage of 15 keV, and the resultant structure is subjected to fast annealing at 1000° C. for 10 seconds, thereby to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 11C).

In the semiconductor storage element thus formed, the defects 75 are lower in energy than the conduction band edge of a channel region 20 (silicon) being an electron source or the Fermi level of the control electrode 17 (N⁺ silicon) as viewed from a vacuum level. The storage time of the storage element can be made long by employing the defects 75 as the charge stored layer. Besides, in case of utilizing holes as charges, the defects 75 are higher in energy than the valence band edge of the channel region 20 being a charge source or the Fermi level of the control electrode 17 (P⁺ silicon) as viewed from the vacuum level. A similar effect can be expected by employing the defects 75 as a charge stored layer.

Although, in this embodiment, the electron-beam irradiation is employed as a method of forming the defects 75 in the front surface of the second tunnel insulator layer 14, it may well be replaced with a method in which the front surface of the layer 14 is roughened by a wet process such as SH (sulfuric acid+hydrogen peroxide solution) process, or a method which is based on a dry process, for example, in which the nitrogen concentration of the outermost surface of the layer 14 is heightened by nitriding in an ammonia atmosphere.

(Embodiment 7)

Figure 12:
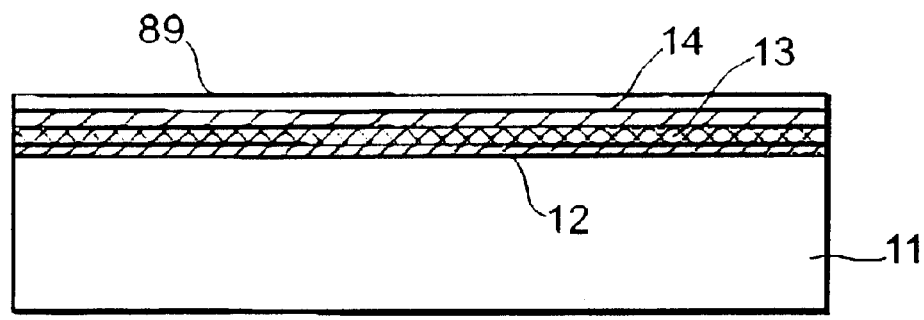
FIGS. 12A–12C are sectional views at individual steps for explaining a manufacturing process for a nonvolatile semiconductor storage element according to Embodiment 7 of the present invention.
Figure 12:
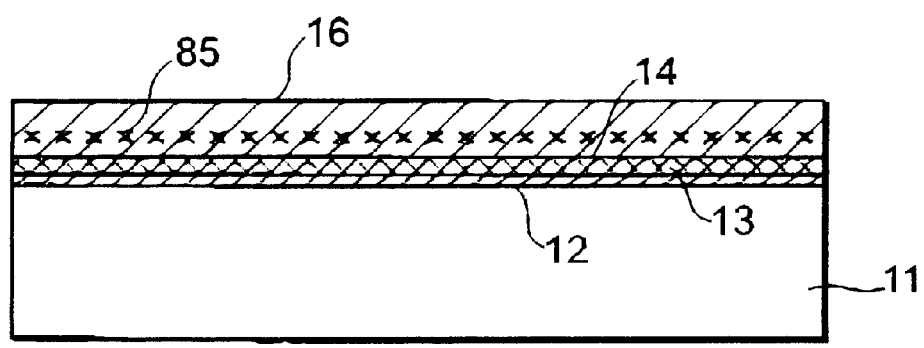
Figure 12:
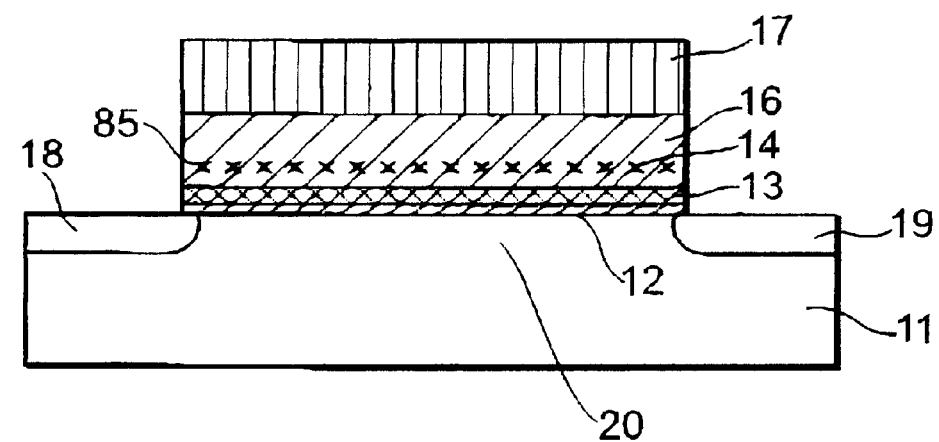

Next, a method of manufacturing a nonvolatile semiconductor storage element according to Embodiment 7 will be described with reference to FIGS. 12A, 12B and 12C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film (6 nm thick) is deposited on the first tunnel insulator layer 12 by, for example, CVD (Chemical vapor Deposition). Thereafter, the resultant substrate is subjected to dry oxidation at 700° C. for 5 minutes, whereby a silicon oxide layer (2 nm thick) is deposited on the amorphous silicon film so as to form a second tunnel insulator layer (tunneling film) 14. Owing to the dry oxidation, the amorphous silicon film becomes 5 nm thick.

When high-temperature annealing at 900° C. is subsequently performed in an nitrogen atmosphere, the amorphous silicon layer becomes a conductive particle layer 13 made of polycrystal silicon particles of nanometer size. Further, an amorphous silicon layer 89 is deposited on the second tunnel insulator layer 14 to a thickness of 2 nm by CVD (FIG. 12A).

Subsequently, the amorphous silicon layer 89 is entirely oxidized by dry oxidation at 700° C. for 120 minutes, thereby to form a control insulator layer 16. On this occasion, defects 85 (forming the trap levels of information charges) due to dangling bonds are formed at the interface between the amorphous silicon and the silicon oxide on the second tunnel insulator layer 14 because atoms flow very little during the oxidation at the temperature of 700° C. (FIG. 12B). The density of the defects 85 in this case can be regulated by the conditions of the oxidation. The defects 85 in the front surface of the second tunnel insulator layer 14 serve as a charge stored layer.

Subsequently, a control electrode (control gate) 17 made of n⁺-type polycrystal silicon and which is 200 nm thick is formed on the control insulator layer 16 by CVD. Further, a stacked structure portion comprising the first tunnel insulator layer 12, conductive particle layer 13, second tunnel insulator layer 14, charge stored layer including the defects 85, control insulator layer 16, and control electrode 17 is etched using a resist pattern as a mask.

Subsequently, phosphorus ions are implanted into the resultant substrate at a dose of $1 \times 10^{15}$ cm$^{-2}$ under an acceleration voltage of 15 keV, and the resultant structure is subjected to fast annealing at 1000° C. for 10 seconds, thereby to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 12C).

In the semiconductor storage element thus formed, the defects 85 are lower in energy than the conduction band edge of a channel region 20 (silicon) being an electron source or the Fermi level of the control electrode 17 (N⁺ silicon) as viewed from a vacuum level. The storage time of the storage element can be made long by employing the defects 85 as the charge stored layer. Besides, in case of utilizing holes as charges, the defects 85 are higher in energy than the valence band edge of the channel region 20 being a charge source or the Fermi level of the control electrode 17 (P⁺ silicon) as viewed from the vacuum level. A similar effect can be expected by employing the defects 85 as a charge stored layer.

(Embodiment 8)

Next, a method of manufacturing a nonvolatile semiconductor storage element of the present invention according to Embodiment 8 will be described with reference to FIGS. 13A, 13B and 13C. This nonvolatile semiconductor storage element is such that the charge stored layer 15 of the nonvolatile semiconductor storage element shown in FIG. 2 is replaced with conductive particles (charge stored particles), under which further conductive particles are included in self-aligned fashion.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film 99 (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a silicon oxide layer (2 nm thick) is deposited on the amorphous silicon film 99 so as to form a second tunnel insulator layer (tunneling film) 14. Owing to the dry oxidation, the amorphous silicon film 99 becomes 5 nm thick.

Figure 13:
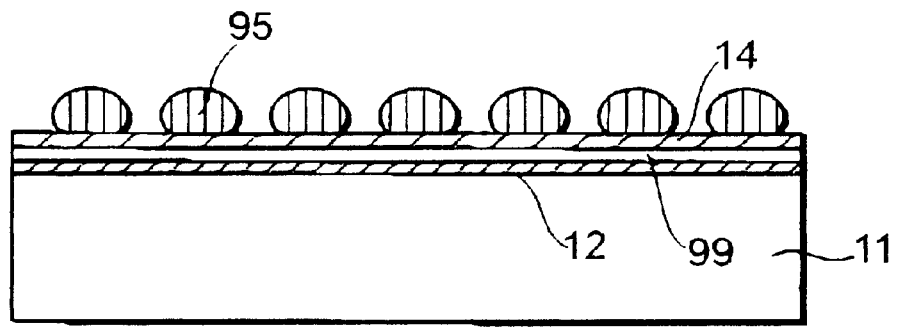
FIGS. 13A–13C are sectional views at individual steps for explaining a manufacturing process for a nonvolatile semiconductor storage element according to Embodiment 8 of the present invention.
Figure 13:
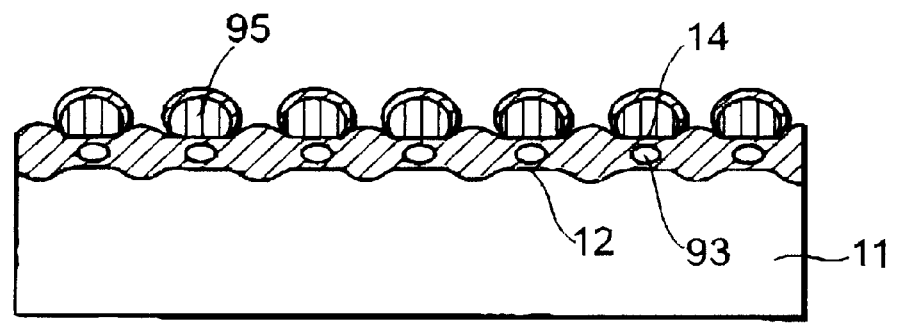
Figure 13:
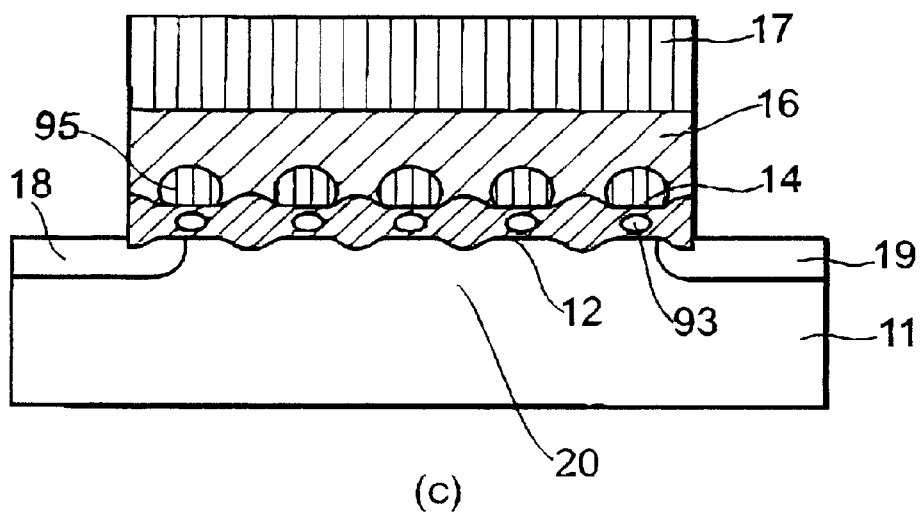

Subsequently, p-type Ge particles 95 having diameters of about 15 nm are formed on the second tunnel insulator layer 14 by CVD while doping them with boron (FIG. 13A).

Subsequently, the resultant substrate is oxidized in a dry oxidizing atmosphere at a temperature of 700° C. Herein, the time period of the oxidation is adjusted so as to oxidize the amorphous silicon film 99 substantially entirely. Thus, parts directly under the p-type Ge particles 95 are not entirely oxidized, and microcrystals 93 of silicon are formed. The microcrystals 93 become conductive particles satisfying a Coulomb blockade condition (FIG. 13B). In this manner, the charge stored particles 95 made of germanium can be formed over the conductive particles 93 made of silicon, in self-alignment fashion. In the oxidation on this occasion, the oxidation rate of the germanium particles 95 is lower than an ordinary oxidation rate on account of stresses which arise in the surfaces of these particles 95.

Subsequently, a control insulator layer 16 made of silicon oxide and which is 10 nm thick is formed by LPCVD. Further, a control electrode (control gate) 17 made of $n^+$-type polycrystal silicon and which is 200 nm thick is formed by CVD. Still further, a stacked structure portion comprising the first tunnel insulator layer 12, conductive particle layer including the conductive particles 93, second tunnel insulator layer 14, charge stored particles 95, control insulator layer 16, and control electrode 17 is etched using a resist pattern as a mask.

Subsequently, phosphorus ions are implanted into the resultant substrate at a dose of $1\times10^{15}$ cm$^{-2}$ under an acceleration voltage of 15 keV, and the resultant structure is subjected to fast annealing at 1000° C. for 10 seconds, thereby to form a source region 18 and a drain region 19 which are made of $n^+$-type silicon. Lastly, the steps of forming an inter-layer insulator layer and metal wiring lines are performed. Then, the nonvolatile semiconductor storage element is finished up (FIG. 13C).

The p-type Ge particles 95 employed as the charge stored layer of the semiconductor storage element thus formed are lower in energy than the conduction band edge of a channel region 20 (silicon) being an electron source or the Fermi level of the control electrode 17 ($N^+$ silicon) as viewed from a vacuum level. Since information electrons are injected into the charge stored particles 95, the storage time of the storage element can be made long. Besides, in case of utilizing holes as charges, the particles 95 are higher in energy than the valence band edge of the channel region 20 being a charge source or the Fermi level of the control electrode 17 ($P^+$ silicon) as viewed from the vacuum level, so that a similar effect can be expected. Although the Ge particles are employed for the charge stored layer 95, another material may well be employed as long as the above condition is satisfied.

Besides, in this embodiment, the plurality of stacked structures each of comprising the charge stored particle 95 made of Ge and the conductive particle 93 made of Si are existent at random positions. It is also allowed, however, to employ one stacked structure comprising the charge stored particle 95 and the conductive particle 93. Also, a plurality of stacked structures each of comprising the charge stored particle 95 and the conductive particle 93 may well be arrayed at regular positions.

According to this embodiment, the charge stored layer is formed of the charge stored particles, and each charge stored particle and the corresponding conductive particle overlap each other in self-alignment fashion, so that the storage time becomes longer.

(Embodiment 9)

Next, a method of manufacturing a nonvolatile semiconductor storage element according to Embodiment 9 will be described with reference to FIGS. 14A, 14B and 14C. Here, charge stored particles are formed of gold particles.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film 109 (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a silicon oxide layer (2 nm thick) is deposited on the amorphous silicon film 109 so as to form a second tunnel insulator layer (tunneling film) 14. Owing to the dry oxidation, the amorphous silicon film 109 becomes 5 nm thick.

Figure 14:
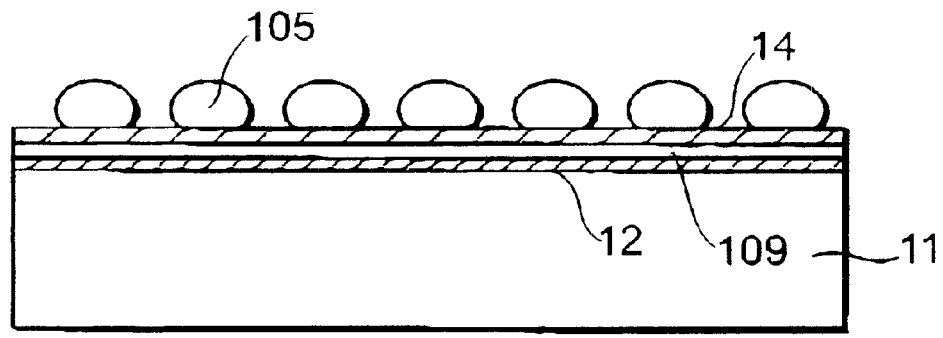
FIGS. 14A–14C are sectional views at individual steps for explaining a manufacturing process for a nonvolatile semiconductor storage element according to Embodiment 9 of the present invention.
Figure 14:
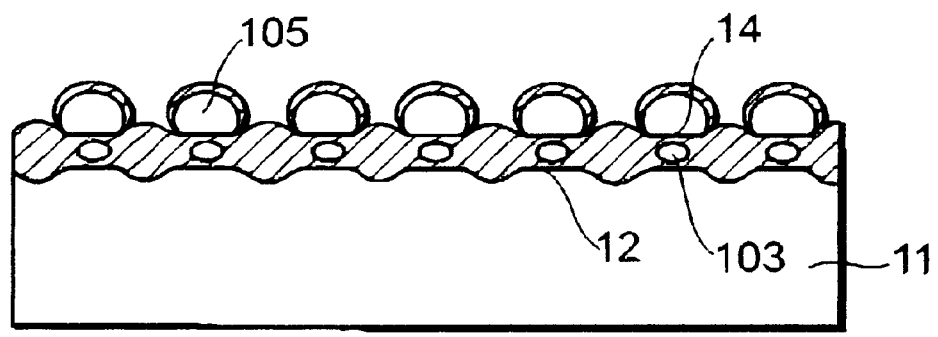
Figure 14:
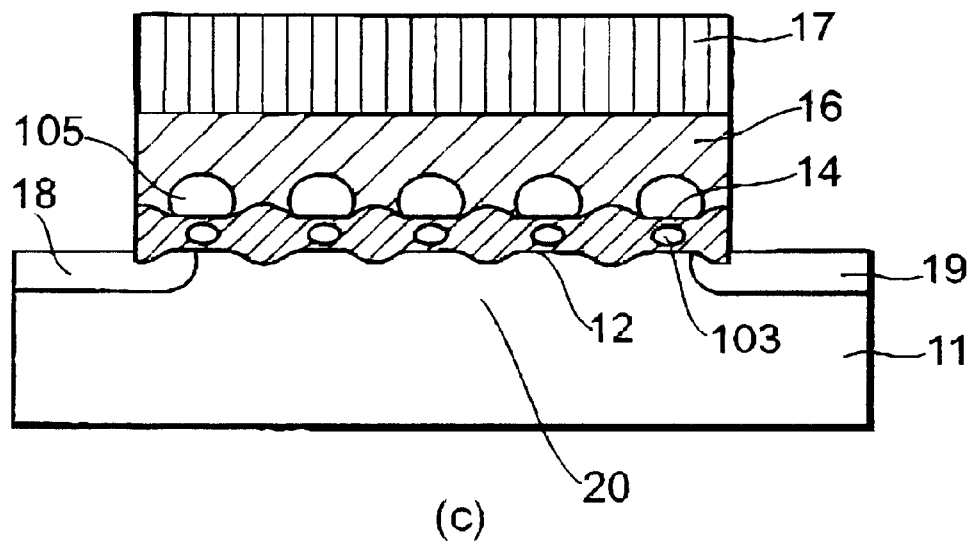

Subsequently, gold (Au) particles 105 having diameters of about 15 nm are formed on the second tunnel insulator layer 14 by sputtering (FIG. 14A).

Subsequently, the resultant substrate is oxidized in a dry oxidizing atmosphere at a temperature of 700° C. Herein, the time period of the oxidation is adjusted so as to oxidize the amorphous silicon film 109 substantially entirely. On this occasion, parts directly under the gold particles 105 are not entirely oxidized, and microcrystals 103 of silicon are formed. The microcrystals 103 become conductive particles satisfying a Coulomb blockade condition (FIG. 14B). In this manner, the charge stored particles 105 made of gold can be formed over the conductive particles 103 made of silicon, in self-alignment fashion. The material of the charges to red particles 105 should desirably be a metal, such as gold, which is difficult of oxidation.

Subsequently, a control insulator layer 16 made of silicon oxide and which is 10 nm thick is formed by LPCVD. Further, a control electrode (control gate) 17 made of $n^+$-type polycrystal silicon and which is 200 nm thick is formed by CVD. Still further, a stacked structure portion comprising the first tunnel insulator layer 12, layer including the conductive particles 103, second tunnel insulator layer 14, layer including the charge stored particles 105, control insulator layer 16, and control electrode 17 is etched using a resist pattern as a mask.

Subsequently, phosphorus ions are implanted into the resultant substrate at a dose of $1\times10^{15}$ cm$^{-2}$ under an acceleration voltage of 15 keV, and the resultant structure is subjected to fast annealing at 1000° C. for 10 seconds, thereby to form a source region 18 and a drain region 19 which are made of $n^+$-type silicon. Lastly, the steps of forming an inter-layer insulator layer and metal wiring lines are performed. Then, the nonvolatile semiconductor storage element is finished up (FIG. 14C).

The semiconductor storage element thus formed employs the gold particles as the charge stored particles 105. The particles 105 are lower in energy than the conduction band edge of a channel region 20 (silicon) being an electron source or the Fermi level of the control electrode 17 ($N^+$ silicon) as viewed from a vacuum level. Therefore, the storage time of the storage element can be made long. Besides, in case of utilizing holes as charges, the particles 105 are higher in energy than the valence band edge of the channel region 20 being a charge source or the Fermi level of the control electrode 17 (P⁺ silicon) as viewed from the vacuum level, so that a similar effect can be expected. Although gold is employed as the material of the charge stored particles 105, another material may well be employed as long as the above condition is satisfied. Besides, a metal, such as gold, difficult of oxidation is desirable.

Figure 15:
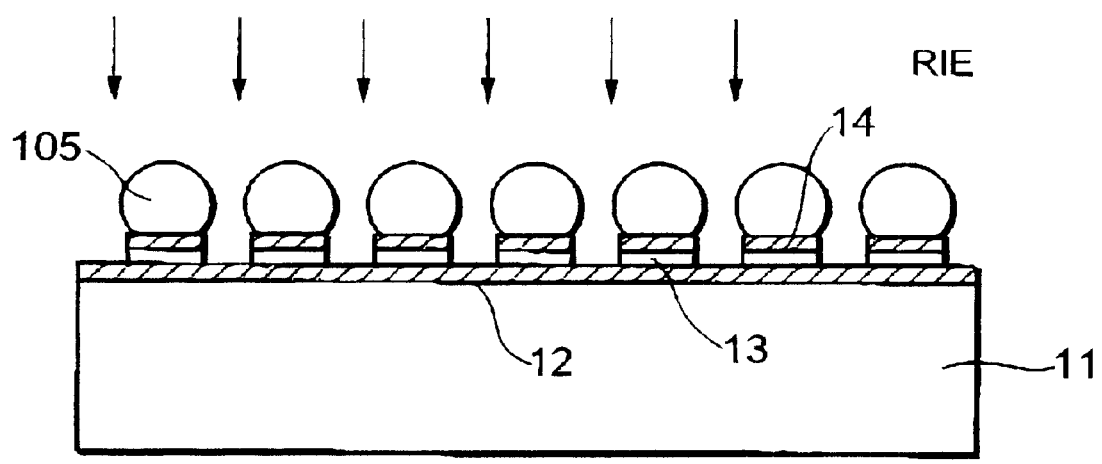
FIG. 15 is a sectional view for explaining a manufacturing process for a nonvolatile semiconductor storage element according to a modification to Embodiment 9 of the present invention.

Even in case of metal particles easy of oxidation, however, no problem is posed by employing a method in which, as shown in FIG. 15, selective RIE (Reactive Ion Etching) is utilized for etching the second tunnel insulator layer 14 and the amorphous silicon layer 13 so as to leave the parts of them directly under the metal particles 105. Such a method is similarly applicable to any other embodiment in which the charge stored particles and the conductive particles overlap each other in self-alignment fashion.

Besides, in this embodiment, the plurality of stacked structures each of comprising the charge stored particle 105 made of Au and the conductive particle 103 made of Si are existent at random positions. It is also allowed, however, to employ one stacked structure comprising the charge stored particle 105 and the conductive particle 103. Also, a plurality of stacked structures each of comprising the charge stored particle 105 and the conductive particle 103 may well be arrayed at regular positions.

According to this embodiment, the charge stored layer is formed of the charge stored particles, and each charge stored particle and the corresponding conductive particle overlap each other in self-alignment fashion, so that the storage time can be made longer.

(Embodiment 10)

Next, a method of manufacturing a nonvolatile semiconductor storage element according to Embodiment 10 will be described with reference to FIGS. 16A, 16B and 16C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, a first tunnel insulator layer (tunneling film) 12 made of silicon oxide is formed on the silicon substrate 11.

Subsequently, an amorphous silicon film 119 (6 nm thick) is deposited on the first tunnel insulator layer 12 by, for example, CVD (Chemical Vapor Deposition). Thereafter, the resultant substrate is subjected to dry oxidation at 700° C. for 5 minutes, whereby a silicon oxide layer (2 nm thick) is deposited on the amorphous silicon film 119 so as to form a second tunnel insulator layer (tunneling film) 14. Owing to the dry oxidation, the amorphous silicon film 119 becomes 5 nm thick.

Figure 16:
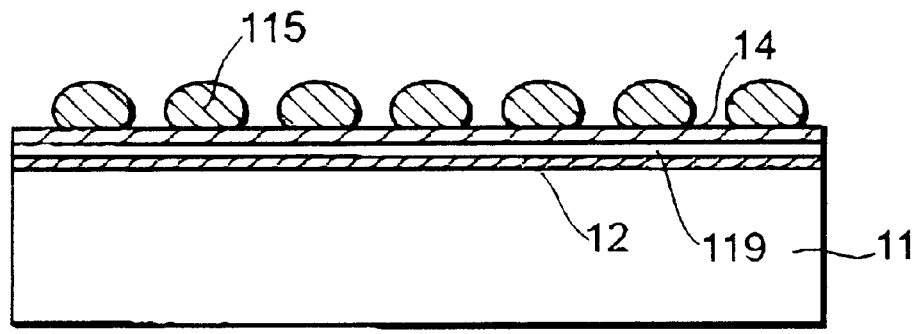
FIGS. 16A–16C are sectional views at individual steps for explaining a manufacturing process for a nonvolatile semiconductor storage element according to Embodiment 10 of the present invention.
Figure 16:
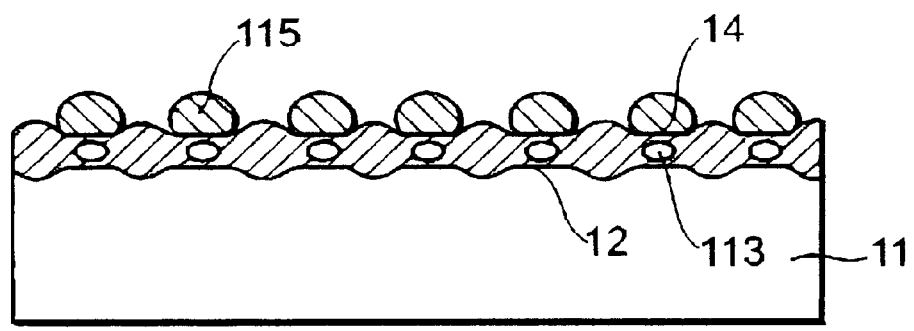
Figure 16:
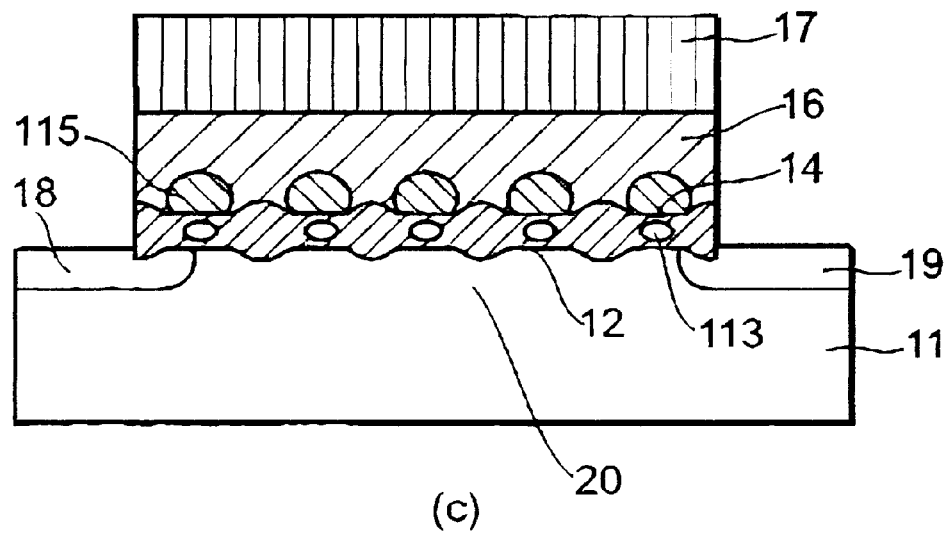

Subsequently, silicon nitride particles (charge stored particles) 115 having diameters of about 10 nm are formed on the second tunnel insulator layer 14 by LPCVD (FIG. 16A).

Subsequently, the resultant substrate is oxidized in a dry oxidizing atmosphere at a temperature of 700° C. Herein, the time period of the oxidation is adjusted so as to oxidize the amorphous silicon film 119 substantially entirely. Thus, parts directly under the silicon nitride particles 115 are not oxidized, and microcrystals 113 of silicon are formed. The microcrystals 113 become conductive particles satisfying a Coulomb blockade condition (FIG. 16B). In this manner, the charge stored particles 115 made of silicon nitride can be formed over the conductive particles 113 made of silicon, in self-alignment fashion. The silicon nitride particles 115 are not oxidized in the dry oxidizing atmosphere on this occasion.

Subsequently, a control insulator layer 16 made of silicon oxide and which is 10 nm thick is formed by LPCVD. Further, a control electrode (control gate) 17 made of n⁺-type polycrystal silicon and which is 200 nm thick is formed by CVD. Still further, a stacked structure portion comprising the first tunnel insulator layer 12, layer including the conductive particles 113, second tunnel insulator layer 14, layer including the charge stored particles 115, control insulator layer 16, and control electrode 17 is etched using a resist pattern as a mask.

Subsequently, phosphorus ions are implanted into the resultant substrate at a dose of $1 \times 10^{15}$ cm$^{-2}$ under an acceleration voltage of 15 keV, and the resultant structure is subjected to fast annealing at 1000° C. for 10 seconds, thereby to forma source region 18 and a drain region 19 which are made of n⁺-type silicon. Lastly, the steps of forming an inter-layer insulator layer and metal wiring lines are performed. Then, the nonvolatile semiconductor storage element is finished up (FIG. 16C).

In the semiconductor storage element thus formed, defects appear at the surrounding interface of or in the interior of the charge stored layer 115 made of silicon nitride. The defects are lower in energy than the conduction band edge of a channel region 20 (silicon) being an electron source or the Fermi level of the control electrode 17 (N⁺ silicon) as viewed from a vacuum level. Therefore, the storage time of the storage element can be made long. Besides, in case of utilizing holes as charges, the defects are higher in energy than the valence band edge of the channel region 20 being a charge source or the Fermi level of the control electrode 17 (P⁺ silicon) as viewed from the vacuum level. Therefore, a similar effect can be expected.

Besides, in this embodiment, the plurality of stacked structures each of comprising the charge stored particle 115 made of silicon nitride and the conductive particle 113 made of silicon are existent at random positions. It is also allowed, however, to employ one stacked structure comprising the charge stored particle 115 and the conductive particle 113. Also, a plurality of stacked structures each of comprising the charge stored particle 115 and the conductive particle 113 may well be arrayed at regular positions.

According to this embodiment, the charge stored layer is formed of the charge stored particles, and each charge stored particle and the corresponding conductive particle overlap each other in self-alignment fashion, so that the storage time can be made longer.

Embodiments 1 through 10 have been described by employing silicon as the semiconductor materials of the control electrode and the channel region, but any other semiconductor material may well be employed as long as it satisfies the specified condition in relation to the material of the charge stored layer.

Besides, Embodiments 1 through 10 have been described by employing silicon oxide as the material of each of the tunnel insulator layers, but a similar effect can be expected even with another insulator.

Also, Embodiments 1 through 10 have been described by employing silicon as the material of the conductive particles which satisfy the Coulomb blockade condition and which are held between the first tunnel insulator layer and the second tunnel insulator layer, but a similar effect can be attained even with another conductive material. A crystal mixed with carbon ($Si_{1-x}C_x$), for example, is mentioned as the other conductive material.

Figure 17:
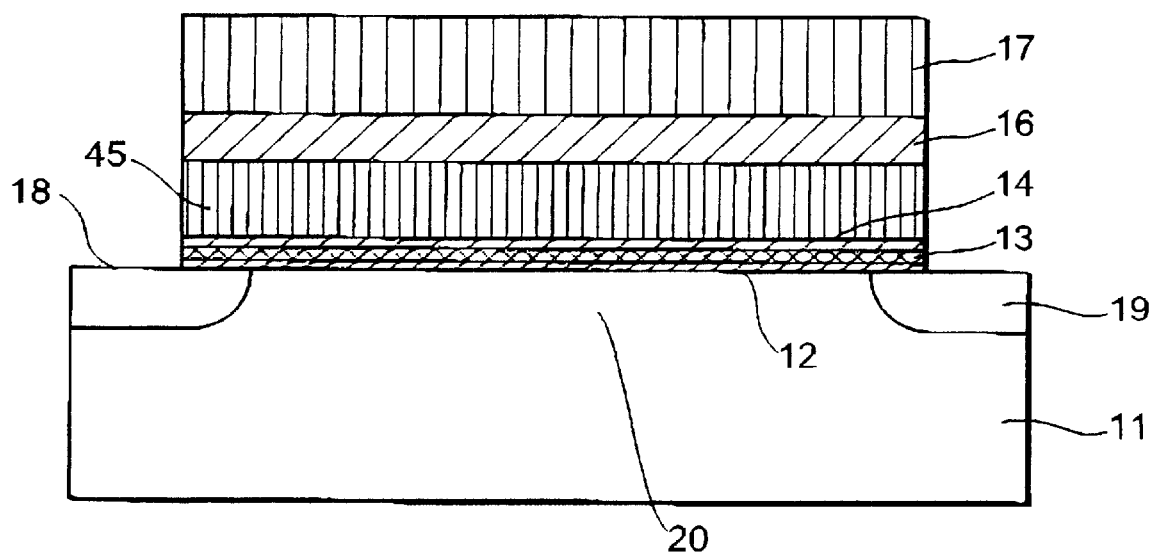
FIG. 17 is a sectional view of a nonvolatile semiconductor storage element according to a modified embodiment of the present invention.

FIG. 17 shows a modified embodiment which adopts the mixed crystal $Si_{1-x}C_x$ as the conductive particles 13. The other parts are the same as in FIG. 7C. The modified embodiment can be fabricated in the same way as in FIGS. 7A–7C by introducing carbon through doping or ion implantation.

Besides, in Embodiments 1 through 10, the first tunnel insulator layer 12 and the second tunnel insulator layer 14 have the equal thicknesses. It is also allowed, however, to construct an asymmetric structure in which the first tunnel insulator layer 12 is thicker than the second tunnel insulator layer 14.

Figure 18:
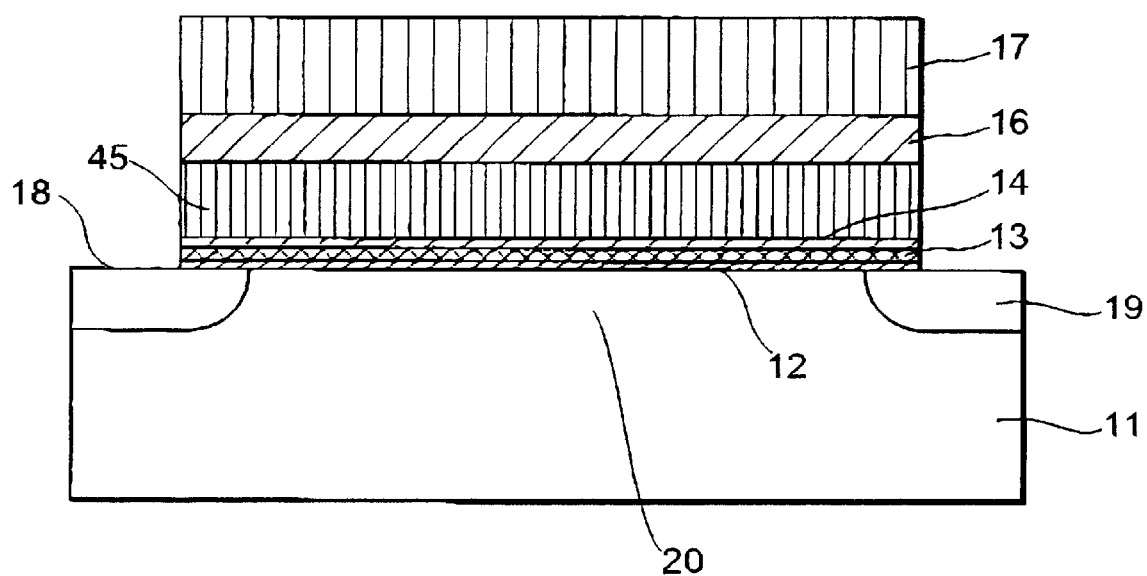
FIG. 18 is a sectional view of a nonvolatile semiconductor storage element according to another modified embodiment of the present invention.

FIG. 18 shows a modified embodiment adopting the structure in which the first tunnel insulator layer 12 is thicker than the second tunnel insulator layer 14. The other parts are the same as in FIG. 7C. The modified embodiment can be fabricated in the same way as in FIGS. 7A–7C by adjusting the thicknesses of the respective oxide films.

Besides, Embodiments 1 through 10 have been described concerning the double tunnel junction structure of the "first tunnel insulator layer/conductive particles/second tunnel insulator layer", but a multiple tunnel junction structure may well be adopted.

Figure 19:
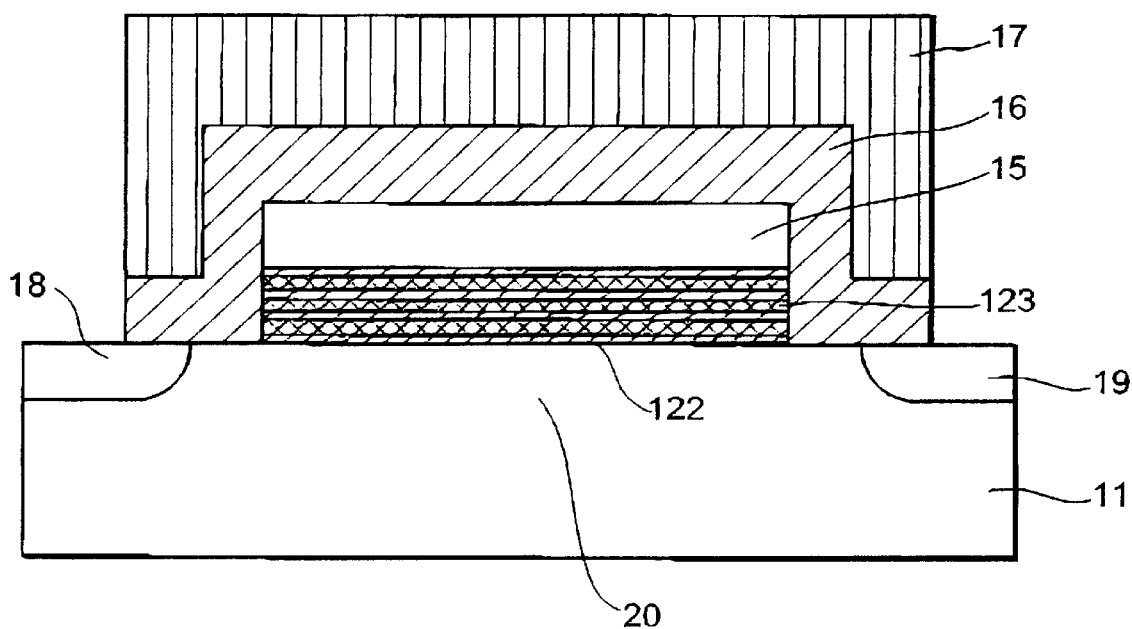
FIG. 19 is a sectional view of a nonvolatile semiconductor storage element according to still another modified embodiment of the present invention.

FIG. 19 shows a modified embodiment which adopts a quadruple tunnel junction structure.

As shown in FIG. 19, four tunnel insulator layers 122 are interposed between the channel region 20 and the charge stored layer 15. Conductive particles layers 123 each satisfying the Coulomb blockade condition are formed between the respectively adjacent tunnel insulator layers 122. The remaining structure is the same as in the nonvolatile storage element shown in FIG. 2.

It will now be elucidated in detail that the nonvolatile storage element described in each of Embodiments 1 through 10 is excellent in a storage characteristic.

First, according to the present invention, in a case where charges are electrons, a charge stored layer lies at a position which is lower in energy than the conduction band edge of a channel region serving as a charge source or the Fermi level of a control electrode, as viewed from a vacuum level. On the other hand, in a case where charges are holes, a charge stored layer lies at a position which is higher in energy than the valence band edge of a channel region or a control electrode serving as a charge source, as viewed from the vacuum level.

Further, the charge stored layer should desirably be charged/discharged via a double tunnel junction in which conductive particles satisfying a Coulomb blockade condition are held. Here, the satisfaction of the Coulomb blockade condition signifies that electrostatic energy in the case of charging one electron (Coulomb blockade energy which is given by $q/2C_{dot}$ where q denotes an elementary charge, and $C_{dot}$ denotes the capacitance of the conductive particle) is greater than a thermal fluctuation.

By way of example, in a case where the conductive particle is a silicon nanometer microcrystal having a diameter of about 5 nm, the capacitance $C_{dot}$ is approximately 1 aF, and hence, the Coulomb blockade energy $\Delta E = q/2C_{dot} = 80$ meV holds and is greater than a thermal energy of 25 meV at a room temperature. Therefore, the conductive particle satisfies the Coulomb blockade condition.

The storage time of the storage element can be made long by satisfying such a condition. It forms a key to the enhancement of the storage time that the leakage of information charges is efficiently suppressed in a state of low gate voltage.

The storage time cannot be made sufficient yet by a prior-art technique wherein the charge stored layer is merely charged/discharged via the double tunnel junction in which the conductive particles satisfying the Coulomb blockade condition are held.

Figure 20:
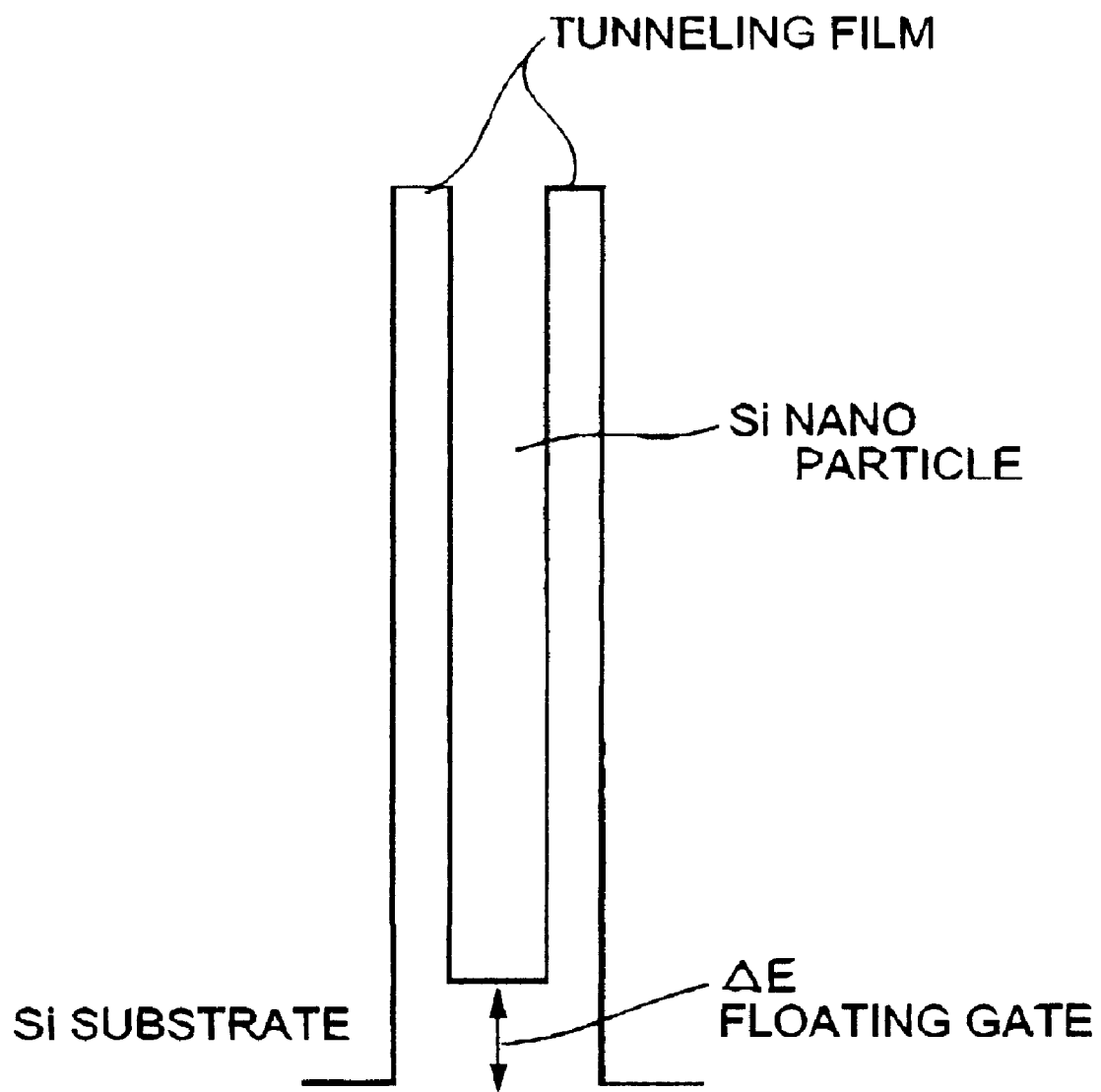
FIG. 20 is a diagram showing the energy level structure of the "silicon substrate/tunnel insulator layer/conductive particle/charge stored layer" of a nonvolatile semiconductor storage element in the prior art.

The reason therefor is as stated below. As shown in FIG. 20, a silicon substrate and the charge stored layer (floating gate) are made of the same material, and their conduction band edges lie at the same level in a state where no voltage is applied, so that an energy barrier in the silicon nanometer particle is composed only of the Coulomb blockade energy $\Delta E$. Accordingly, the electron stored in the charge stored layer is easy of jumping over the energy $\Delta E$ and tunneling out into the silicon substrate.

Figure 21:
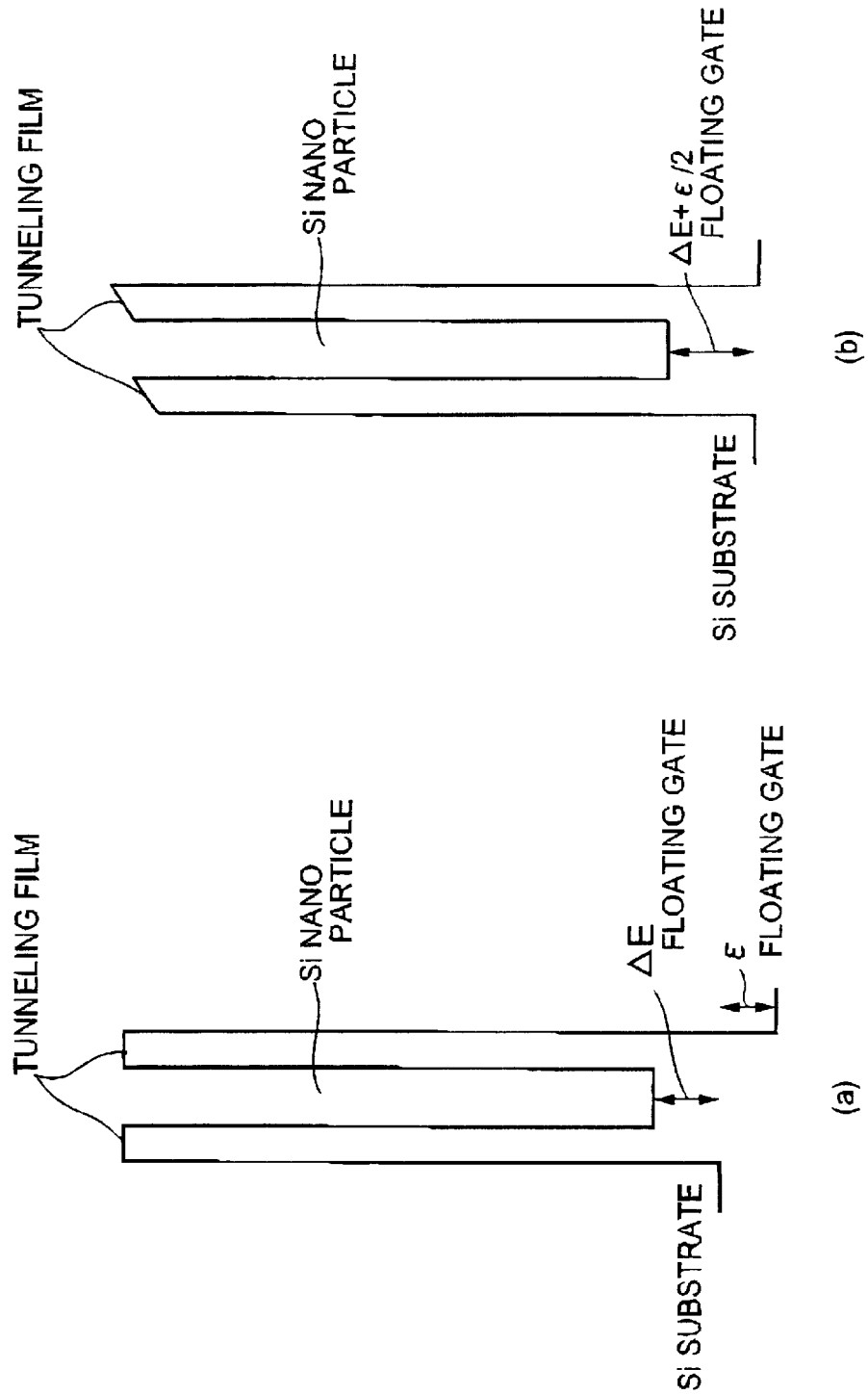

In contrast, when the conduction band edge (energy level at which the information charge is injected) of the charge stored layer (floating gate) is brought to a position lower than that of the silicon substrate as shown in FIG. 21A, the energy barrier in the silicon particle becomes a sum value in which the energy difference $\epsilon$ between the conduction edges of the charge stored layer and the silicon substrate is added to the Coulomb blockade energy $\Delta E$. Therefore, the electron stored in the charge stored layer is difficult of jumping over the barrier, and the storage time is, in effect, lengthened.

In this regard, in case of utilizing holes as charges, a similar effect is attained by making the valence band edge (Energy level at which the information charge is injected) of the charge stored layer (floating gate) higher than that of the silicon substrate.

Besides, the energy barrier of a medium silicon particle rises to $\Delta E + \epsilon/2$ when the conduction band edge of the charge stored layer is lowered $\epsilon$. This is clarified by comparing a state (FIG. 21B) where the potentials of the silicon substrate and the charge stored layer are in balance in the present invention, with a state (FIG. 20) where the potentials are in balance in the related art. Regarding the same medium silicon particle, accordingly, the present invention is more advantageous for enhancing the storage time with fast writing maintained.

Meanwhile, in a case where the charge stored layer is formed of defects due to dangling bonds, the defects must exist in a certain number for the purpose of attaining a sufficient memory effect. A memory effect develops in such a way that the carriers of a channel region are expelled by the Coulomb forces of information charges, so a drain current is decreased. A Coulomb screening distance in silicon is 15 nm typically. Therefore, unless the average distance between the respectively adjacent defects is less than 30 nm, a spacing where the Coulomb forces of the information charges exert no influence appears on the channel, and the sufficient memory effect is not attained. After all, if the area or surface density of the defects is at least $(30 \text{ nm})^2 = 1 \times 10^{11}$ cm$^{-2}$, the information charges can influence the whole channel, and hence, the sufficient memory effect can be expected.

Further, with a structure in which conductive particles and charge stored particles are stacked in self-alignment fashion, the conductive particles (here, silicon particles) are entirely surrounded with the high energy walls of an oxide film, and electrons (or holes) are confined in narrower spaces. Therefore, energy barriers in the conductive particles become higher to lengthen storage more.

Moreover, since the diameters of the conductive particles are easily adjusted by process conditions, the control of element characteristics is facilitated.

On this occasion, a mixed crystal $Si_{1-x}C_x$ containing carbon the electron affinity of which is smaller than that of silicon is employed as the material of the conductive particles, the energy barriers heighten owing to the difference of the electron affinities. Therefore, the element characteristics can be controlled, not only by the adjustment of the diameters of the nanometer particles, but also by the adjustment of a carbon concentration x, and a storage element can be designed at a higher versatility.

Besides, since the thickness of each tunnel insulator layer is at most 2 nm, writing and erasing information can be performed directly by tunneling, and hence, they can be performed at high speeds.

In a case where particles or traps are employed for an information charge stored layer, injection occurs only at the moment at which a carrier lies just under the minute floating gate. Originally, therefore, the injection is difficult to occur, and emission is more liable to occur. This forms one cause for worsening storage.

On this occasion, when the tunneling films (tunnel insulator layers) as a double tunneling film structure are made thicker on a charge supply side (channel side) than on a charge stored layer side, the emission is relatively suppressed as elucidated below, and hence, the storage can be bettered.

Figure 22:
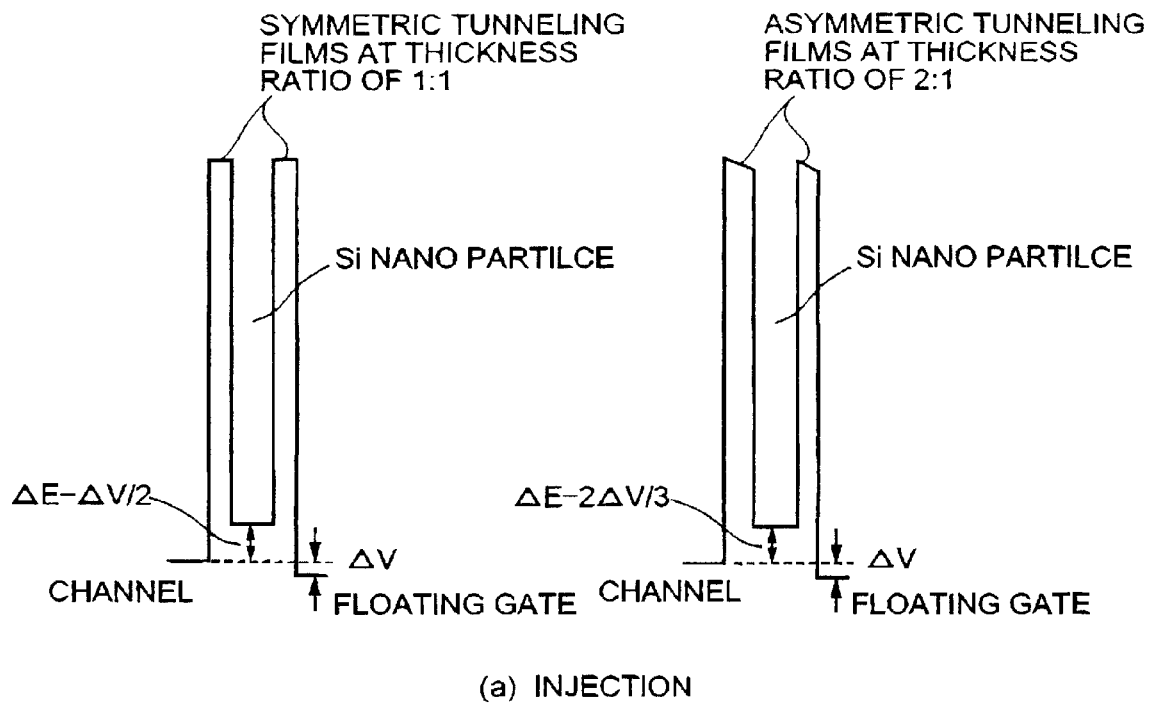
Figure 22:
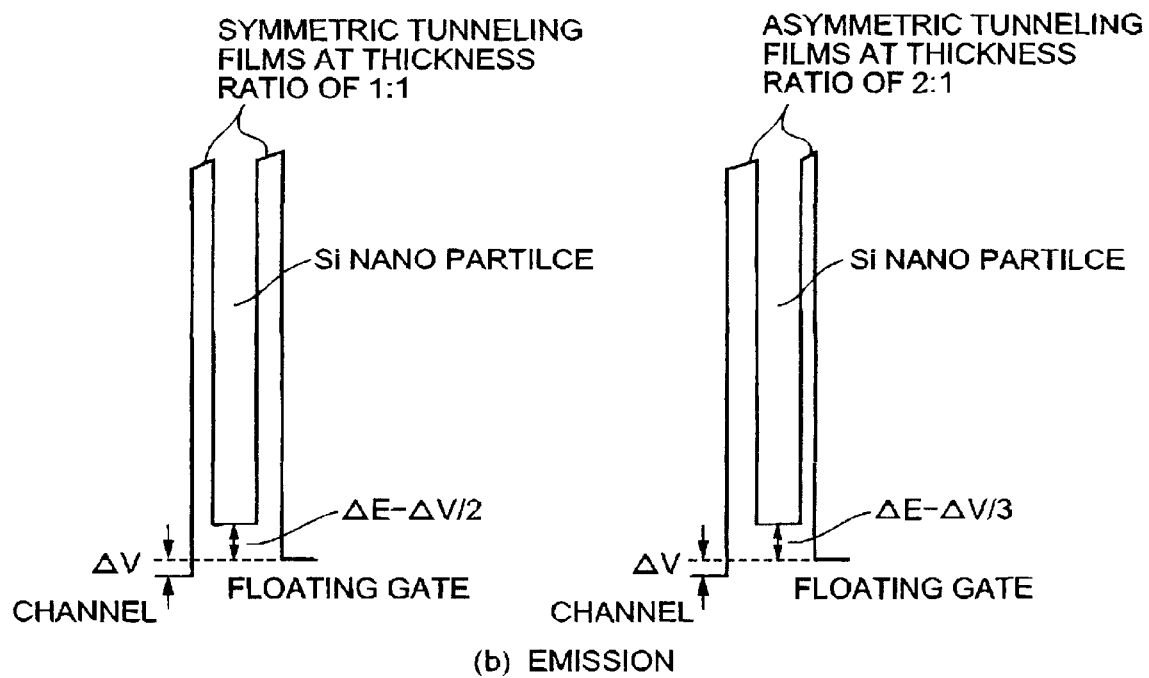

As shown in FIGS. 22A and 22B, regarding the same potential variation $\Delta V$, when the tunneling films are symmetric in thickness, energy differences are $\Delta E - \Delta V/2$ in both an injection mode (FIG. 22A) and an emission mode (FIG. 22B). In contrast, when the tunneling films are asymmetric in thickness, the energy difference in the injection mode in FIG. 22A becomes $\Delta E - 2\Delta V/3$, and the energy difference in the emission mode in FIG. 22B becomes $\Delta E - \Delta V/3$, so that the energy difference is greater in the case where the charge is emitted, than in the case where it is injected. For this reason, the emission of the information charge can be relatively suppressed, and the storage can be bettered.

In case of establishing the asymmetry in thickness under the condition that the sum of the resistances of both the tunneling films is held equal, the storage can be bettered without affecting a writing/erasing speed. Of course, the same effect is produced even when the effective thicknesses of the tunneling films are adjusted using materials of different dielectric constants to produce the asymmetry.

Besides, an energy gap for the corresponding charge exists between the energy level of the information charge stored layer and the conduction band edge or valence band edge of the channel region. Therefore, even after a supply voltage is cut off, the charge can be stably stored in the stored particle, and a storage characteristic is enhanced.

(Embodiment 11)

Figure 23:
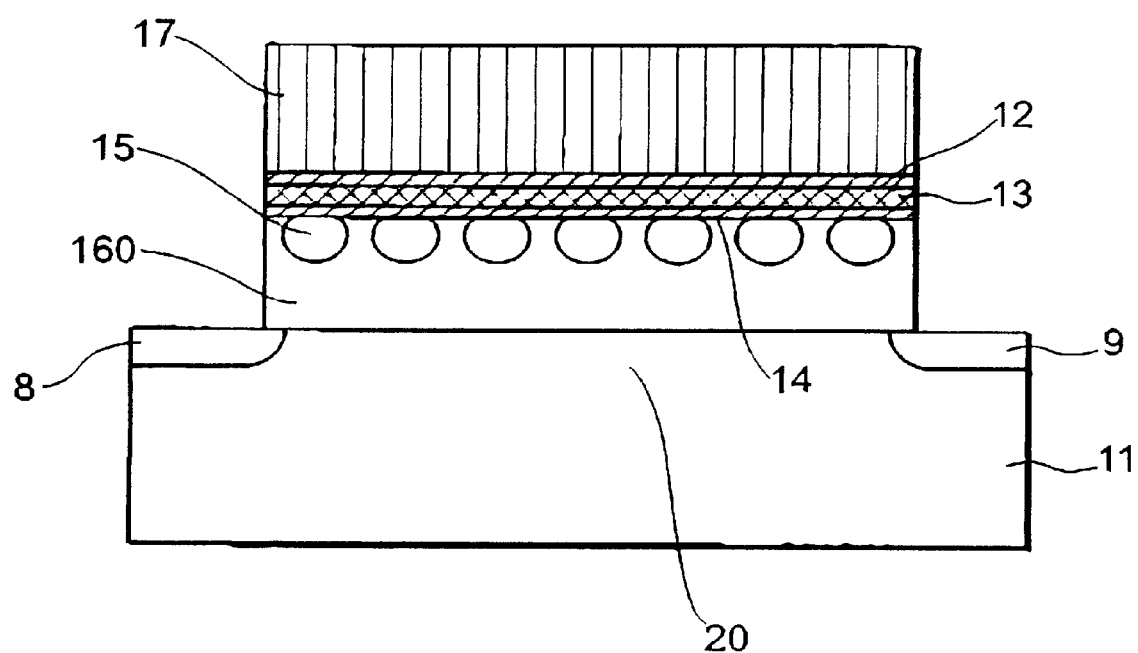
FIG. 23 is a sectional view of a nonvolatile semiconductor storage element according to Embodiment 11 of the present invention.

FIG. 23 is a sectional view of a semiconductor storage element according to Embodiment 11. The semiconductor storage element is such that a channel region 20 formed in the front surface of a silicon substrate 11 is overlaid with a stacked structure comprising an insulator layer 160, charge stored particles 15 made of a microcrystal semiconductor and serving as a floating gate, a second tunnel insulator layer (tunneling film) 14, a conductive particle layer 13, a first tunnel insulator layer (tunneling film) 12, and a control electrode (control gate) 17. A source region 8 and a drain region 9 are formed so as to hold the channel region 20 therebetween.

In the semiconductor storage element, information charges are injected from the control electrode 17 into the charge stored particles 15 by tunneling through the first tunnel insulator layer 12, conductive particle layer 13 and second tunnel insulator layer 14.

In case of utilizing electrons as the information charges, $p^+$-type germanium is mentioned as the material of the charge stored layer 15. Also, silicon oxide or silicon nitride is mentioned as the material of the control oxide film 16. Also, $n^+$-type polycrystal silicon is mentioned as the material of the control electrode 17.

In such a storage element, the charge stored layer 15 is formed of p-type germanium, and the control electrode 17 is formed of $n^+$-type polycrystal silicon. As viewed from a vacuum level, accordingly, the energy level of the valence band edge of the charge stored layer 15 (p-type germanium) is lower than that of the Fermi level of the control region 17 ($n^+$-type polycrystal silicon). Owing to such a construction, electrons stored in the charge stored particles 15 are difficult to tunnel out into the control electrode 17, so that the storage time of the element becomes remarkably long.

Incidentally, although the $p^+$-type germanium is adopted for the charge stored particles 15 in this embodiment, particles of low p-type dopant concentration may well be employed. Apart from the germanium, any semiconductor such as n-type GaAs may well be employed as long as electrons are injected into its position which is lower in energy than the conduction band edge of the channel region 20 being an electron source, as viewed from the vacuum level.

A memory effect develops in such a way that a channel current is decreased by Coulomb screening due to the information charges in the charge stored particles. Accordingly, when the average interval of the charge stored particles 15 is greater than double a Coulomb screening length (approximately 15 nm), a part which does not undergo the Coulomb screening appears on the surface of the channel 20, and the memory effect cannot be sufficiently produced. Therefore, the charge stored particles 15 should desirably exist at or above an area or surface density of $1/(30 \text{ nm})^2$ (approximately $1 \times 10^{11}$ cm$^{-2}$). For this purpose, the diameters of the charge stored particles 15 should desirably be set at or below 30 nm. As the diameters of the charge stored particles 15 are smaller, the area density thereof can be increased more. Therefore, the diameters of the charge stored particles 15 should more preferably be on the order of 0.5 nm through 15 nm. They should still more preferably be 0.5 nm through 10 nm. For such reasons, the area density of the charge stored particles 15 should preferably be at least $1 \times 10^{11}$ cm$^{-2}$.

Besides, the plurality of charge stored particles 15 may be regularly arrayed, or even a single charge stored particle 15 may well be formed. Owing to the formation of the charge stored layer by the charge stored particles 15, the number of electrons to be stored is quantized by the Coulomb blockade effect of the charge stored particles 15, so that the application of the storage element to a multi-valued memory can also be expected. Further, it is more favorable for lengthening the storage time that the charge stored particles 15 and the conductive particles are formed so as to be stacked vertically or in the direction of the thicknesses of the films. Still further, a mixed crystal composed of silicon and carbon may well be employed as the material of the conductive particles, and the insulator film on a charge supply side (control gate side) may well be made thicker than that on a charge stored side (floating gate side).

(Embodiment 12)

Figure 24:
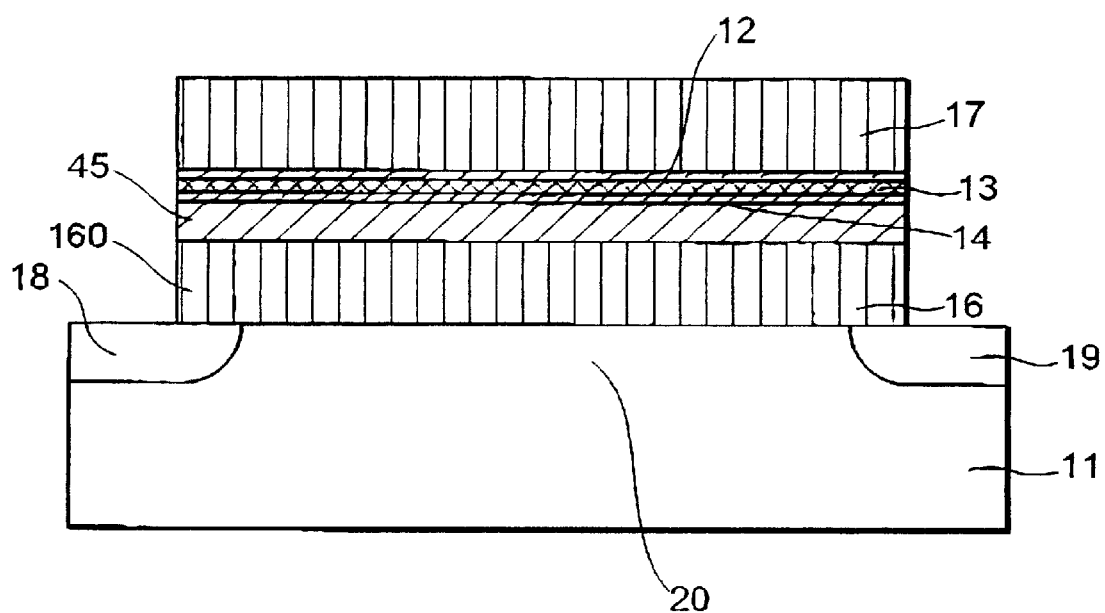
FIG. 24 is a sectional view of a nonvolatile semiconductor storage element according to Embodiment 12 of the present invention.

FIG. 24 is a sectional view of a semiconductor storage element according to Embodiment 12. The semiconductor storage element is such that a channel region 20 formed in the front surface of a silicon substrate 11 is overlaid with a stacked structure comprising an insulator layer 160, a charge stored layer (floating gate) 45 made of silicon nitride, a second tunnel insulator layer (tunneling film) 14, a conductive particle layer 13, a first tunnel insulator layer (tunneling film) 12, and a control electrode (control gate) 17. A source region 18 and a drain region 19 are formed so as to hold the channel region 20 therebetween.

In the semiconductor storage element, information charges are injected from the control electrode 17 into the charge stored layer 45 by tunneling through the first tunnel insulator layer 12, conductive particle layer 13 and second tunnel insulator layer 14.

The charge stored layer 45 made of silicon nitride possesses at its interface or in its interior an electron trap level which is lower in energy than the Fermi energy level of the control electrode 17 as viewed from a vacuum level (in case of utilizing holes as charges, a hole trap level which is higher than the Fermi energy level of the control electrode 17). Owing to such a construction, electrons stored in the charge stored layer 45 are difficult to tunnel out into the control electrode 17, so that the storage time of the element becomes remarkably long.

Besides, silicon oxide or silicon nitride is mentioned as the material of the insulator layer 160. Also, $n^+$-type polycrystal silicon is mentioned as the material of the control electrode 17.

A memory effect develops in such a way that a channel current is decreased by Coulomb screening due to the information charges in the charge stored layer.

(Embodiment 13)

Figure 25:
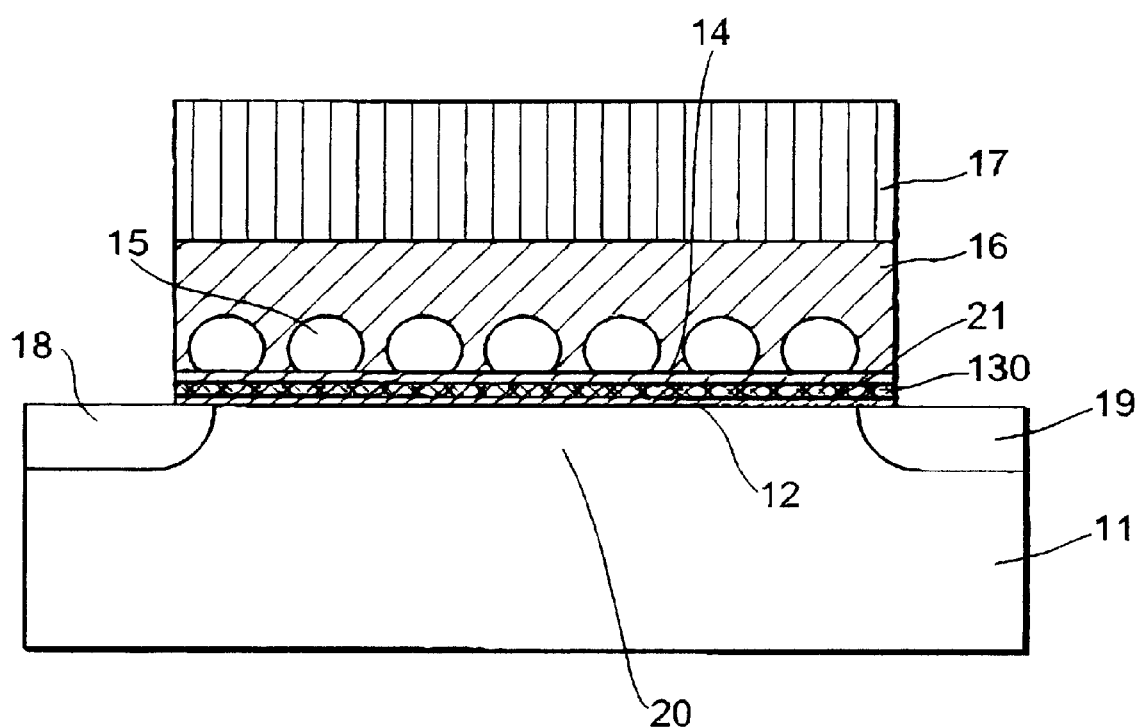
FIG. 25 is a sectional view of a nonvolatile semiconductor storage element according to Embodiment 13 of the present invention.

FIG. 25 is a sectional view of a nonvolatile semiconductor storage element according to Embodiment 13. The nonvolatile semiconductor storage element has a structure including a semiconductor layer 11 made of p-type silicon, a source region 18 and a drain region 19 which are made of $n^+$-type silicon and formed in the semiconductor layer 11, a channel region 20 formed between the source region 18 and the drain region 19, a first tunnel insulator layer (tunneling film) 12 (2 nm thick) formed on the channel region 20 and through which electrons can tunnel, an insulator layer 130 which contains the defects 21 of inter-atomic bonds for forming the trap levels of charges and formed on the first tunnel insulator layer 12, a second tunnel insulator layer (tunneling film) 14 (2 nm thick) formed on the insulator layer 130 and through which electrons can tunnel, conductive particles (charge stored particles) 15 (at diameters of 10 nm) which construct a charge stored layer (floating gate) formed on the second tunnel insulator layer 14, a control insulator layer 16 (10 nm thick) formed on the conductive particles (charge stored particles) 15, and a control electrode (control gate) 17 (500 nm thick) formed on the control insulator layer 16. Silicon oxide, silicon nitride, or the like is mentioned as the materials of the first tunnel insulator layer 12 and the second tunnel insulator layer 14. Further, each of these layers 12, 14 are formed at a thickness at which electrons can be tunneled quantum-mechanically.

Besides, silicon or the like is mentioned as the material of the conductive particles (charge stored particles) 15 which serve as the charge stored layer. Also, silicon oxide or silicon nitride is mentioned as the material of the control oxide film 16. Also, $n^+$-type polycrystal silicon is mentioned as the material of the control electrode 17.

According to such a semiconductor storage element, in the writing or erasing operation thereof, electrons can be injected or emitted by trap assisted tunneling in which the electrons are transferred directly through the thin insulator films (first and third insulator films) located in a tunneling region, and the trap levels of the defects 21 (dangling bonds) of the inter-atomic bonds also located in the tunneling region. Therefore, the writing or erasing speed of the storage element is sufficiently high.

Moreover, the trap level due to the dangling bond 21 lies at a position which is lower than the conduction band edge of silicon being the material of the channel region 20. Accordingly, when an electron is about to tunnel out from the conductive particle 15 into the channel region 20 in a storage mode (low gate voltage state), it needs to once drop to the trap level being in a low energy state and to thereafter migrate into the conduction band of the channel region 20 being in a higher energy state. The energy difference from the trap level to the channel region 20 acts as an energy barrier on the electron, and the migration of the electron becomes difficult in point of energy, so that leakage is suppressed to lengthen the storage time of the storage element.

Meanwhile, in case of utilizing holes as charges, the trap levels due to the defects 21 may be brought to a position which is higher than the valence band edge of silicon being the material of the channel region 20. When a hole is about to tunnel out from the conductive particle 15 into the channel region 20 in the storage mode (low gate voltage state), it needs to once migrate into the valence band of the channel region 20 being in a higher energy state. The energy difference from the trap level to the channel region 20 acts as an energy barrier on the hole, and the migration of the hole becomes difficult in point of energy, so that leakage is suppressed to lengthen the storage time. In the case of utilizing the holes as the charges, a semiconductor substrate may form a field effect transistor whose carriers are the holes.

Besides, according to this embodiment, the conductive particles (charge stored particles) 15 having the nanometer size are employed for the charge stored layer. Since the cross-sectional areas of the conductive particles (charge stored particles) 15 are very small, the charges exist just under these particles 15 at a low probability. Therefore, the rate of charging/discharging is governed under a low gate voltage, and further enhancement in the storage time can be expected also from this fact.

Next, a method of manufacturing the nonvolatile semiconductor storage element shown in FIG. 25 will be described with reference to FIGS. 26A, 26B and 26C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, an insulator layer 22 (2 nm thick) made of silicon oxide is formed on the silicon substrate 11.

Figure 26:
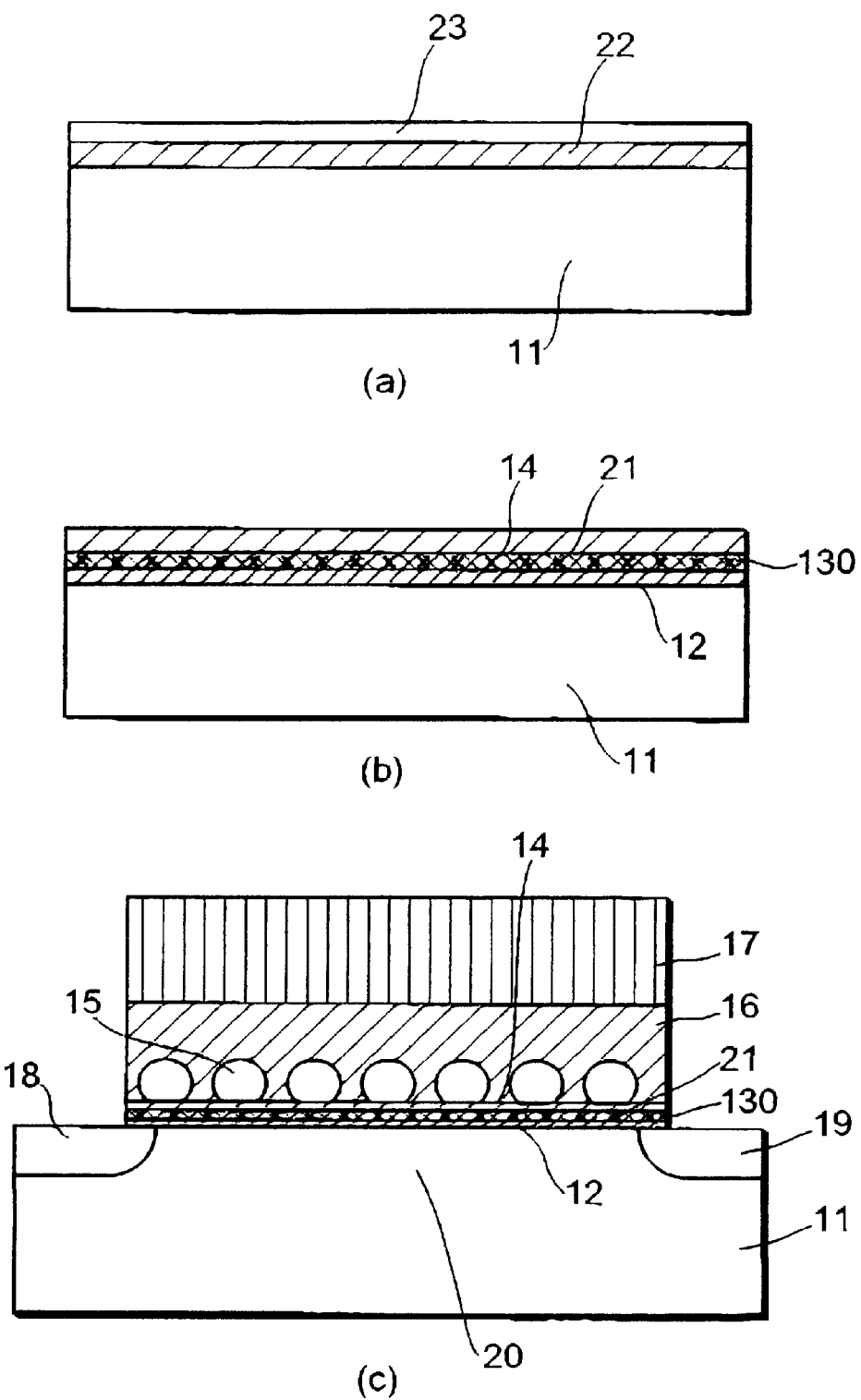
FIGS. 26A–26C are sectional views at individual steps for explaining a manufacturing process for a nonvolatile semiconductor storage element according to Embodiment 13 of the present invention.

Subsequently, an amorphous silicon film 23 (1 nm thick) is deposited on the insulator layer 22 by, for example, LPCVD (Low Pressure Chemical Vapor Deposition) (FIG. 26A).

Thereafter, the resultant substrate is subjected to dry oxidation at 700° C. for 10 minutes, whereby the amorphous silicon film 23 is entirely oxidized. Owing to the step of the dry oxidation, a large number of dangling bonds (defects of inter-atomic bonds) are formed at the interface between the original amorphous silicon 23 and the insulator film 22 because atoms flow very little during the oxidation at 700° C. A stacked structure comprising a first tunnel insulator layer (tunneling film) 12 (2 nm thick), an insulator layer 130 containing the dangling bonds 21, and a second tunnel insulator layer (tunneling film) 14 (2 nm thick) is formed on the silicon substrate 11 by the dry oxidation step (FIG. 26B).

Both the first tunnel insulator layer 12 and the second tunnel insulator layer 14 are controlled into a range of thicknesses (0.5 nm through 3.5 nm) at which charges such as electrons or holes can tunnel through the layers 12, 14. Besides, the area or surface density of the dangling bonds 21 can be adjusted by the condition of the oxidation.

Subsequently, conductive particles (charge stored particles) 15 which are silicon microcrystal particles having diameters of 10 nm are formed by LPCVD. Further, a control insulator layer 16 (10 nm thick) made of silicon oxide is formed by LPCVD. Still further, a control electrode (control gate) 17 (200 nm thick) made of n⁺ polysilicon is deposited on the control insulator layer 16 by CVD.

Subsequently, a stacked structure portion comprising the first tunnel insulator layer 12, insulator film 13, second tunnel insulator layer 14, control insulator layer 16, and control electrode 17 is etched using a resist pattern as a mask. Thereafter, phosphorus ions are implanted into the resultant substrate at a dose of $1 \times 10^{15}$ cm$^{-2}$ under an acceleration voltage of 15 keV, and the resultant structure is subjected to annealing at 1000° C. for 20 seconds, thereby to activate the phosphorus ions and to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 26C).

Although the silicon crystal particles of nanometer scale are employed as the conductive particles (charge stored particles) 15, another conductive material may well be employed. Besides, the diameters of the conductive particles (charge stored particles) 15 may be 0.5 nm through 30 nm, preferably 20 nm or below. Further, the plurality of conductive particles (charge stored particles) 15 may be regularly arrayed, or even a single conductive particle 15 may well be formed.

(Embodiment 14)

Next, a method of manufacturing a nonvolatile semiconductor storage element according to Embodiment 14 will be described with reference to FIGS. 27A, 27B and 27C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, an insulator layer (2 nm thick) made of silicon oxide is formed on the silicon substrate 11. Subsequently, an amorphous silicon film (1 nm thick) is deposited on the insulator layer by, for example, LPCVD (Low Pressure Chemical Vapor Deposition).

Subsequently, the resultant substrate is subjected to dry oxidation at 700° C. for 10 minutes, whereby the amorphous silicon film is entirely oxidized. Owing to the step of the dry oxidation, a large number of dangling bonds 21 (defects of inter-atomic bonds) are formed at the interface between the original amorphous silicon and the insulator film because atoms flow very little during the oxidation at 700° C. A stacked structure comprising a first tunnel insulator layer (tunneling film) 12 (2 nm thick), an insulator layer 130 containing the dangling bonds 21, and a second tunnel insulator layer(tunneling film) 14 (2 nm thick) is formed on the silicon substrate 11 by the dry oxidation step (FIG. 27A).

Both the first tunnel insulator layer 12 and the second tunnel insulator layer 14 are controlled into a range of thicknesses (0.5 nm through 3.5 nm) at which charges such as electrons or holes can tunnel through the layers 12, 14. Besides, the area or surface density of the dangling bonds 21 can be adjusted by the condition of the oxidation.

Figure 27:
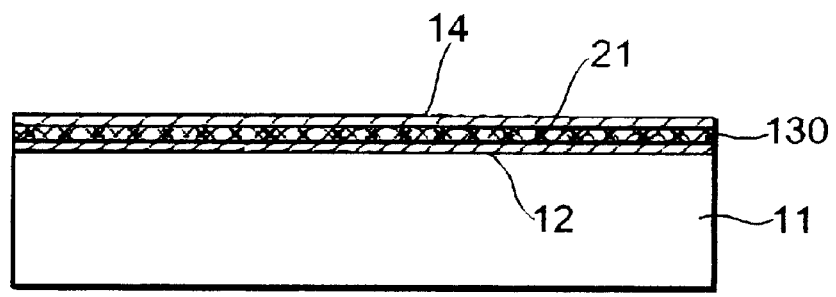
FIGS. 27A–27C are sectional views at individual steps for explaining a manufacturing process for a nonvolatile semiconductor storage element according to Embodiment 14 of the present invention.
Figure 27:
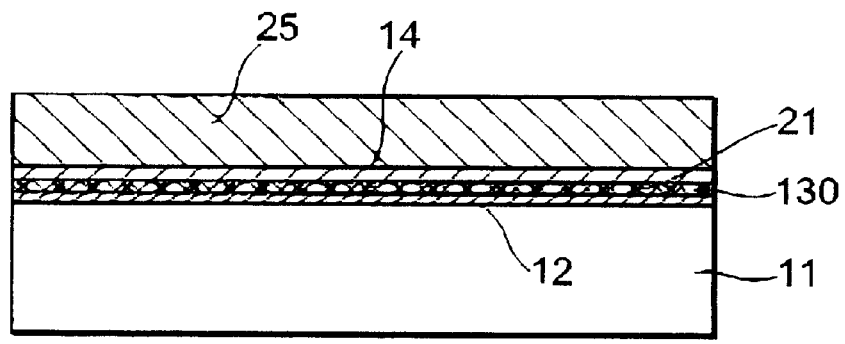
Figure 27:
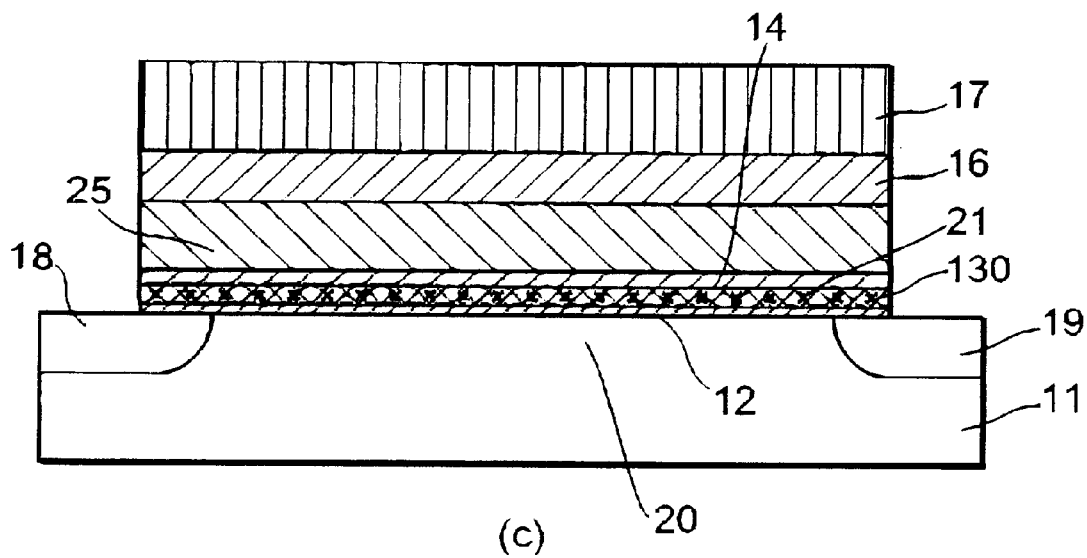

Subsequently, a charge stored layer (floating gate) 25 (20 nm thick) made of a silicon nitride film is formed on the second tunnel insulator film 14 by CVD (FIG. 27B). The silicon nitride film 25 possesses a large number of dangling bonds (defects of inter-atomic bonds) at its interface and in its interior. Trap levels for trapping charges such as electrons or holes are created by the dangling bonds, whereby the charges are permitted to be stored.

Subsequently, a control insulator film 16 (10 nm thick) made of silicon oxide is formed on the charge stored layer 25 by LPCVD. Further, a control electrode (control gate) 17 made of n⁺ polysilicon is deposited on the control insulator layer 16 by CVD.

Subsequently, a stacked structure portion comprising the first tunnel insulator layer 12, insulator film 13, second tunnel insulator layer 14, charge stored layer 25, control insulator layer 16, and control electrode 17 is etched using a resist pattern as a mask. Thereafter, phosphorus ions are implanted into the resultant substrate at a dose of $1 \times 10^{15}$ cm$^{-2}$ under an acceleration voltage of 15 keV, and the resultant structure is subjected to annealing at 1000° C. for 20 seconds, thereby to activate the phosphorus ions and to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 27C).

According to such a semiconductor storage element, in the writing or erasing operation thereof, electrons can be injected or emitted by trap assisted tunneling in which the electrons are transferred directly through the thin insulator layers (first and third insulator films) 12 and 14 located in a tunneling region, and the trap levels of the defects 21 (dangling bonds) of the inter-atomic bonds also located in the tunneling region. Therefore, the writing or erasing speed of the storage element is sufficiently high.

Moreover, the trap level based on the dangling bond 21 lies at a position which is lower than the conduction band edge of silicon being the material of a channel region 20. Accordingly, when an electron is about to tunnel out from the charge stored layer 25 into the channel region 20 in a storage mode (low gate voltage state), it needs to once drop to the trap level being in a low energy state and to thereafter migrate into the conduction band of the channel region 20 being in a higher energy state. The energy difference from the trap level to the channel region 20 acts as an energy barrier on the electron, and the migration of the electron becomes difficult in point of energy, so that leakage is suppressed to lengthen the storage time of the storage element.

Meanwhile, in case of utilizing holes as charges, the trap levels due to the defects 21 may be brought to a position which is higher than the valence band edge of silicon being the material of the channel region 20. When a hole is about to tunnel out from the charge stored layer 25 into the channel region 20 in the storage mode (low gate voltage state), it needs to once migrate into the valence band of the channel region 20 being in a higher energy state. The energy difference from the trap level to the channel region 20 acts as an energy barrier on the hole, and the migration of the hole becomes difficult in point of energy, so that leakage is suppressed to lengthen the storage time. In the case of utilizing the holes as the charges, a semiconductor substrate may form a field effect transistor whose carriers are the holes.

Besides, the dangling bonds of silicon nitride are utilized for the charge stored layer 25. In this way, the barrier becomes still higher to the charges, so that enhancement in retention can be achieved.

In this embodiment, the control electrode 17 may well be formed directly on the charge stored layer 25 made of silicon nitride, without forming the control insulator layer 16.

Figure 28:
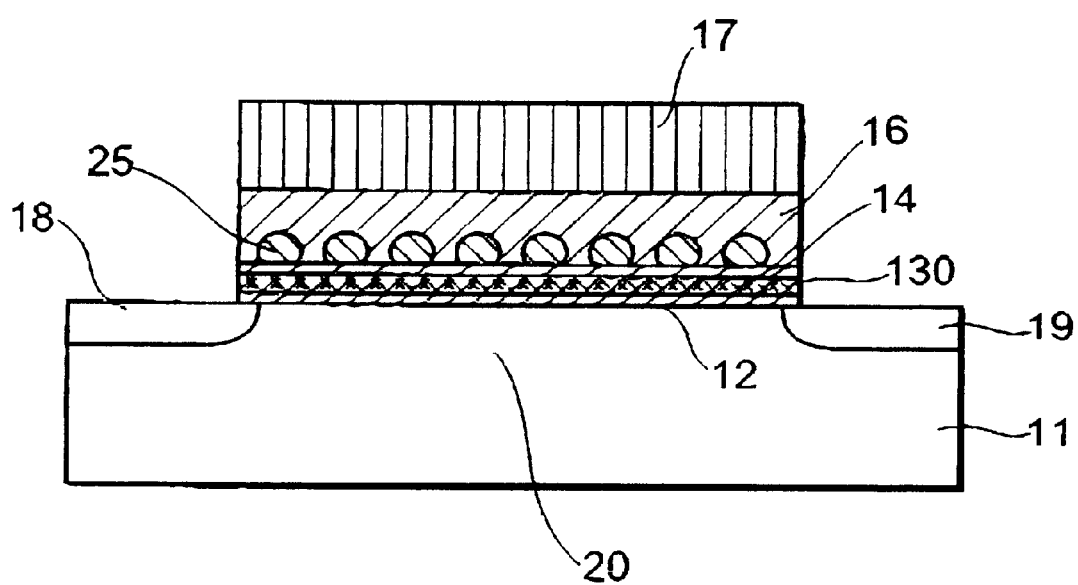
FIG. 28 is a sectional view of a nonvolatile semiconductor storage element according to a modification to Embodiment 14 of the present invention.

Further, the charge stored layer 25 made of silicon nitride may well be particles 25 which are made of silicon nitride and which have diameters of 0.5 nm through 20 nm or so, as shown in FIG. 28. In FIG. 28, parts designated by the same reference numerals as in FIG. 27C are the same constituents.

Besides, the plurality of charge stored particles 25 made of silicon nitride as shown in FIG. 28 may be regularly arrayed, or even a single charge stored particle 25 may well be formed.

(Embodiment 15)

Figure 29:
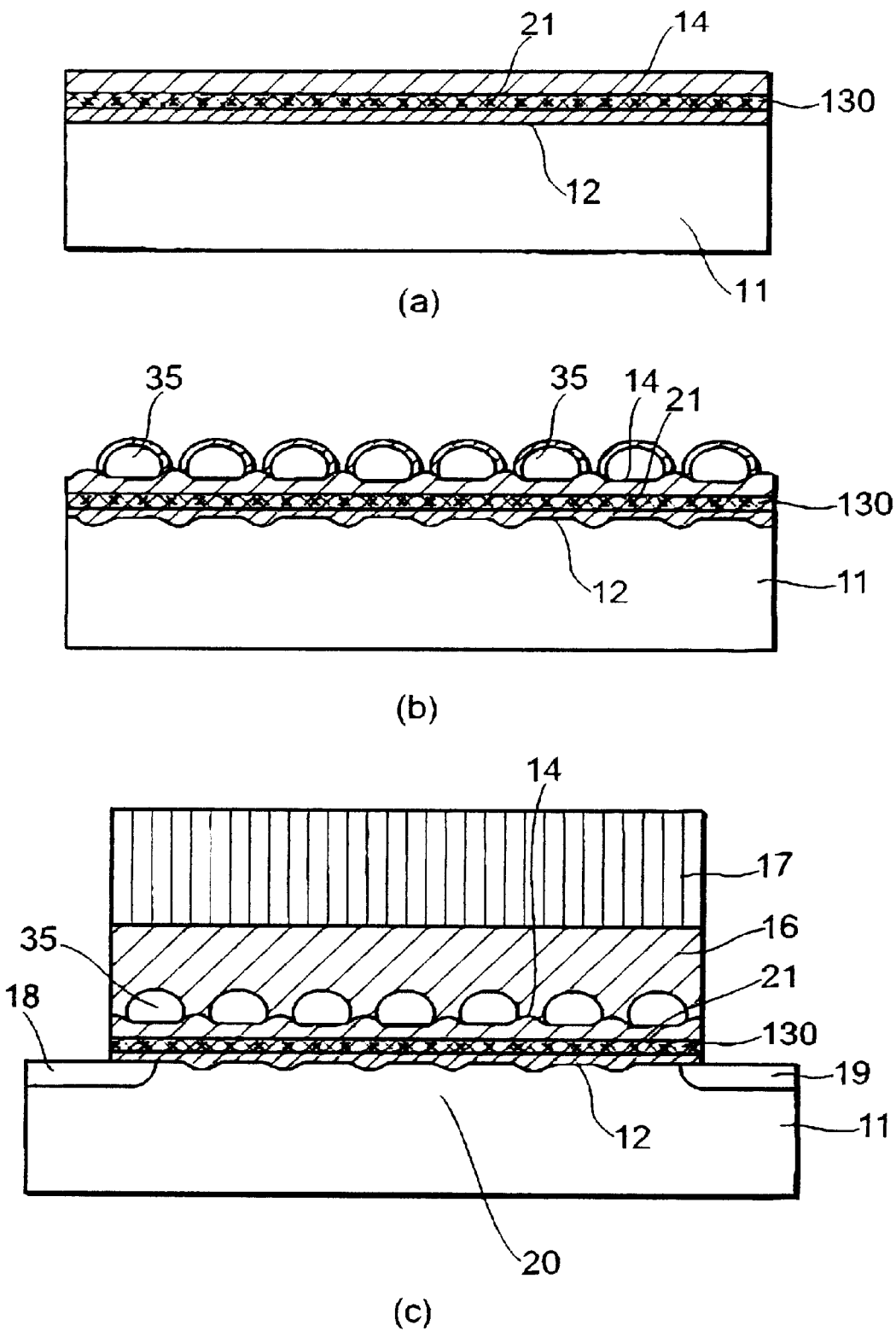
FIGS. 29A–29C are sectional views at individual steps for explaining a manufacturing process for a nonvolatile semiconductor storage element according to Embodiment 15 of the present invention.

Next, a method of manufacturing another nonvolatile semiconductor storage element will be described with reference to FIGS. 29A, 29B and 29C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, an insulator layer (2 nm thick) made of silicon oxide is formed on the silicon substrate 11. Subsequently, an amorphous silicon film (1 nm thick) is deposited on the insulator layer by, for example, LPCVD (Low Pressure Chemical Vapor Deposition).

Subsequently, the resultant substrate is subjected to dry oxidation at 700° C. for 10 minutes, whereby the amorphous silicon film is entirely oxidized. Owing to the step of the dry oxidation, a large number of dangling bonds 21 (defects of inter-atomic bonds) are formed at the interface between the original amorphous silicon and the insulator film because atoms flow very little during the oxidation at 700° C. A stacked structure comprising a first tunnel insulator layer (tunneling film) 12 (2 nm thick), an insulator layer 130 containing the dangling bonds 21, and a second tunnel insulator layer (tunneling film) 14 (2 nm thick) is formed on the silicon substrate 11 by the dry oxidation step (FIG. 29A).

Both the first tunnel insulator layer 12 and the second tunnel insulator layer 14 are controlled into a range of thicknesses (0.5 nm through 3.5 nm) at which electrons or holes can tunnel through the layers 12, 14. Besides, the area or surface density of the dangling bonds 21 can be adjusted by the condition of the oxidation.

Subsequently, conductive particles (charge stored particles) 35 which are made of silicon microcrystal particles having diameters of 10 nm are formed by LPCVD. Thereafter, when the resultant substrate is oxidized at 700° C. for 240 minutes, the dangling bonds 21 which do not exist directly under the conductive particles (charge stored particles) 35 made of silicon microcrystal particles are oxidized to extinguish trap levels. In contrast, the dangling bonds 21 which exist directly under the conductive particles (charge stored particles) 35 are not oxidized, and they have trap levels (FIG. 29B). On this occasion, the oxidation rate of the conductive particles (charge stored particles) 35 made of silicon microcrystal particles is considered to lower under the influence of stresses in the surfaces of the conductive particles (charge stored particles) 35. Accordingly, all the conductive particles (charge stored particles) 35 are not oxidized before the dangling bonds 21 located directly under the conductive particles (charge stored particles) 35 are oxidized.

Subsequently, a control insulator layer 16 (10 nm thick) made of silicon oxide is formed by LPCVD. Further, a control electrode (control gate) 17 (200 nm thick) made of n⁺ polysilicon is deposited on the control insulator layer 16 by CVD.

Subsequently, a stacked structure portion comprising the first tunnel insulator layer 12, insulator film 13, second tunnel insulator layer 14, control insulator layer 16, and control electrode 17 is etched using a resist pattern as a mask. Thereafter, phosphorus ions are implanted into the resultant substrate at a dose of $1 \times 10^{15}$ cm$^{-2}$ under an acceleration voltage of 15 keV, and the resultant structure is subjected to annealing at 1000° C. for 20 seconds, thereby to activate the phosphorus ions and to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 29C).

According to this embodiment, each charge stored particle 35 and the corresponding dangling bond 21 overlap each other in self-alignment fashion. Thus, the storage time of the storage element can be made longer.

Although, in this embodiment, the silicon microcrystal particles of nanometer scale are employed for a charge stored layer, nanometer particles made of another conductive material may well be employed. Besides, in this embodiment, the oxidation is performed using the conductive particles 35 as a mask, in order that the conductive particles (charge stored particles) 35 and the dangling bonds 21 located directly under them may be stacked in self-alignment fashion. However, the conductive particles 35 and the dangling bonds 21 can also be stacked in self-alignment fashion in such a way that the conductive particles 35 are formed on the second tunnel insulator layer 14 in the state of FIG. 29A by CVD, and that the first to third insulator layers 12–14 are etched by selective RIE by employing the conductive particles 35 as a mask.

Besides, in this embodiment, the stacked structures each of comprising the conductive particle (charge stored particle) 35 and the corresponding dangling bond 21 are existent at random positions over a channel region 20, but they may well be regularly arrayed over the channel. Of course, only one stacked structure may overlie the channel region 20.

According to such a semiconductor storage element, in the writing or erasing operation thereof, electrons can be injected or emitted by trap assisted tunneling in which the electrons are transferred directly through the thin insulator layers (first and third insulator films) 12 and 14 located in a tunneling region, and the trap levels of the defects 21 (dangling bonds) of the inter-atomic bonds also located in the tunneling region. Therefore, the writing or erasing speed of the storage element is sufficiently high.

Moreover, the trap level due to the defect 21 lies at a position which is lower than the conduction band edge of silicon being the material of the channel region 20. Accordingly, when an electron is about to tunnel out from the dangling bond 21 into the channel region 20 in a storage mode (low gate voltage state), it needs to once drop to the trap level being in a low energy state and to thereafter migrate into the conduction band of the channel region 20 being in a higher energy state. The energy difference from the trap level to the channel region 20 acts as an energy barrier on the electron, and the migration of the electron becomes difficult in point of energy, so that leakage is suppressed to lengthen the storage time.

Meanwhile, in case of utilizing holes as charges, the trap levels due to the defects 21 may be brought to a position which is higher than the valence band edge of silicon being the material of the channel region 20. When a hole is about to tunnel out from the dangling bond 21 into the channel region 20 in the storage mode (low gate voltage state), it needs to once migrate into the valence band of the channel region 20 being in a higher energy state. The energy difference from the trap level to the channel region 20 acts as an energy barrier on the hole, and the migration of the hole becomes difficult in point of energy, so that leakage is suppressed to lengthen the storage time. In the case of utilizing the holes as the charges, a semiconductor substrate may form a field effect transistor whose carriers are the holes.

(Embodiment 16)

Figure 30:
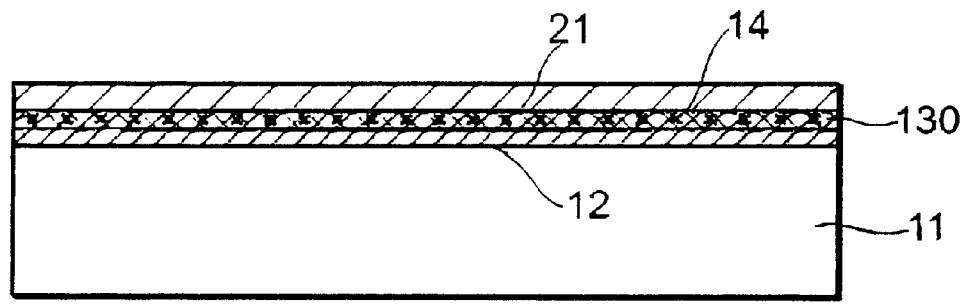
FIGS. 30A–30C are sectional views at individual steps for explaining a manufacturing process for a nonvolatile semiconductor storage element according to Embodiment 16 of the present invention.
Figure 30:
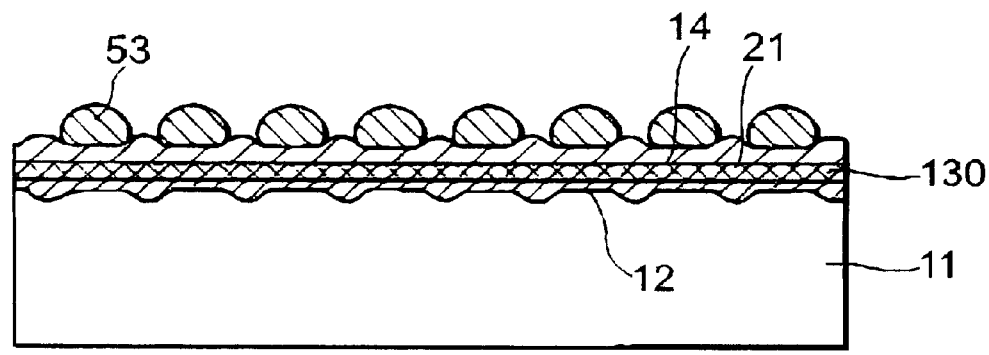
Figure 30:
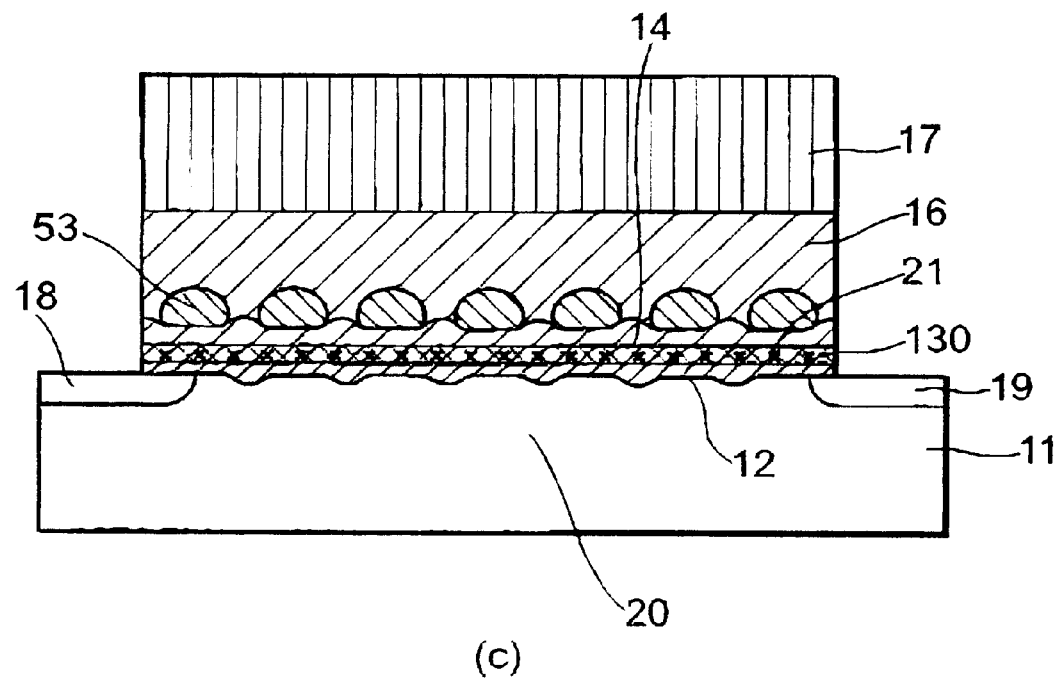

Next, a method of manufacturing another nonvolatile semiconductor storage element will be described with reference to FIGS. 30A, 30B and 30C.

First, a p-type silicon substrate 11 is prepared. Subsequently, individual elements are isolated using STI (Shallow Trench Isolation) or the like. Thereafter, the resultant substrate is subjected to low-temperature thermal oxidation at 700° C. or above. Then, an insulator layer (2 nm thick) made of silicon oxide is formed on the silicon substrate 11. Subsequently, an amorphous silicon film (1 nm thick) is deposited on the insulator layer by, for example, LPCVD (Low Pressure Chemical Vapor Deposition).

Subsequently, the resultant substrate is subjected to dry oxidation at 700° C. for 10 minutes, whereby the amorphous silicon film is entirely oxidized. Owing to the step of the dry oxidation, a large number of dangling bonds 21 (defects of inter-atomic bonds) are formed at the interface between the original amorphous silicon and the insulator film because atoms flow very little during the oxidation at 700° C. A stacked structure comprising a first tunnel insulator layer (tunneling film) 12 (2 nm thick), an insulator layer 130 containing the dangling bonds 21, and a second tunnel insulator layer (tunneling film) 14 (2 nm thick) is formed on the silicon substrate 11 by the dry oxidation step (FIG. 30A).

Both the first tunnel insulator layer 12 and the second tunnel insulator layer 14 are controlled into a range of thicknesses (0.5 nm through 3.5 nm) at which electrons or holes can tunnel through the layers 12, 14. Besides, the area or surface density of the dangling bonds 21 can be adjusted by the condition of the oxidation.

Subsequently, silicon nitride particles (charge stored particles) 53 having diameters of 10 nm are formed by LPCVD. Dangling bonds which can store charges exist in the interior and at the interface of each of the silicon nitride particles 53. Thereafter, when the resultant substrate is oxidized at 700° C. for 240 minutes, the dangling bonds 21 which do not exist directly under the silicon nitride particles (charge stored particles) 53 are oxidized to extinguish trap levels. In contrast, the dangling bonds 21 which exist directly under the silicon nitride particles (charge stored particles) 53 are not oxidized, and they have trap levels (FIG. 30B). On this occasion, the dangling bonds of the silicon nitride particles (charge stored particles) 53 are not oxidized and therefore remain as they are.

Subsequently, a control insulator layer 16 (10 nm thick) made of silicon oxide is formed by LPCVD. Further, a control electrode (control gate) 17 (200 nm thick) made of n⁺ polysilicon is deposited on the control insulator layer 16 by CVD.

Subsequently, a stacked structure portion comprising the first tunnel insulator layer 12, insulator film 13, second tunnel insulator layer 14, control insulator layer 16, and control electrode 17 is etched using a resist pattern as a mask. Thereafter, phosphorus ions are implanted into the resultant substrate at a dose of $1 \times 10^{15}$ cm$^{-2}$ under an acceleration voltage of 15 keV, and the resultant structure is subjected to annealing at 1000° C. for 20 seconds, thereby to activate the phosphorus ions and to form a source region 18 and a drain region 19 which are made of n⁺-type silicon. Lastly, the steps of forming an inter-layer insulator layer and metal wiring lines are performed. Then, the nonvolatile semiconductor storage element is finished up (FIG. 30C).

According to this embodiment, each silicon nitride particle (charge stored particle) 53 and the corresponding dangling bond 21 overlap each other in self-alignment fashion. Thus, the storage time of the storage element for an electron can be made longer.

In this embodiment, the trap levels of the dangling bonds formed at the surfaces or in the interiors of the silicon nitride particles (charge stored particles) 53 are utilized for a charge stored layer.

Besides, in this embodiment, the oxidation is performed using the silicon nitride particles (charge stored particles) 53 as a mask, in order that the silicon nitride particles (charge stored particles) 53 and the dangling bonds 21 formed directly under them may be stacked in self-alignment fashion. However, the silicon nitride particles (charge stored particles) 53 and the dangling bonds 21 can also be stacked in self-alignment fashion in such a way that, in the state of FIG. 30B, the first to third insulator layers 12–14 are etched by selective RIE by employing the silicon nitride particles (charge stored particles) 53 as a mask.

Further, in this embodiment, the stacked structures each of comprising the silicon nitride particle (charge stored particle) 53 and the corresponding dangling bond 21 are existent at random positions over a channel region 20, but they may well be regularly arrayed over the channel. Of course, only one stacked structure may overlie the channel region 20.

According to such a semiconductor storage element, in the writing or erasing operation thereof, electrons can be injected or emitted by trap assisted tunneling in which the electrons are transferred directly through the thin insulator layers (first and third insulator films) 12 and 14 located in a tunneling region, and the trap levels of the defects 21 (dangling bonds) of the inter-atomic bonds also located in the tunneling region. Therefore, the writing or erasing speed of the storage element is sufficiently high.

Moreover, the trap level due to the defect 21 lies at a position which is lower than the conduction band edge of silicon being the material of the channel region 20. Accordingly, when an electron is about to tunnel out from the silicon nitride particle 53 into the channel region 20 in a storage mode (low gate voltage state), it needs to once drop to the trap level being in a low energy state and to thereafter migrate into the conduction band of the channel region 20 being in a higher energy state. The energy difference from the trap level to the channel region 20 acts as an energy barrier on the electron, and the migration of the electron becomes difficult in point of energy, so that leakage is suppressed to lengthen the storage time.

Meanwhile, in case of utilizing holes as charges, the trap levels due to the defects 21 may be brought to a position which is higher than the valence band edge of silicon being the material of the channel region 20. When a hole is about to tunnel out from the dangling bond 21 into the channel region 20 in the storage mode (low gate voltage state), it needs to once migrate into the valence band of the channel region 20 being in a higher energy state. The energy difference from the trap level to the channel region 20 acts as an energy barrier on the hole, and the migration of the hole becomes difficult in point of energy, so that leakage is suppressed to lengthen the storage time. In the case of utilizing the holes as the charges, a semiconductor substrate may form a field effect transistor whose carriers are the holes.

(Embodiment 17)

Figure 31:
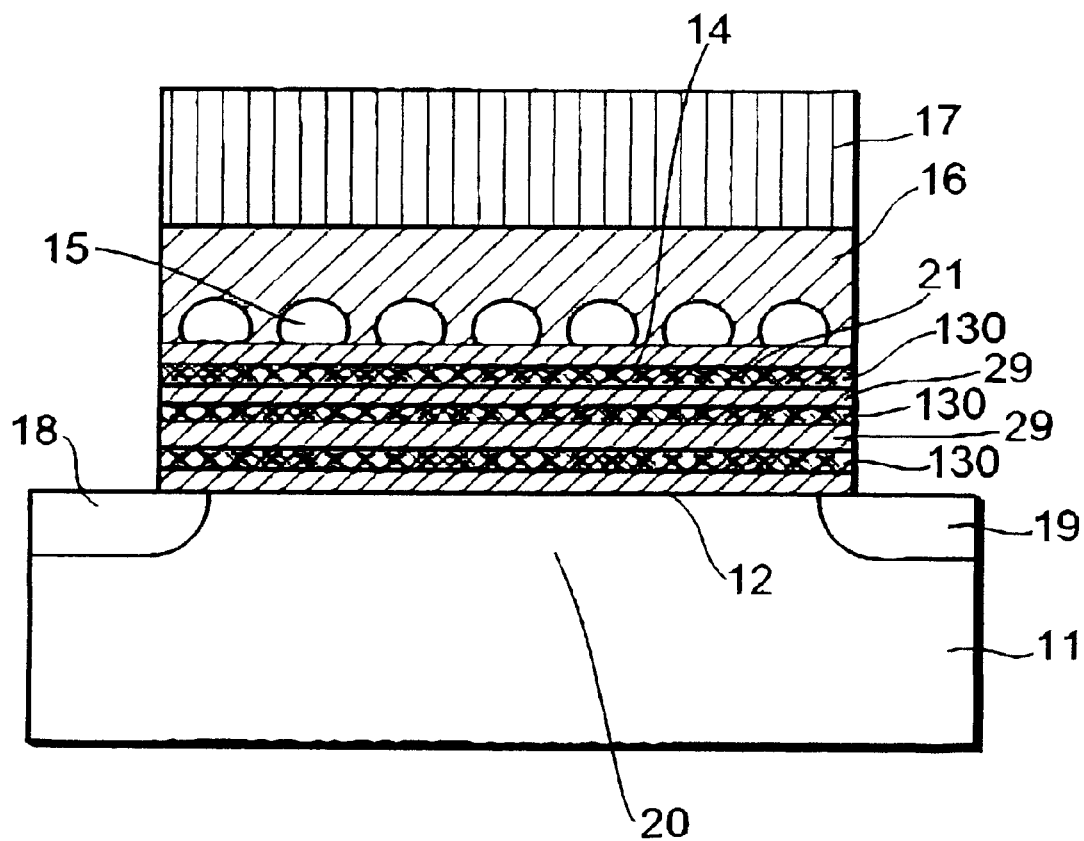
FIG. 31 is a sectional view of a nonvolatile semiconductor storage element according to Embodiment 17 of the present invention.

FIG. 31 shows a nonvolatile storage element in which, in the nonvolatile storage element shown in FIG. 25, a plurality of (here, three) insulator layers 130 each containing the dangling bonds 21 are stacked, and tunnel insulator layers (tunneling films) 29 are formed between the respectively adjacent insulator layers 130. The remaining structure is the same as in the nonvolatile storage element shown in FIG. 25. Even when, in this manner, the storage element is charged/discharged through the multiple tunnel junctions and via the plurality of insulator layers 130 containing trap levels, the storage time of the element becomes long. In this case, a charging/discharging speed is somewhat low.

Although, in the foregoing embodiments, silicon is employed as the main semiconductor material, another semiconductor material may well be employed.

Besides, although silicon oxide is mentioned as the main ingredient of the tunnel insulator films, a similar effect can be expected even with another insulating substance.

Besides, although the first tunnel insulator layer 12 and the second tunnel insulator layer 14 have the equal thicknesses, an asymmetric structure may well be employed in which the first tunnel insulator layer 12 is thicker than the second tunnel insulator layer 14.

Figure 32:
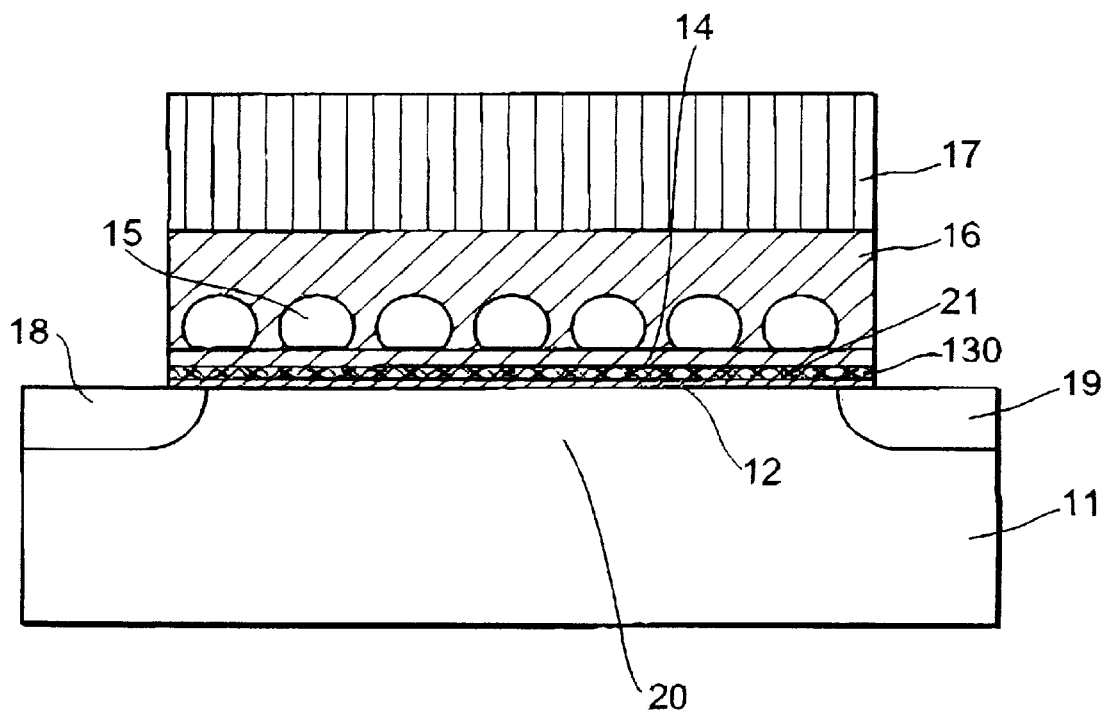
FIG. 32 is a sectional view of a nonvolatile semiconductor storage element according to a modified embodiment of the present invention.

FIG. 32 shows a nonvolatile storage element adopting a structure in which the second tunnel insulator layer 14 is thicker than the first tunnel insulator layer 12. The remaining structure is the same as in the nonvolatile storage element shown in FIG. 25. The storage element in FIG. 32 can be fabricated in the same way as in FIG. 25 by adjusting the thicknesses of the respective oxide films.

In the foregoing embodiments, the method of forming the large number of dangling bonds 21 in each tunnel insulator film is such that the amorphous silicon film is formed, whereupon it is oxidized at the low temperature. Also mentioned is a method in which the ions of an element, such as argon, capable of forming dangling bonds are implanted into the tunnel insulator layer by low-acceleration ion implantation, a method in which the tunnel insulator layers are doped with nitrogen and are formed with dangling bonds by annealing in an ammonia atmosphere, a method in which thin-film TEOS (tetraethoxysilane) is stacked on a thermal oxide film by CVD, so as to utilize dangling bonds formed at a thermal oxide film/TEOS interface, or a method in which a thin silicon nitride layer having dangling bonds is sandwiched in between thin oxide layers. Alternatively, two or more of such methods may well be combined.

The layer which has the large number of dangling bonds and which is sandwiched in between the tunnel insulator films, need not always be the insulator layer, but it may well be a semiconductor layer which has a large number of dangling bonds.

Figure 33:
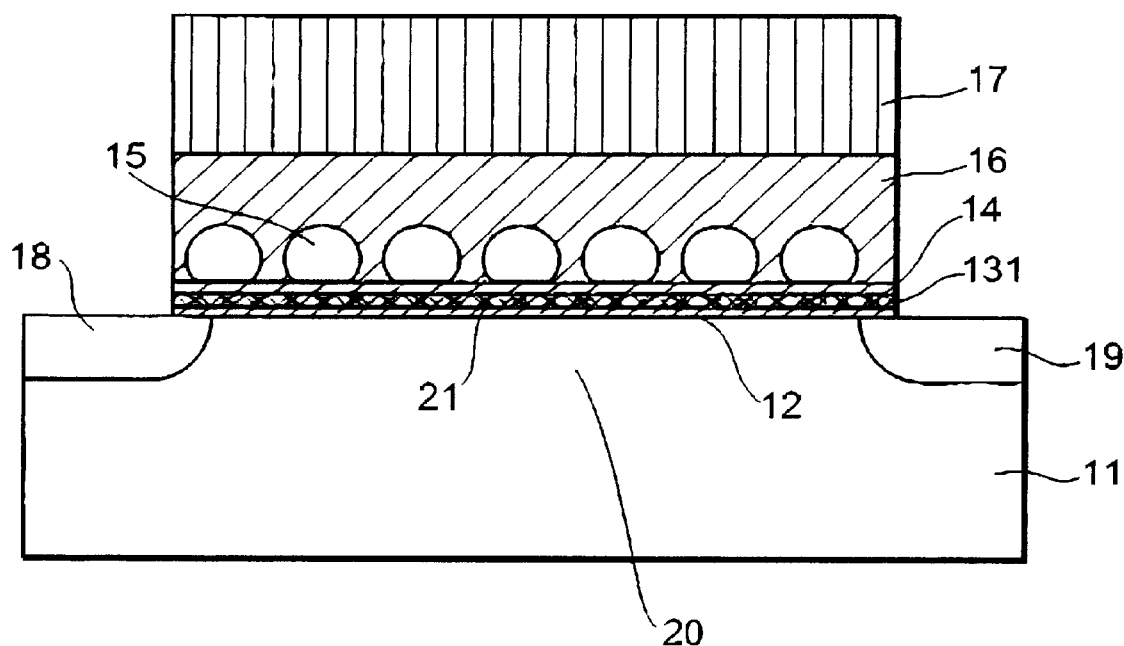
FIG. 33 is a sectional view of a nonvolatile semiconductor storage element according to another modified embodiment of the present invention.

FIG. 33 shows a nonvolatile storage element adopting a structure which employs a semiconductor layer 131 having a large number of dangling bonds 21. The remaining structure is the same as in FIG. 25. The storage element can be fabricated so as to possess the large number of dangling bonds at the interfaces of the semiconductor layer 131 with the upper and lower tunnel insulator films 14, 12 and at crystal grain boundaries, by performing a thermal step at the lowest possible temperature. As crystal grains are finer, a larger number of dangling bonds can be formed.

By way of example, a Si microcrystal layer or a mixed crystal $Si_{1-x}C_x$ consisting of silicon and carbon is mentioned as the material of the semiconductor layer 131, but another semiconductor material may well be employed.

The foregoing embodiments have exemplified the semiconductor storage elements in each of which charges are supplied from the channel region into the charge stored layer (floating gate). The present invention, however, is also applicable to a semiconductor storage element in which charges are supplied from the control electrode (control gate) into the charge stored layer.

Besides, the floating gate memories each of which is based on the N-type MOSFET have been described with reference to the drawings. However, in case of utilizing holes as charges, a floating gate memory is constructed on the basis of a P-type MOSFET.

Besides, the layer of silicon nitride has been exemplified as the charge stored layer which contains the trap levels in its interior or at its interface. In this regard, it is possible to employ a method in which the ions of an element, such as argon, capable of forming dangling bonds are implanted into the insulator layer by low-acceleration ion implantation, so as to form the trap levels, a method in which the insulator layer is doped with nitrogen and are formed with dangling bonds by annealing in an ammonia atmosphere, a method in which the insulator layer is irradiated with an electron beam so as to form dangling bonds, a method in which the insulator layer is subjected to an SH (sulfuric acid+hydrogen peroxide solution) process, thereby to form dangling bonds, a method in which the front surface of the insulator layer is roughened by an alkali process or the like, thereby to form dangling bonds, or a method in which thin-film TEOS (tetraethoxysilane) is stacked on a thermal oxide film by CVD, so as to utilize dangling bonds formed at a thermal oxide film/TEOS interface. Alternatively, two or more of such methods may well be combined.

Now, the storage characteristic of the nonvolatile storage element in each of the foregoing embodiments will be described in detail.

Figure 34:
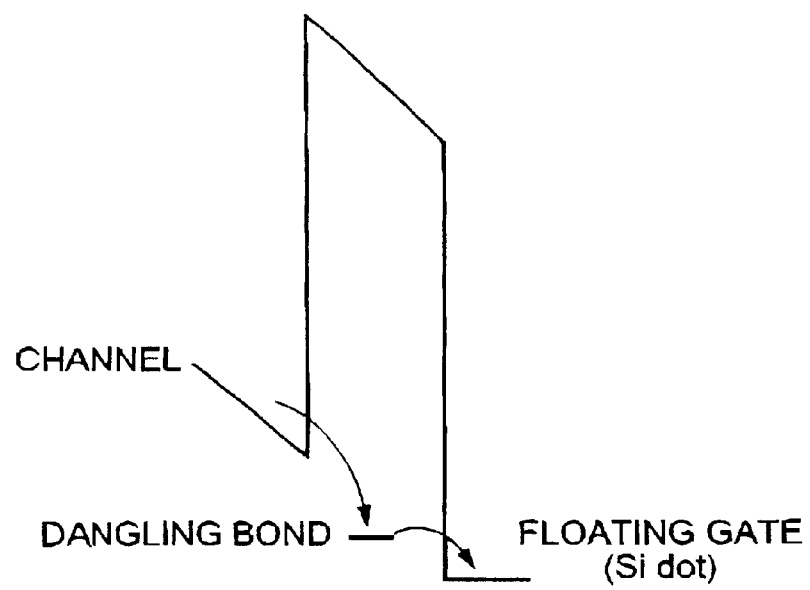
Figure 34:
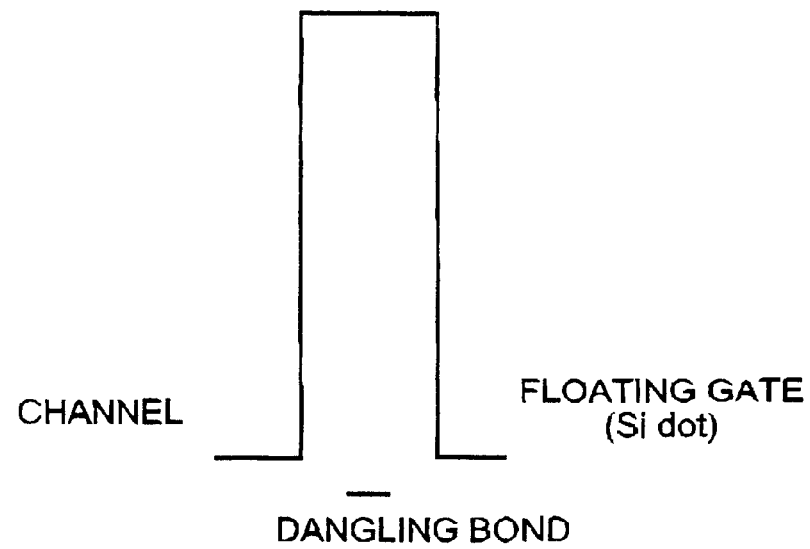

As shown in FIG. 34A, in the writing state of the nonvolatile storage element, an information charge can be injected from the channel region into the charge stored layer (floating gate) through the defect (dangling bond) directly by trap assisted tunneling, so that the writing speed of the storage element can be made sufficiently high. In the erasing state of the storage element reverse to the writing state, the floating gate side becomes higher than the conduction band edge of the channel side, so that the erasing speed of the storage element becomes high owing to the trap assisted tunneling.

However, in order to realize fast writing which directly utilizes a tunneling rate, the area or surface density of the defects in the tunneling oxide film (tunnel insulator layer) must be higher than that of electrons to-be-injected on the surface of the channel, or the former must be, at least, equal to the latter. The reason therefor is that, when the defects are smaller in number than the charges to-be-injected or to-be-emitted, the writing or erasing speed is determined by the number of leakage paths based on the trap assisted tunneling, so the tunneling rate cannot be directly utilized for writing or erasing.

Besides, a charge density under the application of a voltage in the case of the writing or erasing depends upon the magnitude of the writing or erasing voltage. Such a voltage should desirably be a low voltage in the future. When a state where an electric field in the oxide film is 0.5 MV/cm (0.5V to the 10 nm thickness of the oxide film) is considered as a typical low-voltage writing state, the density of electrons which appear at the interface of the oxide film is $1.1 \times 10^{12}$ cm$^{-2}$. It is accordingly desirable for a low-voltage and high-speed operation directly utilizing the tunneling rate that the defects in the tunneling oxide film exist at or above an area density on the order of $1 \times 10^{12}$ cm$^{-2}$.

In the case of adopting the semiconductor layer 131 which has a large number of dangling bonds 21 as shown in FIG. 33, as the crystal grains are made finer, advantageously the dangling bonds at the grain boundaries can be increased more.

Meanwhile, in the storing state of the storage element, the gate voltage thereof is almost 0V. As shown in FIG. 34B, therefore, a trap level due to the dangling bond lies at a position which is lower than the conduction band edge of the silicon of the channel region. Accordingly, an electron to be transferred needs to be once trapped into a lower energy state and to thereafter tunnel out into the conduction band of the silicon being in a higher energy state. Consequently, the electron is difficult of migration in point of energy, and the storage time of the storage element becomes long.

Even in the case of adopting the semiconductor layer 131 which has the dangling bonds 21 as shown in FIG. 33, the effect of enhancing the storage characteristic of the storage element is similarly produced when a major injection/emission path includes a large number of traps.

In the case as shown in FIG. 32 where the double tunnel insulator film is so formed that the second tunnel insulator film 14 on the charge stored layer side is thicker than the first tunnel insulator film 12 on the charge supply side (channel 20 side), a greater potential difference acts on the thicker side for the same potential variation ΔV as explained with reference to FIGS. 22A–22B.

Figure 35:
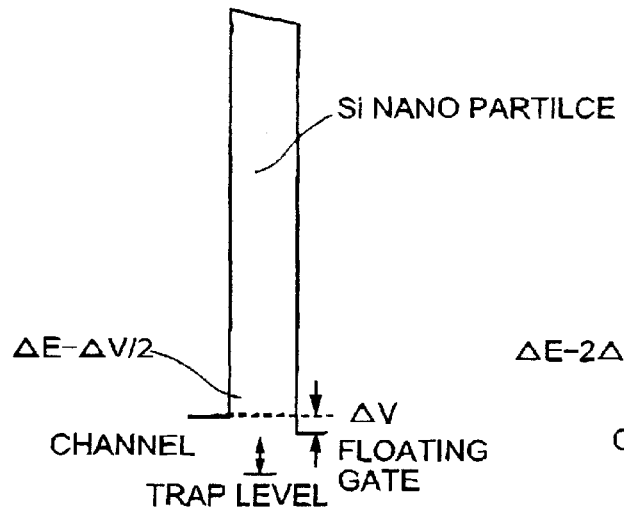
Figure 35:
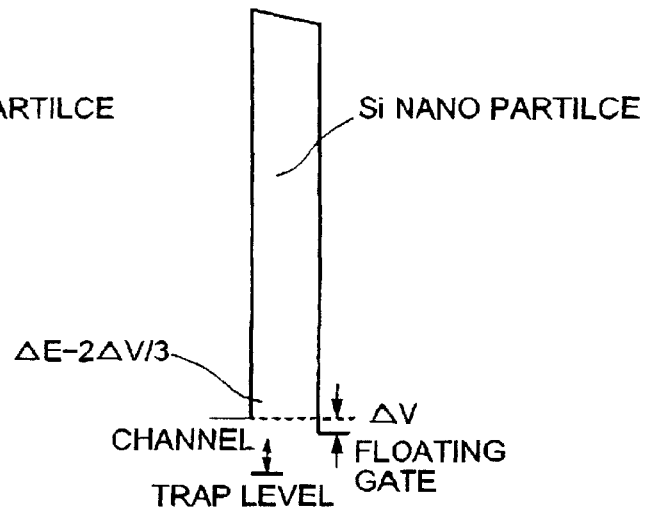
Figure 35:
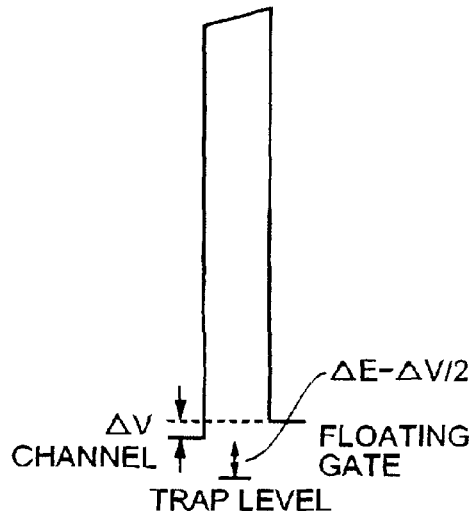
Figure 35:
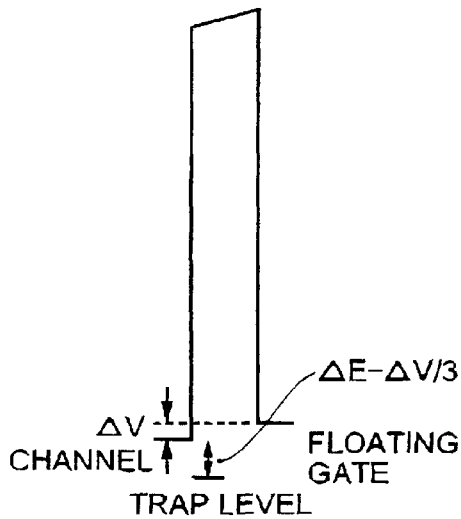

As shown in FIGS. 35A–35B, accordingly, an energy difference becomes greater in a charge emission mode than in an injection mode, and the emission of the information charge is relatively suppressed to better the storage thereof. In case of establishing the asymmetry in the thickness of the double tunnel insulator film under the condition that the sum of the resistances of both the tunneling films is held equal, the writing/erasing speed is not affected.

Besides, when the charge stored layer utilizes the trap levels of dangling bonds as in silicon nitride, there are cases where the trap level of the charge stored layer is shallow (FIG. 36A) and where it is deep (FIG. 36B), depending upon the states of the dangling bonds.

Figure 36:
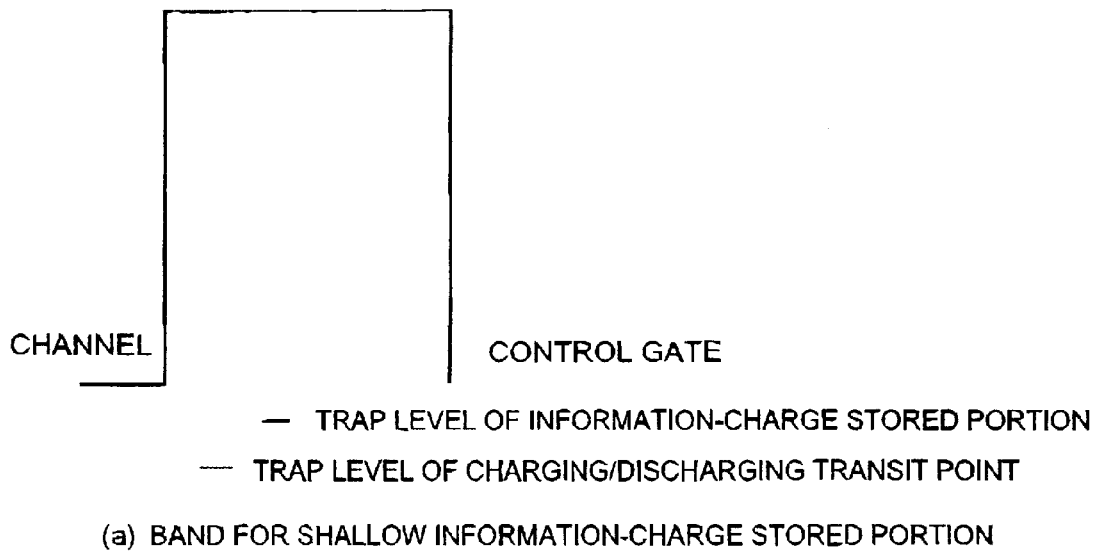
Figure 36:
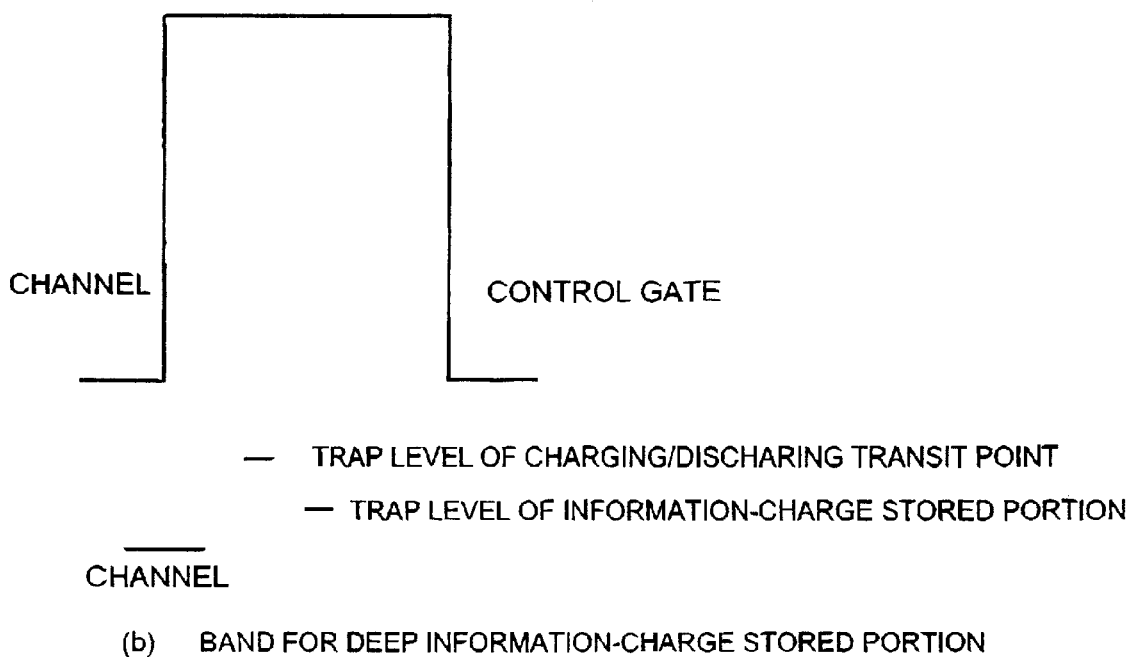

In the case where the trap level of the charge stored layer is shallow as shown in FIG. 36A, fast writing or erasing and a long storage time can be both attained for the same reasons as explained with reference to FIGS. 34A–34B.

On the other hand, even in the case where the trap level of the charge stored layer is deep as shown in FIG. 36B, fast writing or erasing based on trap assisted tunneling is permitted by applying an appropriate gate voltage. Besides, when the trap level of the charge stored layer is deep, an electron leaks into the valence band of the channel from the viewpoint of energy. In order to proceed into the valance band, however, the electron needs to pass through a transit trap of high energy, and it is difficult of migration in point of energy, so that the storage characteristic of the storage element is enhanced.

In addition to the above reasons in point of energy, a trap cross-sectional area in the charge stored layer is made as very small as a nanometer order, so that the storage characteristic can be enhanced while maintaining the high speed more efficiently.

Besides, in order to attain a sufficient memory effect, a certain number of stored charges must exist. A memory effect develops in such a way that the carriers of the channel region are expelled by the Coulomb forces of the stored charges, so a drain current is decreased. A Coulomb screening distance in silicon is 15 nm typically. Therefore, unless the average interval between the respectively adjacent particles of the charge stored layer is less than 30 nm, a gap where the Coulomb forces of the stored charges exert no influence appears on the channel. When the gap appears, the sufficient memory effect is not attained. After all, if the area or surface density of the particles of the charge stored layer is at least $(30 \text{ nm})^{-2} = 1 \times 10^{11}$ cm$^{-2}$, the stored charges can influence the whole channel region, and hence, the sufficient memory effect can be expected.

Besides, in order for a trap level to function as a charging/discharging transit point, at least one trap level on the average should desirably exist directly under the particle of the charge stored layer. Therefore, the trap cross-sectional area of the particle should desirably be greater than the reciprocal of the area or surface density of the trap levels formed in the tunnel insulator layer. For this purpose, in the case of adopting the semiconductor layer 131 which has the large number of dangling bonds 21 as shown in FIG. 33, a plurality of semiconductor microcrystal grains should more desirably exist in regions directly under the trap cross sections of the particles or dangling bonds forming the charge stored layer, because an increased number of dangling bonds are formed at grain boundaries.

In a case where the trap cross-sectional area of the particle of the charge stored layer cannot be enlarged, it is allowed to increase the number of the particles of the charge stored layer so that at least one particle on the average may exist over the trap level in the tunnel insulator layer. That is, the reciprocal of the number density of the nanometer particles of the charge stored layer may be made smaller than the trap cross-sectional area of the trap level.

(Embodiment 18)

Figure 37:
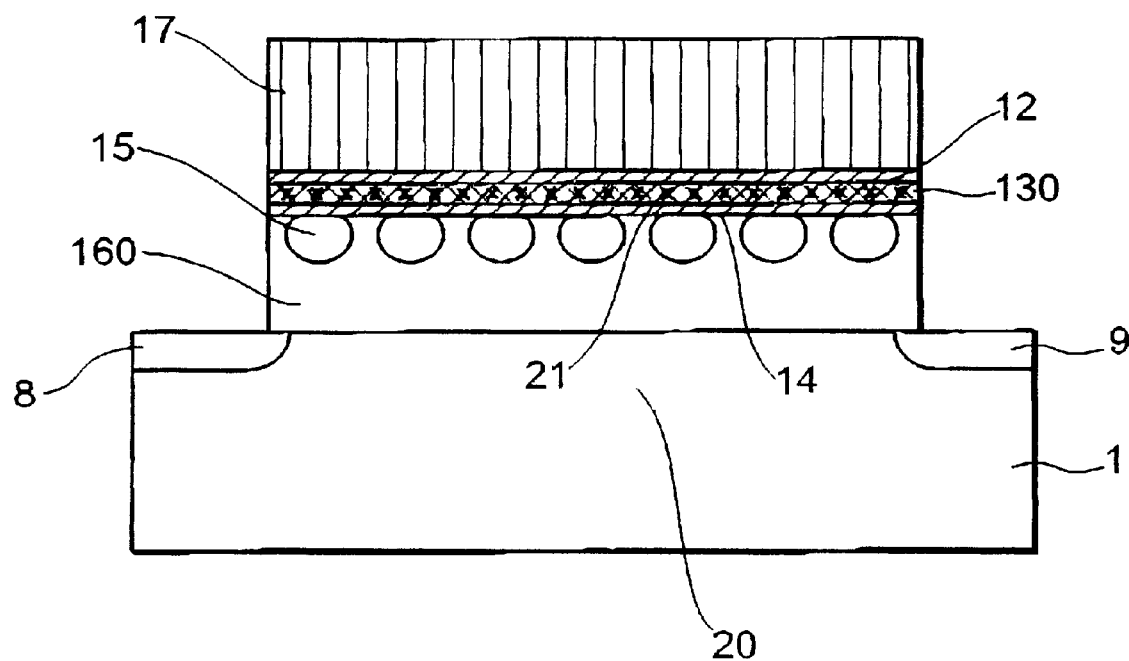
FIG. 37 is a sectional view of a nonvolatile semiconductor storage element according to Embodiment 18 of the present invention.

FIG. 37 is a sectional view of a semiconductor storage element according to another embodiment of the present invention. The semiconductor storage element is such that a channel region 20 formed in the front surface of a silicon substrate 11 is overlaid with a stacked structure comprising an insulator layer 160, charge stored particles 15 made of a microcrystal semiconductor and serving as a stored layer (floating gate), a second tunnel insulator layer (tunneling film) 14, an insulator layer 130 containing dangling bonds 21, a first tunnel insulator layer (tunneling film) 12, and a control electrode (control gate) 17. A source region 18 and a drain region 19 are formed so as to hold the channel region 20 therebetween.

In the semiconductor storage element, information charges are injected from the control electrode 17 into the charge stored particles 15 by tunneling through the first tunnel insulator layer 12, dangling bonds 21 and second tunnel insulator layer 14.

According to the semiconductor storage element, in a case where the charges are electrons, the energy level of the trap level of each defect 21 is lower than that of a conduction band edge in the control electrode 17, and in a case where the charges are holes, the energy level of the trap level of each defect 21 is higher than that of a valence band edge in the control electrode 17. In this way, a sufficiently long storage time fit for practical use can be realized together with a high operating speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage element comprising:
   a semiconductor layer;
   a source region and a drain region formed in said semiconductor layer;
   a channel region formed between said source region and said drain region;
   a control electrode formed over said channel region; and
   a stacked structure disposed between said channel region and said control electrode, the stacked structure including a conductive particle layer containing conductive particles, and a layer having an energy level allowing a charge to stay thereat;
   wherein, when the charge is an electron, an energy level at which the electron is injected into the conductive particle or the layer having the energy level allowing the charge to stay thereat, as a charge stored layer, is lower than an energy level of a conduction band edge of said channel region or a Fermi level of said control electrode; and
   when the charge is a hole, an energy level at which the hole is injected into the conductive particle or the layer having the energy level allowing the charge to stay thereat, as a charge stored layer, is higher than an energy level of a valence band edge of said channel region or the Fermi level of said control electrode.

2. A semiconductor storage element according to claim 1, wherein the conductive particles have a size which satisfies a condition that electrostatic energy in the case of charging one elementary charge is greater than a thermal fluctuation.

3. A semiconductor storage element according to claim 1, wherein said layer having the energy level that allows the charge to stay thereat is a layer containing trap levels due to atomic dangling bonds.

4. A semiconductor storage element comprising:
   a semiconductor layer;
   a source region and a drain region formed in said semiconductor layer;
   a channel region formed between said source region and said drain region;
   a first tunnel insulator layer formed on said channel region;
   a conductive particle layer formed on said first tunnel insulator layer, the conductive particle layer containing conductive particles satisfying a condition that electrostatic energy in the case of charging one elementary charge is greater than a thermal fluctuation;
   a second tunnel insulator layer formed on said conductive particle layer;
   a charge stored layer formed on said second tunnel insulator layer; and
   a control electrode formed on said charge stored layer;
   wherein, when the charge is an electron, an energy level at which the electron is injected into said charge stored layer is lower than an energy level of a conduction band edge of said channel region; and
   when the charge is a hole, an energy level at which the hole is injected into said charge stored layer is higher than an energy level of a valence band edge of said channel region.

5. A semiconductor storage element according to claim 4, wherein said first tunnel insulator layer is thicker than said second tunnel insulator layer.

6. A semiconductor storage element according to claim 5, wherein said charge stored layer is a silicon nitride film containing trap levels due to atomic dangling bonds.

7. A semiconductor storage element according to claim 6, wherein an area density of the trap levels is at least $1 \times 10^{11}$ cm$^{-2}$.

8. A semiconductor storage element according to claim 4, wherein said charge stored layer contains charge stored particles having diameters of at most 30 nm.

9. A semiconductor storage element according to claim 8, wherein the conductive particles and the charge stored particles are vertically stacked.

10. A semiconductor storage element according to claim 8, wherein the diameters of the charge stored particles are 0.5 nm through 10 nm inclusive.

11. A semiconductor storage element according to claim 4, wherein diameters of the conductive particles are at most 15 nm.

12. A semiconductor storage element according to claim 4, wherein an area density of the conductive particles is at least $1 \times 10^{11}$ cm$^{-2}$.

13. A semiconductor storage element according to claim 4, wherein the conductive particles are made of a semiconductor which exhibits an electron affinity lower than that of a semiconductor of said channel region.

14. A semiconductor storage element comprising:
    a semiconductor layer;
    a source region and a drain region formed in said semiconductor layer;
    a channel region formed between said source region and said drain region;
    a first tunnel insulator layer formed on said channel region;
    a layer formed on said first tunnel insulator layer, the layer containing trap levels due to atomic dangling bonds;
    a second tunnel insulator layer formed on said layer containing the trap levels;
    a charge stored layer formed on said second tunnel insulator layer, the charge stored layer containing charge stored particles satisfying a condition that electrostatic energy in the case of charging one elementary charge is greater than a thermal fluctuation; and
    a control electrode formed on said charge stored layer;
    wherein, when the charge is an electron, an energy level of the dangling bond is lower than an energy level of a conduction band edge of said channel region; and
    when the charge is a hole, an energy level of the dangling bond is higher than an energy level of a valence band edge of said channel region.

15. A semiconductor storage element according to claim 14, wherein said second tunnel insulator layer is thicker than said first tunnel insulator layer.

16. A semiconductor storage element according to claim 14, wherein an area density of the trap levels is at least $1 \times 10^{12}$ cm$^{-2}$.

17. A semiconductor storage element according to claim 14, wherein diameters of the charge stored particles are at most 30 nm.

18. A semiconductor storage element according to claim 17, wherein the diameters of the charge stored particles are at most 20 nm.

19. A semiconductor storage element according to claim 14, wherein an area density of the charge stored particles is at least $1\times10^{11}$ cm$^{-2}$.

20. A semiconductor storage element according to claim 14, wherein a cross-sectional area of the charge stored particle is greater than a reciprocal of an area density of the trap levels.

21. A semiconductor storage element according to claim 14, wherein a reciprocal of a number density of the charge stored particles is smaller than a trap cross section of the atomic dangling bond in said layer containing the trap levels.

22. A semiconductor storage element according to claim 14, wherein each charge stored particle, and the corresponding the trap levels overlap each other.

* * * * *